US 9,559,301 B2

(12) United States Patent  (10) Patent No.: US 9,559,301 B2
Liu  (45) Date of Patent: Jan. 31, 2017

(54) METHODS OF FORMING MEMORY DEVICE CONSTRUCTIONS, METHODS OF FORMING MEMORY CELLS, AND METHODS OF FORMING SEMICONDUCTOR CONSTRUCTIONS

(71) Applicant: Micron Technology, Inc., Boise, ID (US)

(72) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/003,606

(22) Filed: Jan. 21, 2016

(65) Prior Publication Data
US 2016/0141495 A1 May 19, 2016

Related U.S. Application Data

(62) Division of application No. 14/680,431, filed on Apr. 7, 2015, now Pat. No. 9,257,430, which is a division of
(Continued)

(51) Int. Cl.
*H01L 45/00* (2006.01)
*G11C 13/00* (2006.01)
(Continued)

(52) U.S. Cl.
CPC ......... *H01L 45/1608* (2013.01); *G11C 13/003* (2013.01); *H01L 27/1021* (2013.01);
(Continued)

(58) Field of Classification Search
CPC .... H01L 45/06; H01L 45/1233; H01L 45/144; H01L 27/2409; G11C 13/0004; G11C 2213/72
(Continued)

(56) References Cited

U.S. PATENT DOCUMENTS 4,715,685 A 12/1987 Yaniv et al.
4,964,080 A 10/1990 Tzeng
(Continued)

FOREIGN PATENT DOCUMENTS

CN 1339159 3/2002
CN 1444284 9/2003
(Continued)

OTHER PUBLICATIONS

Baek et al., "Multi-Layer Cross-Point Binary Oxide Resistive Memory (OxRRAM) for Post-NAND Storage Application", IEEE 2005, United States, 4 pages.
(Continued)

*Primary Examiner* — David Vu
*Assistant Examiner* — Jonathan Han
(74) *Attorney, Agent, or Firm* — Wells St. John P.S.

(57) ABSTRACT

Memory device constructions include a first column line extending parallel to a second column line, the first column line being above the second column line; a row line above the second column line and extending perpendicular to the first column line and the second column line; memory material disposed to be selectively and reversibly configured in one of two or more different resistive states; a first diode configured to conduct a first current between the first column line and the row line via the memory material; and a second diode configured to conduct a second current between the second column line and the row line via the memory material. In some embodiments, the first diode is a Schottky diode having a semiconductor anode and a metal cathode and the second diode is a Schottky diode having a metal anode and a semiconductor cathode.

17 Claims, 38 Drawing Sheets

Related U.S. Application Data application No. 13/418,082, filed on Mar. 12, 2012, now Pat. No. 9,111,788, which is a division of application No. 12/141,388, filed on Jun. 18, 2008, now Pat. No. 8,134,137.

(51) Int. Cl.
  *H01L 27/102* (2006.01)
  *H01L 27/24* (2006.01)
  *H01L 29/872* (2006.01)
  *H01L 29/66* (2006.01)

(52) U.S. Cl.
  CPC .......... *H01L 27/24* (2013.01); *H01L 27/2409* (2013.01); *H01L 29/6609* (2013.01); *H01L 29/872* (2013.01); *G11C 2213/72* (2013.01)

(58) Field of Classification Search
  USPC .......... 257/4, E27.004, E45.002, 2; 365/148
  See application file for complete search history.

(56) References Cited

U.S. PATENT DOCUMENTS

| | | |
|---|---|---|
| 5,049,970 A | 9/1991 | Tanaka et al. |
| 5,122,476 A | 6/1992 | Fazan et al. |
| 6,034,882 A | 3/2000 | Johnson et al. |
| 6,218,696 B1 | 4/2001 | Radius |
| 6,432,767 B2 | 8/2002 | Torii et al. |
| 6,524,867 B2 | 2/2003 | Yang et al. |
| 6,552,952 B2 | 4/2003 | Pascucci |
| 6,687,147 B2 | 2/2004 | Fricjie et al. |
| 6,693,821 B2 | 2/2004 | Hsu et al. |
| 6,693,846 B2 | 2/2004 | Fibranz |
| 6,717,881 B2 | 4/2004 | Ooishi |
| 6,753,561 B1 | 6/2004 | Rinerson et al. |
| 6,753,562 B1 | 6/2004 | Hsu et al. |
| 6,757,188 B2 | 6/2004 | Perner et al. |
| 6,778,421 B2 | 8/2004 | Tran |
| 6,785,159 B2 | 8/2004 | Tuttle |
| 6,806,531 B1 | 10/2004 | Chen et al. |
| 6,834,008 B2 | 12/2004 | Rinerson et al. |
| 6,873,544 B2 | 3/2005 | Perner et al. |
| 6,905,937 B2 | 6/2005 | Hsu et al. |
| 6,930,324 B2 | 8/2005 | Kowalski et al. |
| 6,940,113 B2 | 9/2005 | Hsu et al. |
| 6,946,702 B2 | 9/2005 | Jang |
| 6,950,369 B2 | 9/2005 | Kunikiyo et al. |
| 6,955,992 B2 | 10/2005 | Zhang et al. |
| 6,958,273 B2 | 10/2005 | Chen et al. |
| 6,961,258 B2 | 11/2005 | Lowrey |
| 6,970,375 B2 | 11/2005 | Rinerson et al. |
| 6,972,211 B2 | 12/2005 | Hsu et al. |
| 6,985,374 B2 | 1/2006 | Yamamura |
| 7,002,197 B2 | 2/2006 | Perner et al. |
| 7,005,350 B2 | 2/2006 | Walker et al. |
| 7,009,278 B2 | 3/2006 | Hsu |
| 7,026,911 B2 | 4/2006 | Aono et al. |
| 7,029,924 B2 | 4/2006 | Hsu et al. |
| 7,029,925 B2 | 4/2006 | Celii et al. |
| 7,035,141 B1 | 4/2006 | Tripsas et al. |
| 7,046,550 B1 | 5/2006 | Reohr et al. |
| 7,050,316 B1 | 5/2006 | Lin et al. |
| 7,067,862 B2 | 6/2006 | Rinerson et al. |
| 7,085,167 B2 | 8/2006 | Lee et al. |
| 7,109,544 B2 | 9/2006 | Schloesser et al. |
| 7,123,535 B2 | 10/2006 | Kurotsuchi et al. |
| 7,149,108 B2 | 12/2006 | Rinerson et al. |
| 7,167,387 B2 | 1/2007 | Sugita et al. |
| 7,180,160 B2 | 2/2007 | Ferrant et al. |
| 7,187,201 B1 | 3/2007 | Trimberger |
| 7,193,267 B2 | 3/2007 | Hsu et al. |
| 7,205,238 B2 | 4/2007 | Pan et al. |
| 7,233,024 B2 | 6/2007 | Scheuerlein et al. |
| 7,236,389 B2 | 6/2007 | Hsu |
| 7,247,876 B2 | 7/2007 | Lowrey |
| 7,273,791 B2 | 9/2007 | Basceri et al. |
| 7,323,349 B2 | 1/2008 | Hsu et al. |
| 7,335,906 B2 * | 2/2008 | Toda ........................ G11C 5/02 257/2 |
| 7,388,775 B2 | 6/2008 | Bedeschi et al. |
| 7,393,785 B2 | 7/2008 | Uhlenbrock et al. |
| 7,405,967 B2 | 7/2008 | Kozicki et al. |
| 7,459,715 B2 | 12/2008 | Toda et al. |
| 7,459,716 B2 | 12/2008 | Toda et al. |
| 7,465,675 B2 | 12/2008 | Koh |
| 7,473,982 B2 | 1/2009 | Aono et al. |
| 7,489,552 B2 | 2/2009 | Kurotsuchi et al. |
| 7,525,410 B2 | 4/2009 | Aono et al. |
| 7,538,338 B2 | 5/2009 | Rinerson et al. |
| 7,544,987 B2 | 6/2009 | Lu et al. |
| 7,557,424 B2 | 7/2009 | Wong et al. |
| 7,560,815 B1 | 7/2009 | Vaartstra et al. |
| 7,570,511 B2 | 8/2009 | Cho et al. |
| 7,639,523 B2 | 12/2009 | Celinska et al. |
| 7,666,526 B2 | 2/2010 | Chen et al. |
| 7,671,417 B2 | 3/2010 | Yoshida et al. |
| 7,679,812 B2 | 3/2010 | Sasagawa et al. |
| 7,687,793 B2 | 3/2010 | Harshfield et al. |
| 7,687,840 B2 | 3/2010 | Shinmura |
| 7,696,077 B2 | 4/2010 | Liu |
| 7,700,935 B2 | 4/2010 | Kim et al. |
| 7,727,908 B2 | 6/2010 | Ahn et al. |
| 7,751,163 B2 | 7/2010 | Duch et al. |
| 7,755,076 B2 | 7/2010 | Lung |
| 7,768,812 B2 | 8/2010 | Liu |
| 7,772,580 B2 | 8/2010 | Hofmann et al. |
| 7,777,215 B2 | 8/2010 | Chien et al. |
| 7,799,672 B2 | 9/2010 | Hashimoto et al. |
| 7,838,861 B2 | 11/2010 | Klostermann |
| 7,842,991 B2 | 11/2010 | Cho et al. |
| 7,864,568 B2 | 1/2011 | Fujisaki et al. |
| 7,898,839 B2 | 3/2011 | Aoki |
| 7,907,436 B2 | 3/2011 | Maejima et al. |
| 7,910,909 B2 | 3/2011 | Kim et al. |
| 7,948,784 B2 | 5/2011 | Kajigaya |
| 7,952,914 B2 | 5/2011 | Baek et al. |
| 7,990,754 B2 | 8/2011 | Azuma et al. |
| 8,021,897 B2 | 9/2011 | Sills et al. |
| 8,043,926 B2 | 10/2011 | Cho et al. |
| 8,048,755 B2 | 11/2011 | Sandhu et al. |
| 8,094,477 B2 | 1/2012 | Maejima |
| 8,098,520 B2 | 1/2012 | Seigler et al. |
| 8,106,375 B2 | 1/2012 | Chen et al. |
| 8,114,468 B2 | 2/2012 | Sandhu et al. |
| 8,124,968 B2 | 2/2012 | Koo et al. |
| 8,154,908 B2 | 4/2012 | Maejima et al. |
| 8,154,909 B2 | 4/2012 | Azuma et al. |
| 8,295,077 B2 | 10/2012 | Murooka |
| 8,355,274 B2 | 1/2013 | Arita et al. |
| 8,411,477 B2 | 4/2013 | Tang et al. |
| 8,427,859 B2 | 4/2013 | Sandhu et al. |
| 8,431,458 B2 | 4/2013 | Sills et al. |
| 8,436,414 B2 | 5/2013 | Tanaka et al. |
| 8,536,556 B2 | 9/2013 | Fukumizu |
| 8,537,592 B2 | 9/2013 | Liu |
| 8,542,513 B2 | 9/2013 | Tang et al. |
| 8,611,121 B2 | 12/2013 | Ahn et al. |
| 8,652,909 B2 | 2/2014 | Sills et al. |
| 8,743,589 B2 | 6/2014 | Sandhu et al. |
| 8,791,447 B2 | 7/2014 | Liu et al. |
| 8,854,863 B2 | 10/2014 | Liu |
| 2002/0018355 A1 | 2/2002 | Johnson et al. |
| 2002/0034117 A1 | 3/2002 | Okazawa |
| 2002/0079524 A1 | 6/2002 | Dennison |
| 2002/0196695 A1 | 12/2002 | Pascucci |
| 2003/0031047 A1 | 2/2003 | Anthony et al. |
| 2003/0086313 A1 | 5/2003 | Asao |
| 2003/0174042 A1 | 9/2003 | Aono et al. |
| 2003/0174570 A1 | 9/2003 | Oishi |
| 2003/0185049 A1 | 10/2003 | Fricke et al. |
| 2003/0218902 A1 | 11/2003 | Perner et al. |
| 2003/0218929 A1 | 11/2003 | Fibranz |
| 2003/0223283 A1 | 12/2003 | Kunikiyo |

(56) References Cited

U.S. PATENT DOCUMENTS

| | | |
|---|---|---|
| 2004/0002186 A1 | 1/2004 | Vyvoda et al. |
| 2004/0090841 A1 | 5/2004 | Perner et al. |
| 2004/0100835 A1 | 5/2004 | Sugibayashi et al. |
| 2004/0108528 A1 | 6/2004 | Hsu et al. |
| 2004/0124407 A1 | 7/2004 | Kozicki et al. |
| 2004/0188714 A1 | 9/2004 | Scheuerlein |
| 2004/0245547 A1 | 12/2004 | Stipe |
| 2005/0001257 A1 | 1/2005 | Schloesser et al. |
| 2005/0014325 A1 | 1/2005 | Aono et al. |
| 2005/0032100 A1 | 2/2005 | Heath et al. |
| 2005/0054119 A1 | 3/2005 | Hsu et al. |
| 2005/0128799 A1 | 6/2005 | Kurotsuchi et al. |
| 2005/0161747 A1 | 7/2005 | Lung et al. |
| 2005/0174835 A1 | 8/2005 | Rinerson et al. |
| 2005/0205943 A1 | 9/2005 | Yamada |
| 2005/0243844 A1 | 11/2005 | Aono et al. |
| 2005/0250281 A1 | 11/2005 | Ufert et al. |
| 2005/0269646 A1 | 12/2005 | Yamada |
| 2005/0275003 A1 | 12/2005 | Shinmura |
| 2005/0287741 A1 | 12/2005 | Ding |
| 2006/0023498 A1 | 2/2006 | Asao |
| 2006/0035451 A1 | 2/2006 | Hsu |
| 2006/0046509 A1 | 3/2006 | Gwan-Hyeob |
| 2006/0062049 A1 | 3/2006 | Lee et al. |
| 2006/0097238 A1 | 5/2006 | Breuil et al. |
| 2006/0099813 A1 | 5/2006 | Pan et al. |
| 2006/0104111 A1 | 5/2006 | Tripsas et al. |
| 2006/0110878 A1 | 5/2006 | Lung et al. |
| 2006/0160304 A1 | 7/2006 | Hsu et al. |
| 2006/0170027 A1 | 8/2006 | Lee et al. |
| 2006/0171200 A1 | 8/2006 | Rinerson et al. |
| 2006/0181920 A1 | 8/2006 | Ufert |
| 2006/0215445 A1 | 9/2006 | Baek et al. |
| 2006/0258079 A1 | 11/2006 | Lung et al. |
| 2006/0258089 A1 | 11/2006 | Chung-Zen |
| 2006/0274593 A1 | 12/2006 | Kurotsuchi et al. |
| 2006/0284242 A1 | 12/2006 | Jo |
| 2006/0286709 A1 | 12/2006 | Lung et al. |
| 2007/0010082 A1 | 1/2007 | Pinnow et al. |
| 2007/0015330 A1 | 1/2007 | Li et al. |
| 2007/0019923 A1 | 1/2007 | Sasagawa et al. |
| 2007/0034848 A1 | 2/2007 | Liu |
| 2007/0041235 A1 | 2/2007 | Inoue |
| 2007/0045615 A1 | 3/2007 | Cho et al. |
| 2007/0048990 A1 | 3/2007 | Zhuang et al. |
| 2007/0086235 A1 | 4/2007 | Kim et al. |
| 2007/0109835 A1 | 5/2007 | Hsu |
| 2007/0120124 A1 | 5/2007 | Chan et al. |
| 2007/0121369 A1 | 5/2007 | Happ |
| 2007/0123039 A1 | 5/2007 | Elkins et al. |
| 2007/0132049 A1* | 6/2007 | Stipe ................ G11C 13/0007 257/421 |
| 2007/0165434 A1 | 7/2007 | Lee et al. |
| 2007/0167008 A1 | 7/2007 | Hsu et al. |
| 2007/0171706 A1 | 7/2007 | Fuji |
| 2007/0173019 A1 | 7/2007 | Ho et al. |
| 2007/0176261 A1 | 8/2007 | Lung |
| 2007/0210348 A1 | 9/2007 | Song et al. |
| 2007/0224770 A1 | 9/2007 | Nagashima |
| 2007/0231988 A1 | 10/2007 | Yoo et al. |
| 2007/0246795 A1 | 10/2007 | Fang et al. |
| 2007/0257257 A1 | 11/2007 | Cho et al. |
| 2007/0258279 A1 | 11/2007 | Lung et al. |
| 2007/0267675 A1 | 11/2007 | Cho et al. |
| 2007/0268739 A1 | 11/2007 | Yoo et al. |
| 2007/0268742 A1 | 11/2007 | Liu |
| 2007/0269683 A1 | 11/2007 | Chen et al. |
| 2007/0278578 A1 | 12/2007 | Yoshida et al. |
| 2007/0285965 A1* | 12/2007 | Toda ........................ G11C 5/02 365/148 |
| 2007/0295950 A1 | 12/2007 | Cho et al. |
| 2008/0001172 A1 | 1/2008 | Karg et al. |
| 2008/0008642 A1 | 1/2008 | Mori et al. |
| 2008/0012064 A1 | 1/2008 | Park et al. |
| 2008/0013363 A1 | 1/2008 | Kim et al. |
| 2008/0014750 A1 | 1/2008 | Nagashima |
| 2008/0026547 A1 | 1/2008 | Yin et al. |
| 2008/0029754 A1 | 2/2008 | Min et al. |
| 2008/0029842 A1 | 2/2008 | Symanczyk |
| 2008/0036508 A1 | 2/2008 | Sakamoto et al. |
| 2008/0048165 A1 | 2/2008 | Miyazawa |
| 2008/0049487 A1 | 2/2008 | Yoshimura et al. |
| 2008/0062740 A1 | 3/2008 | Baek et al. |
| 2008/0073635 A1 | 3/2008 | Kiyotoshi et al. |
| 2008/0078985 A1 | 4/2008 | Meyer et al. |
| 2008/0080229 A1 | 4/2008 | Choi et al. |
| 2008/0089105 A1 | 4/2008 | Ro et al. |
| 2008/0093591 A1 | 4/2008 | Khang et al. |
| 2008/0099753 A1 | 5/2008 | Song et al. |
| 2008/0102278 A1 | 5/2008 | Kreupl et al. |
| 2008/0105862 A1 | 5/2008 | Lung et al. |
| 2008/0106925 A1 | 5/2008 | Paz De Araujo et al. |
| 2008/0123390 A1 | 5/2008 | Kim et al. |
| 2008/0157257 A1 | 7/2008 | Bertin et al. |
| 2008/0175031 A1 | 7/2008 | Park et al. |
| 2008/0175032 A1 | 7/2008 | Tanaka et al. |
| 2008/0185571 A1 | 8/2008 | Happ et al. |
| 2008/0185687 A1 | 8/2008 | Hong et al. |
| 2008/0212361 A1* | 9/2008 | Bertin ................ H01L 27/1021 365/151 |
| 2008/0232160 A1 | 9/2008 | Gopalakrishnan |
| 2008/0247219 A1 | 10/2008 | Choi et al. |
| 2008/0251779 A1 | 10/2008 | Kakosehke et al. |
| 2008/0258126 A1 | 10/2008 | Lung |
| 2008/0259672 A1 | 10/2008 | Lung |
| 2008/0303014 A1 | 12/2008 | Goux et al. |
| 2009/0014706 A1 | 1/2009 | Lung |
| 2009/0014707 A1 | 1/2009 | Lu et al. |
| 2009/0026436 A1 | 1/2009 | Song et al. |
| 2009/0057640 A1 | 3/2009 | Lin et al. |
| 2009/0059644 A1 | 3/2009 | Kajigaya et al. |
| 2009/0072217 A1 | 3/2009 | Klostermann |
| 2009/0085121 A1 | 4/2009 | Park et al. |
| 2009/0097295 A1 | 4/2009 | Morimoto |
| 2009/0141547 A1 | 6/2009 | Jin et al. |
| 2009/0168495 A1 | 7/2009 | Aoki |
| 2009/0173930 A1 | 7/2009 | Yasuda et al. |
| 2009/0180309 A1 | 7/2009 | Liu |
| 2009/0207647 A1 | 8/2009 | Maejima et al. |
| 2009/0207681 A1 | 8/2009 | Juengling |
| 2009/0218557 A1 | 9/2009 | Sato |
| 2009/0250681 A1 | 10/2009 | Smythe et al. |
| 2009/0261314 A1 | 10/2009 | Kim et al. |
| 2009/0261343 A1 | 10/2009 | Herner et al. |
| 2009/0267047 A1 | 10/2009 | Sasago et al. |
| 2009/0268532 A1 | 10/2009 | DeAmbroggi et al. |
| 2009/0272959 A1 | 11/2009 | Phatak et al. |
| 2009/0272960 A1 | 11/2009 | Srinivasan et al. |
| 2009/0272961 A1 | 11/2009 | Miller et al. |
| 2009/0272962 A1 | 11/2009 | Kumar et al. |
| 2009/0273087 A1 | 11/2009 | French et al. |
| 2009/0278109 A1 | 11/2009 | Phatak |
| 2009/0303780 A1 | 12/2009 | Kasko et al. |
| 2009/0315090 A1 | 12/2009 | Weis et al. |
| 2009/0316467 A1 | 12/2009 | Liu |
| 2009/0316474 A1 | 12/2009 | Cho et al. |
| 2009/0317540 A1 | 12/2009 | Sandhu et al. |
| 2009/0321878 A1 | 12/2009 | Koo et al. |
| 2009/0323385 A1 | 12/2009 | Scheuerlein et al. |
| 2010/0003782 A1 | 1/2010 | Sinha et al. |
| 2010/0008163 A1 | 1/2010 | Liu |
| 2010/0044666 A1 | 2/2010 | Baek et al. |
| 2010/0046273 A1 | 2/2010 | Azuma et al. |
| 2010/0061132 A1 | 3/2010 | Fujisaki et al. |
| 2010/0065836 A1 | 3/2010 | Lee et al. |
| 2010/0072452 A1 | 3/2010 | Kim et al. |
| 2010/0084741 A1 | 4/2010 | Andres et al. |
| 2010/0085798 A1 | 4/2010 | Lu et al. |
| 2010/0090187 A1 | 4/2010 | Ahn et al. |
| 2010/0110759 A1 | 5/2010 | Jin et al. |
| 2010/0123542 A1 | 5/2010 | Vaithyanathan et al. |
| 2010/0135061 A1 | 6/2010 | Li et al. |
| 2010/0140578 A1 | 6/2010 | Tian et al. |
| 2010/0157657 A1 | 6/2010 | Rinerson et al. |

(56) References Cited

U.S. PATENT DOCUMENTS

| | | |
|---|---|---|
| 2010/0157658 A1 | 6/2010 | Schloss et al. |
| 2010/0163820 A1 | 7/2010 | Son |
| 2010/0163829 A1 | 7/2010 | Wang et al. |
| 2010/0172171 A1 | 7/2010 | Azuma et al. |
| 2010/0176368 A1 | 7/2010 | Ko et al. |
| 2010/0178729 A1 | 7/2010 | Yoon et al. |
| 2010/0193758 A1 | 8/2010 | Tian et al. |
| 2010/0193761 A1 | 8/2010 | Amin et al. |
| 2010/0193762 A1 | 8/2010 | Hsieh et al. |
| 2010/0195371 A1 | 8/2010 | Ohba et al. |
| 2010/0232200 A1 | 9/2010 | Shepard |
| 2010/0237442 A1 | 9/2010 | Li et al. |
| 2010/0243980 A1 | 9/2010 | Fukumizu |
| 2010/0243983 A1 | 9/2010 | Chiang et al. |
| 2010/0258782 A1 | 10/2010 | Kuse et al. |
| 2010/0259960 A1 | 10/2010 | Samachisa |
| 2010/0259961 A1 | 10/2010 | Fasoli et al. |
| 2010/0259962 A1 | 10/2010 | Yan et al. |
| 2011/0059576 A1 | 3/2011 | Cho et al. |
| 2011/0128775 A1 | 6/2011 | Maejima et al. |
| 2011/0171836 A1 | 7/2011 | Xia |
| 2011/0193044 A1 | 8/2011 | Sandhu et al. |
| 2011/0205783 A1 | 8/2011 | Murooka |
| 2011/0249486 A1 | 10/2011 | Azuma et al. |
| 2011/0261606 A1 | 10/2011 | Sandhu et al. |
| 2011/0261607 A1 | 10/2011 | Tang et al. |
| 2011/0309322 A1 | 12/2011 | Hwang |
| 2012/0119180 A1 | 5/2012 | Koo et al. |
| 2012/0140542 A1 | 6/2012 | Liu |
| 2012/0147648 A1 | 6/2012 | Scheuerlein |
| 2012/0164798 A1 | 6/2012 | Sills et al. |
| 2012/0187363 A1 | 7/2012 | Liu et al. |
| 2012/0248399 A1 | 10/2012 | Sasago et al. |
| 2013/0021836 A1 | 1/2013 | Liu |
| 2014/0247640 A1 | 9/2014 | Liu |

FOREIGN PATENT DOCUMENTS

| | | |
|---|---|---|
| CN | 1459792 | 12/2003 |
| CN | 1624803 | 6/2005 |
| CN | 101005113 | 12/2006 |
| CN | 101051670 | 4/2007 |
| CN | 101034732 | 9/2007 |
| CN | 101256831 | 9/2008 |
| CN | 101350360 | 1/2009 |
| CN | 101546602 | 9/2009 |
| CN | 101840995 | 9/2010 |
| CN | 200880124714.6 | 7/2012 |
| CN | 201180027954.6 | 5/2014 |
| CN | 201180065042.8 | 5/2015 |
| CN | 201180057866.0 | 11/2015 |
| EP | 1796103 | 9/2006 |
| EP | 11792836 | 12/2013 |
| EP | 11845727.4 | 11/2014 |
| EP | 11834802 | 3/2015 |
| EP | 14171745.4 | 3/2015 |
| GB | 1266513 | 3/1972 |
| JP | 2005-175457 | 8/2005 |
| JP | 2005-353779 | 12/2005 |
| JP | 2006-032720 | 2/2006 |
| JP | 2006-040981 | 2/2006 |
| JP | 2006-074028 | 3/2006 |
| JP | 2006-121044 | 5/2006 |
| JP | 2008-135744 | 6/2008 |
| JP | 2008-192995 | 8/2008 |
| JP | 2009-081251 | 4/2009 |
| JP | 2009-163867 | 7/2009 |
| JP | 2009-267411 | 11/2009 |
| JP | 2010-009669 | 1/2010 |
| JP | 2010-010688 | 1/2010 |
| JP | 2010-192569 | 9/2010 |
| JP | 2010-192646 | 9/2010 |
| JP | 2010-232214 | 10/2010 |
| JP | 2010-263211 | 11/2010 |
| KR | 2003-0048421 | 6/2003 |
| KR | 2005-0008353 | 1/2005 |
| KR | 1020060087882 | 8/2006 |
| KR | 10-0751736 | 8/2007 |
| KR | 20070111840 | 11/2007 |
| KR | 20070118865 | 12/2007 |
| KR | 20090109804 | 10/2009 |
| KR | 20100078808 | 7/2010 |
| KR | 20100083402 | 7/2010 |
| TW | 097147549 | 5/2013 |
| TW | 100119681 | 8/2013 |
| TW | 100135681 | 10/2013 |
| TW | 100142963 | 8/2014 |
| TW | 101102280 | 8/2014 |
| WO | WO 2006/003620 | 1/2006 |
| WO | WO 2008/029446 | 3/2008 |
| WO | PCT/US2008/084422 | 3/2009 |
| WO | WO 2009/127187 | 10/2009 |
| WO | WO 2010/068221 | 6/2010 |
| WO | WO 2010/082922 | 7/2010 |
| WO | WO 2010/082923 | 7/2010 |
| WO | WO 2010/082928 | 7/2010 |
| WO | WO 2010/085241 | 7/2010 |
| WO | WO 2010/087854 | 8/2010 |
| WO | WO 2010/101340 | 9/2010 |
| WO | WO 2010/117911 | 10/2010 |
| WO | PCT/US2011/035601 | 11/2011 |
| WO | PCT/US2011/051785 | 4/2012 |
| WO | PCT/US2011/058095 | 5/2012 |
| WO | PCT/US2011/059095 | 5/2012 |
| WO | PCT/US2012/021168 | 7/2012 |
| WO | PCT/US2011/066770 | 9/2012 |
| WO | PCT/US2011/035601 | 12/2012 |
| WO | PCT/US2011/051785 | 4/2013 |
| WO | PCT/US2011/059095 | 6/2013 |
| WO | PCT/US2011/066770 | 7/2013 |

OTHER PUBLICATIONS

Bedeschi et al., "A Bipolar-Selected Phase Change Memory Featuring Multi-Level Cell Storage", IEEE Journal of Solid-State Circuits vol. 44, No. 1, Jan. 2009, United States, pp. 217-227.
Chen et al., "Non-Volatile Resistive Switching for Advanced Memory Applications", IEEE, 2005, United States, 4 pages.
Chen et al., "Perovskite RRAM Devices with Metal/Insulator/PCMO/Metal Heterostructures", IEEE, 2005, United States, pp. 125-128.
Choi et al., "Defect Structure and Electrical Properties of Single-Crystal Ba0.03SR0.97TiO3", Journal of the American Ceramic Society vol. 71, No. 4, 1988, United Kingdom, pp. 201-205.
Courtade et al., "Microstructure and Resistance Switching in NiO Binary Oxide Films Obtained from Ni Oxidation", IEEE, 2006, United States, pp. 94-99.
Higaki et al., "Effects of Gas Phase Absorption into Si Substrates on Plasma Doping Process", IEEE 33rd Conference on European Solid-State Device Research, Sep. 16-18, 2003, Portugal, 4 pages.
Ho et al., "A Highly Reliable Self-Aligned Graded Oxide WOx Resistance Memory: Conduction Mechanisms and Reliability", IEEE 2007 Symposium on VLSI Technology Digest of Technical Papers, Kyoto, pp. 228-229.
Hosoi et al., "High Speed Unipolar Switching Resistance RAM (RRAM) Technology", IEEE International Electron Devices Meeting, Dec. 2006, United States, 4 pages.
Hudgens et al., "Overview of Phase-Change Chalcogenide Nonvolatile Memory Technology", MRS Bulletin, Nov. 2004, United States, pp. 829-832.
Ignatiev et al., "Resistance Non-volatile Memory-RRAM", Materials Research Society Symposium Proceedings vol. 997, 2007, United States, 9 pages.
Karg et al., "Nanoscale Resistive Memory Device using SrTiO3 Films", IEEE, 2007, United States, pp. 68-70.
Kau et al., "A Stackable Cross Point Phase Change Memory", IEEE, 2009, United States, pp. 27.1.1-27.1.4.
Komori et al., "Disturbless Flash Memory due to High Boost Efficiency on BiCS Structure and Optimal Memory Film Stack for

(56) References Cited

OTHER PUBLICATIONS

Ultra High Density Storage Device", IEEE International Electron Devices Meeting, Dec. 15-17, 2008, United States, pp. 851-854.
Kooij et al., "Photoselective Metal Deposition on Amorphous Silicon p-i-n Solar Cells", Electrochemical Society Letters, Journal of the Electrochemical Society vol. 44, No. 10, Oct. 1997, United States, pp. L271-L272.
Kozicki et al., "Non-Volatile Memory Based on Solid Electrolytes", IEEE Non-Volatile Memory Technology Symposium, Nov. 15-17, 2004, United States, 8 pages.
Kozicki, "Memory Devices Based on Solid Electrolytes", Materials Research Society Symposium Proceedings vol. 997, 2007, United States, 10 pages.
Lee et al., "2-Stack 1D-1R Cross-Point Structure with Oxide Diodes as Switch Elements for High Density Resistance RAM Application", IEEE, 2007, United States, pp. 771-774.
Lee et al., "Resisitance Switching of Al Doped ZnO for Non Volatile Memory Applications", IEEE 21st Non-Volatile Semiconductor Memory Workshop, 2006, United States, 2 pages.
Lin et al., "Effect of Top Electrode Material on Resistive Switching Properties of ZrO2 Film Memory Devices", IEEE Electron Device Letters vol. 28, No. 5, May 2007, United States, pp. 366-368.
Meyer et al., "Oxide Dual-Layer Memory Element for Scalable Non-Volatile Cross-Point Memory Technology", IEEE, 2008, United States, 5 pages.
Miyashita et al., "A Novel Bit-Line Process using Poly-Si Masked Dual-Damascene (PMDD) for 0.13 μm DRAMs and Beyond", IEEE, 2000, United States, pp. 15.4.1-15.4.4.
Muller et al., "Emerging Non-Volatile Memory Technologies", IEEE, 2003, United States, pp. 37-44.
Oh et al., "Full Integration of Highly Manufacturable 512Mb PRAM based on 90nm Technology", IEEE, 2006, United States, 4 pages.
Pein et al., "Performance of the 3-D PENCIL Flash EPROM Cell and Memory Array", IEEE Transaction on Electron Devices vol. 42, No. 11, Nov. 1995, United States, pp. 1982-1991.
Pellizzer et al., "A 90nm Phase Change Memory Technology for Stand-Alone Non-Volatile Memory Applications", IEEE Symposium on VLSI Technology 2006 Digest of Technical Papers, United States, 2 pages. Abstract Only.
Pirovano et al., "Self-Aligned μTrench Phase-Change Memory Cell Architecture for 90nm Technology and Beyond", IEEE 37th European Solid State Device Research Conference, Sep. 11-13, 2007, Munich, 1 page. Abstract Only.
Scheck et al., "Selective Metal Electrodeposition Through Doping Modulation of Semiconductor Surfaces", Applied Physics Letters vol. 86, 2005, United States, 3 pages.
Wikipedia, Despotuli et al., "Programmable Metallization Cell", Dec. 11, 2007, Place of Publication: Internet, pp. 1-4.
Wikipedia; "Programmable Metallization Cell", Dec. 11, 2007; Downloaded Dec. 13, 2011; http://en.wikipedia.org/wiki/Programmable_metallization_cell. 4 pages.
Wuttig, "Phase-Change Materials: Towards a Universal Memory?", Nature Materials vol. 4, Apr. 2005, United Kingdom, pp. 265-266.
Xing et al., "Characterization of AlGaN/GaN p-n Diodes with Selectively Regrown n-AlGaN by Metal-Organic Chemical-Vapor Deposition and its Application to GaN-Based Bipolar Transistors", Journal of Applied Physics vol. 97, 2005, United States, 4 pages.
Yih et al., "SiC/Si Heterojunction Diodes Fabricated by Self-Selective and by Blanket Rapid Thermal Chemical Vapor Deposition", IEEE Transactions on Electron Devices vol. 41, No. 3, Mar. 1994, United States, pp. 281-287.
Yoon et al., "Vertical Cross-Point Resistance Change Memory for Ultra-High Density Non-Volatile Memory Applications", IEEE Symposium on VLSI Technology Digest of Technical Papers, Jun. 16-18, 2009, United States, pp. 26-27.
Yu et al., "Structure Effects on Resistive Switching of Al/TiOx/Al Devices for RRAM Applications" IEEE Electron Device Letters vol. 29, No. 4, Apr. 2008, United States, pp. 331-333.

\* cited by examiner

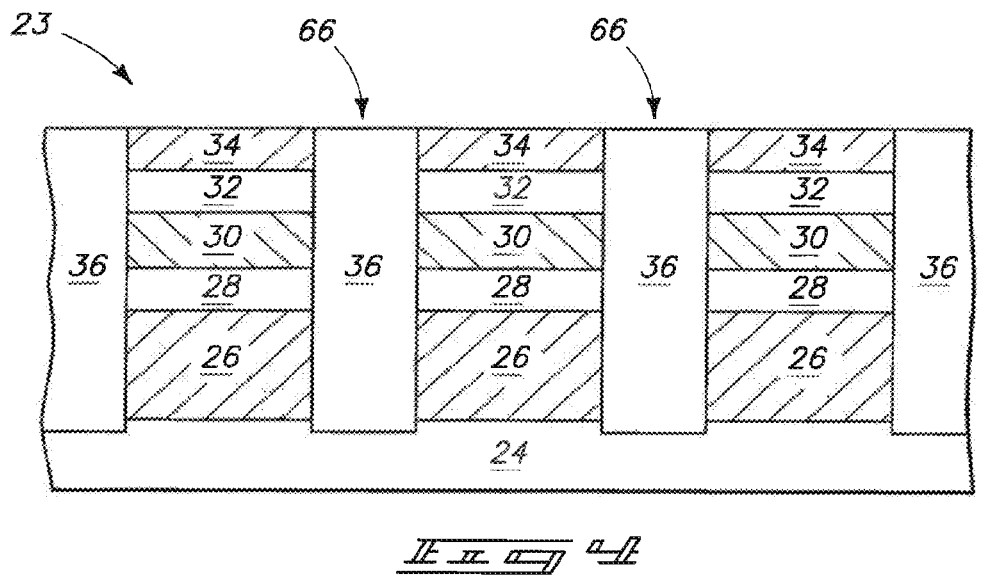
_Fig. 4_
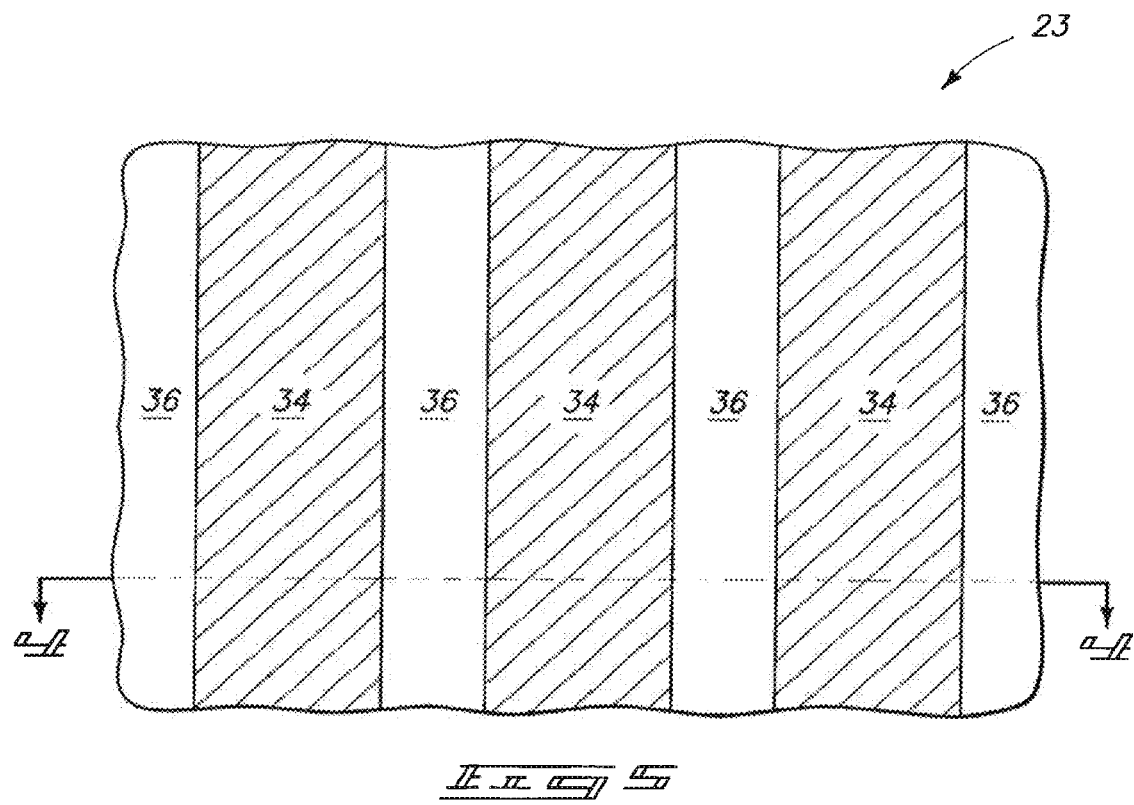
_Fig. 5_

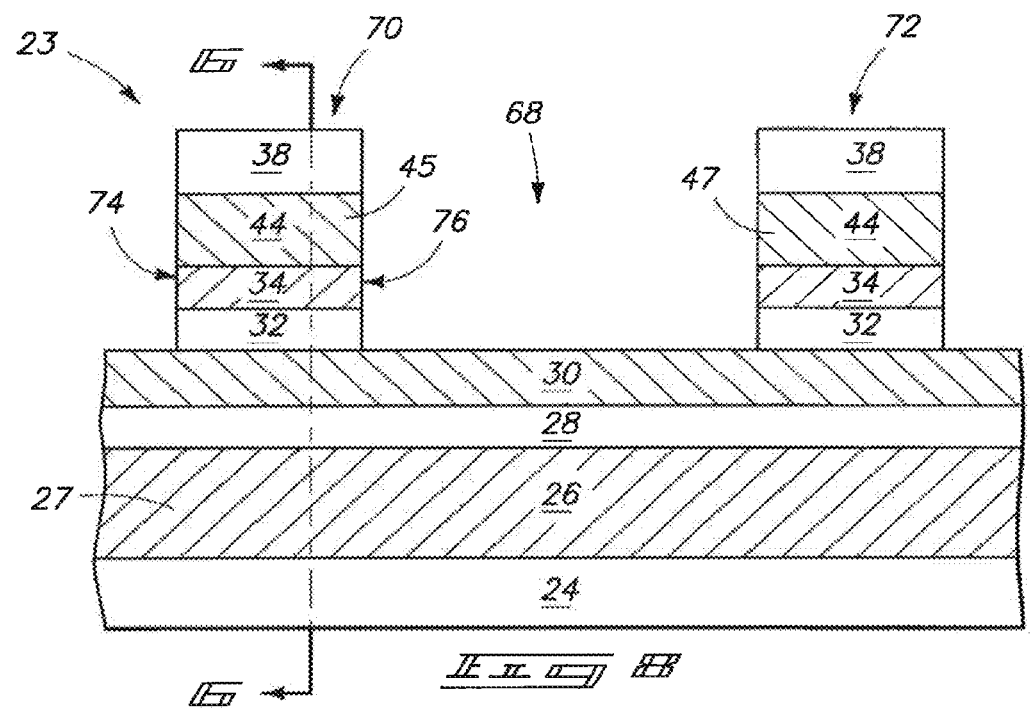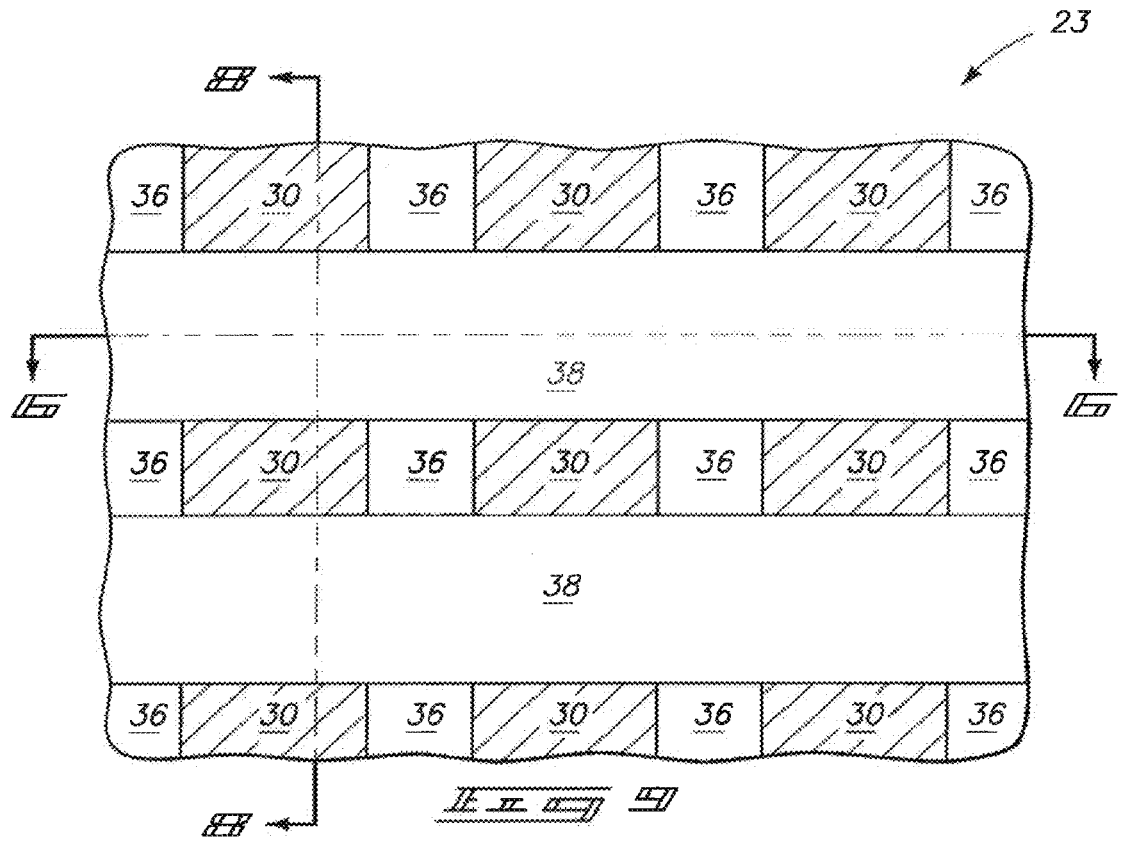

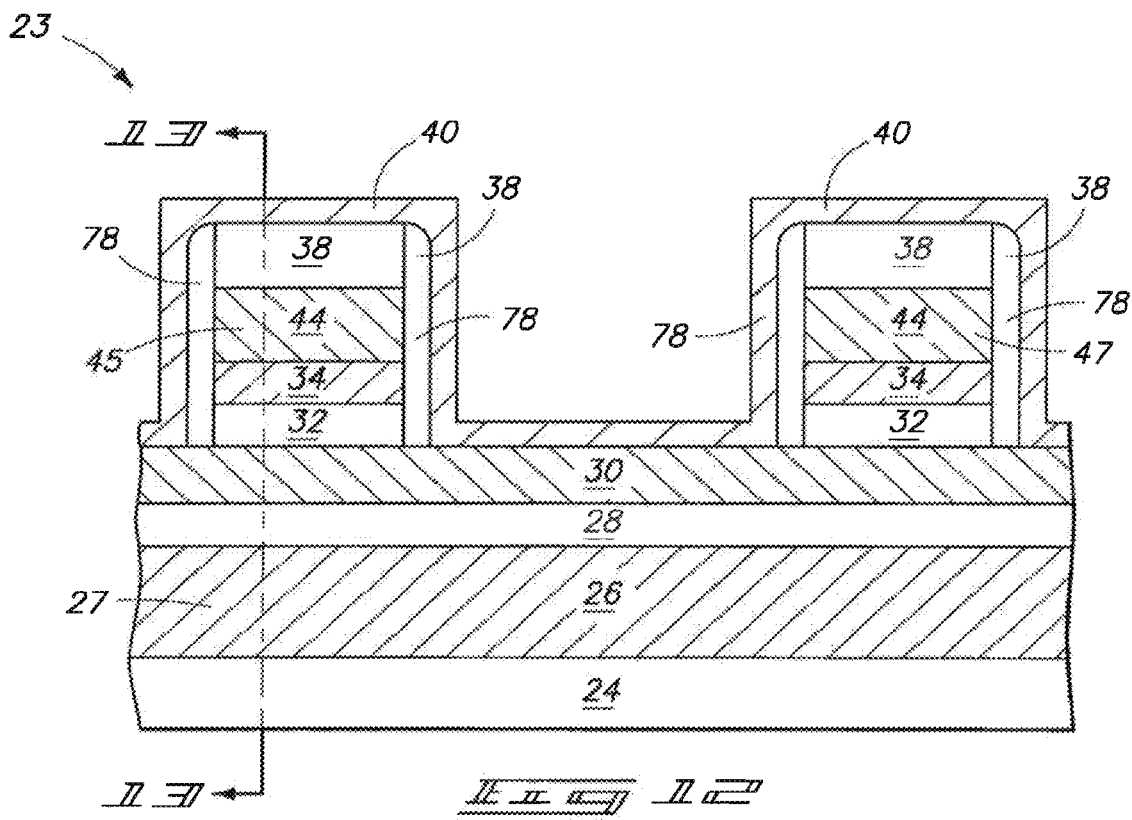
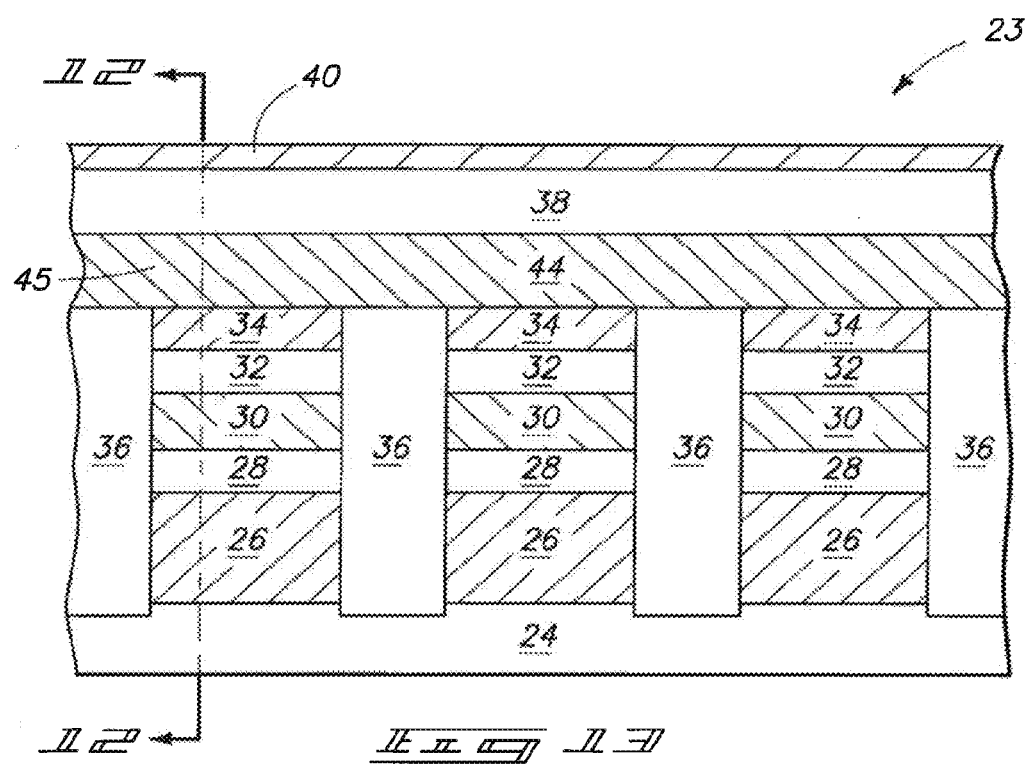

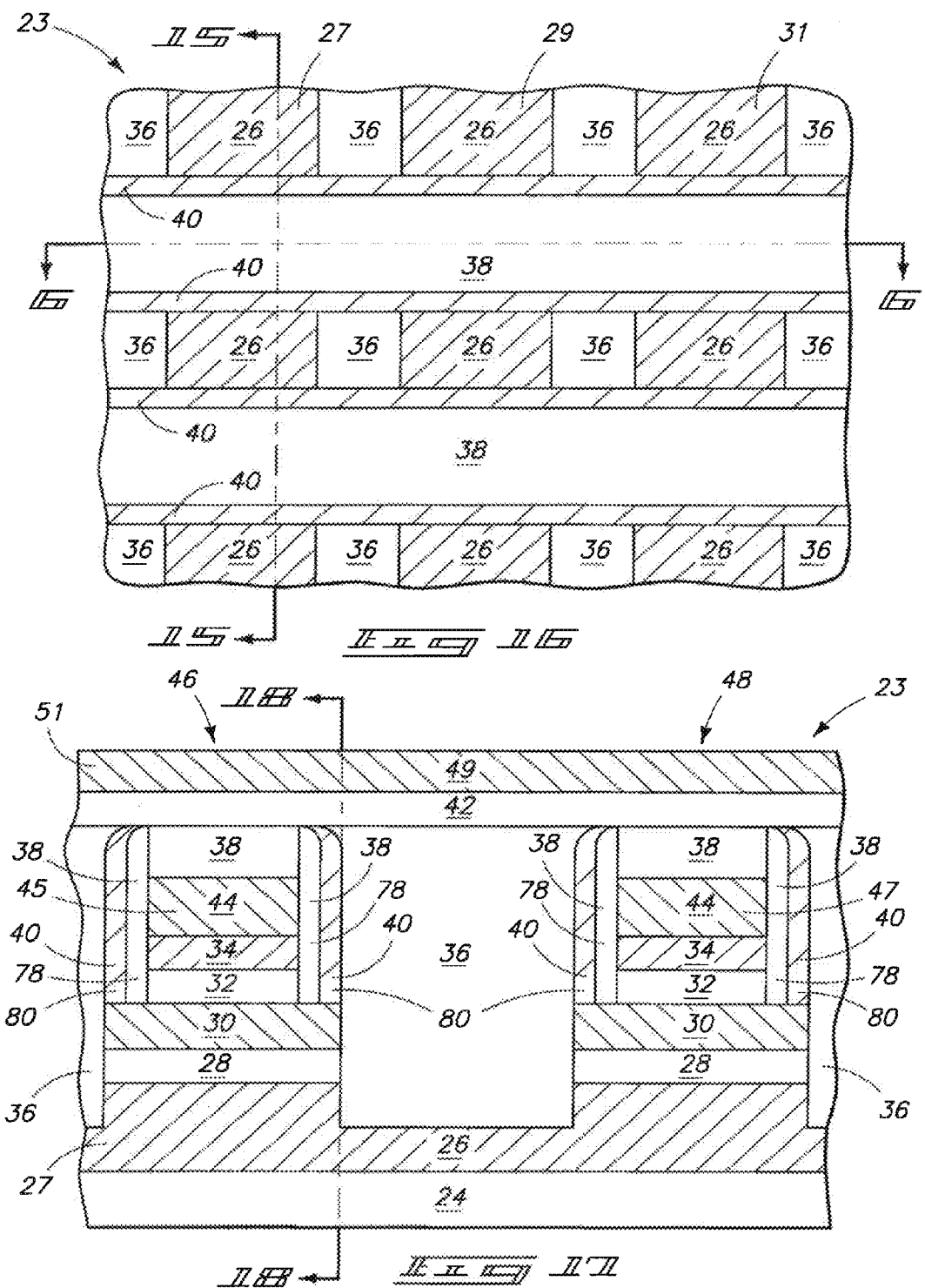

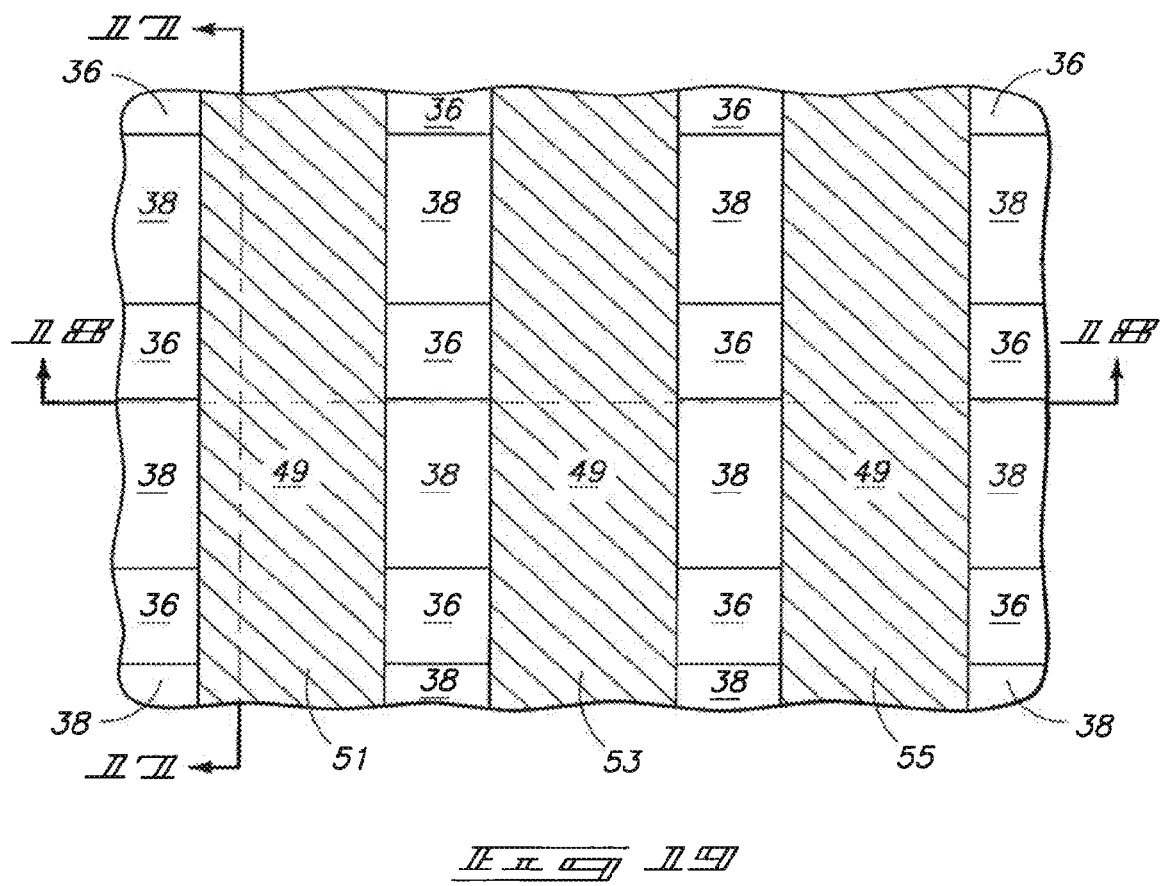

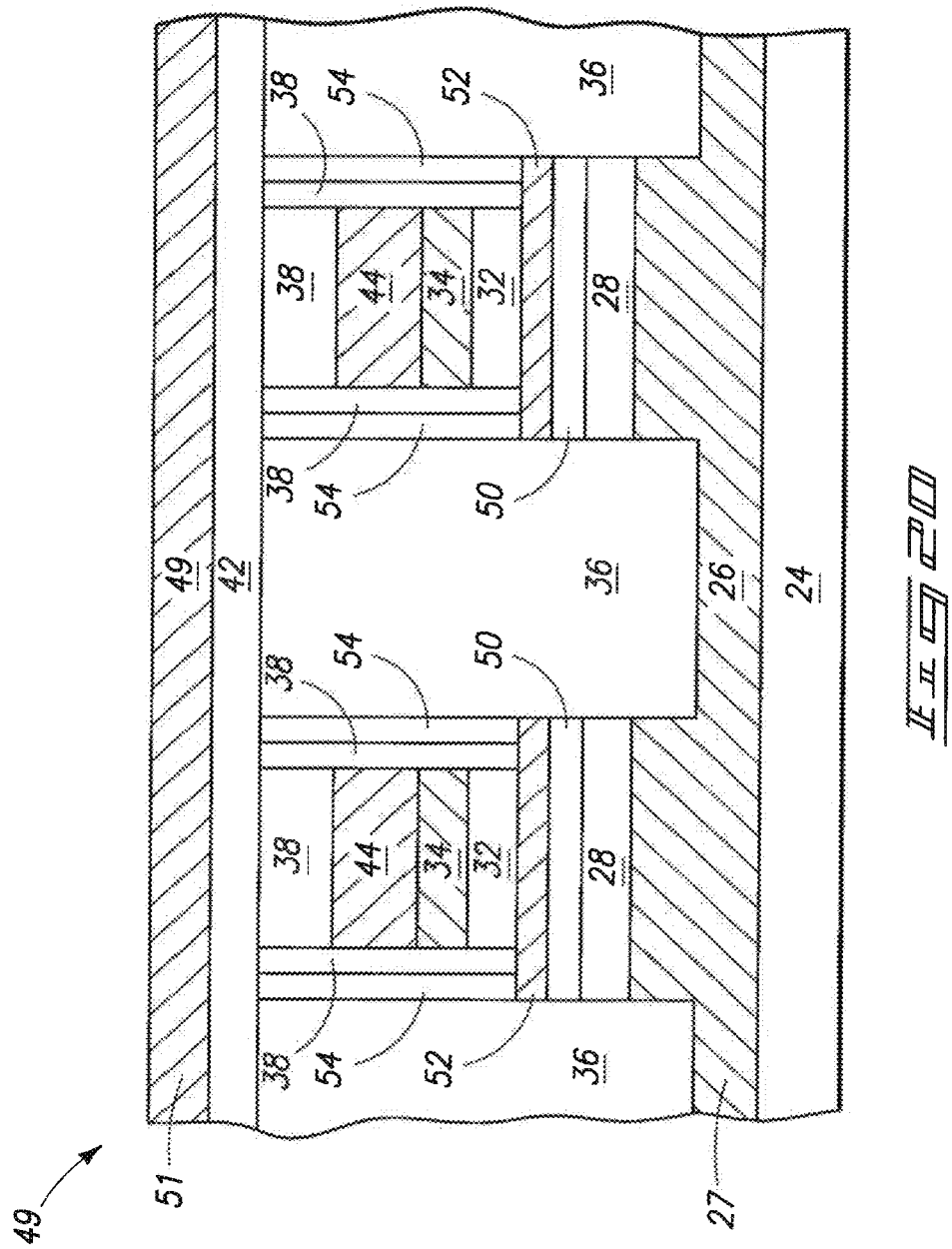

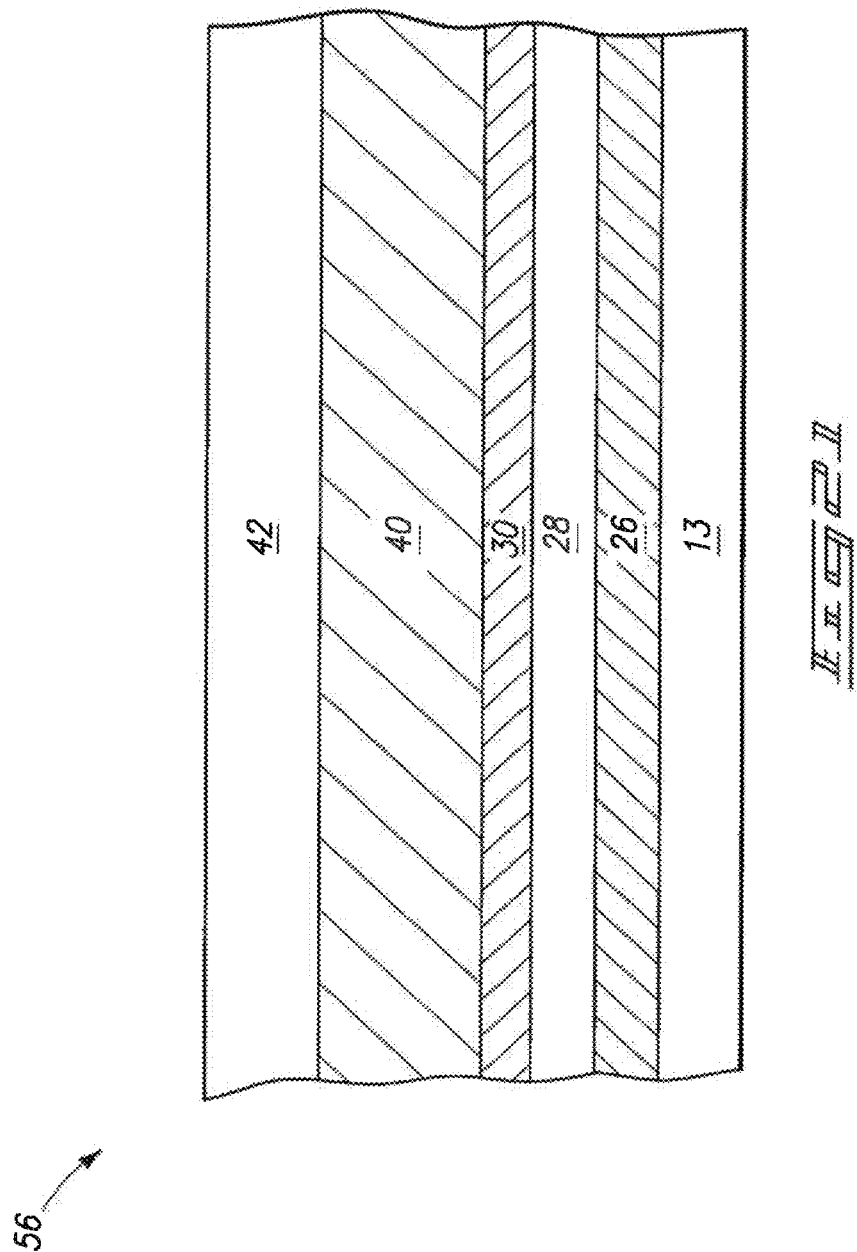

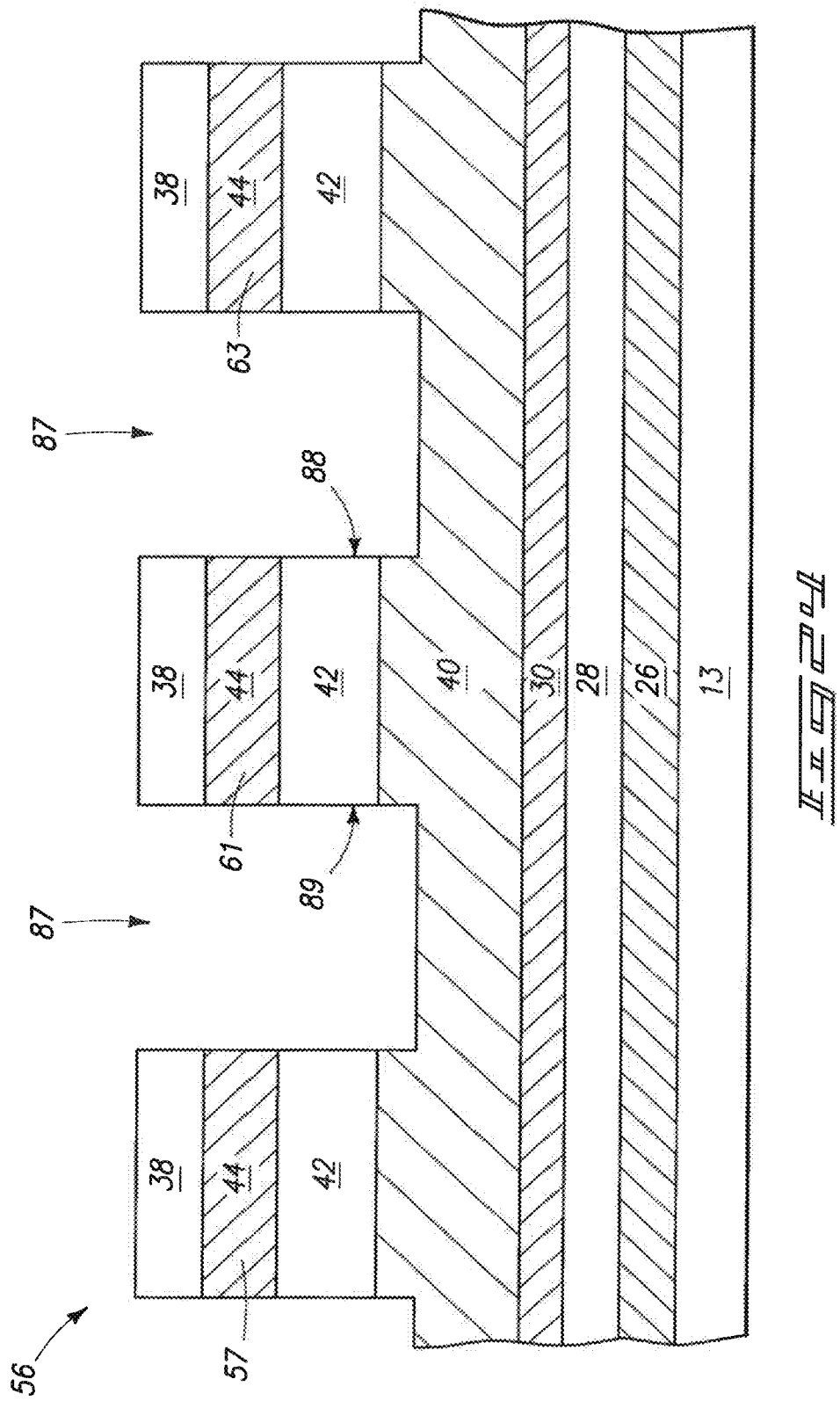

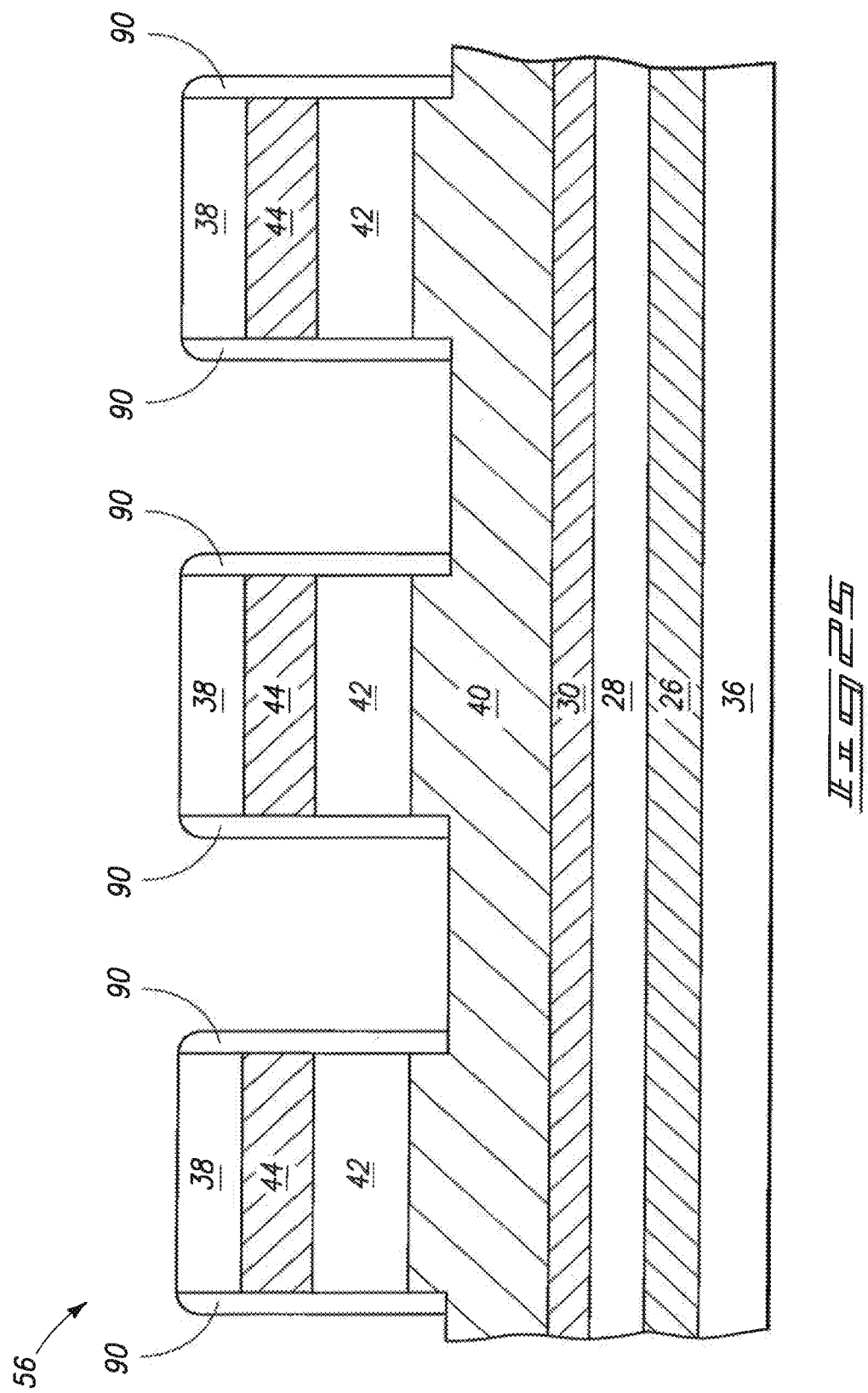

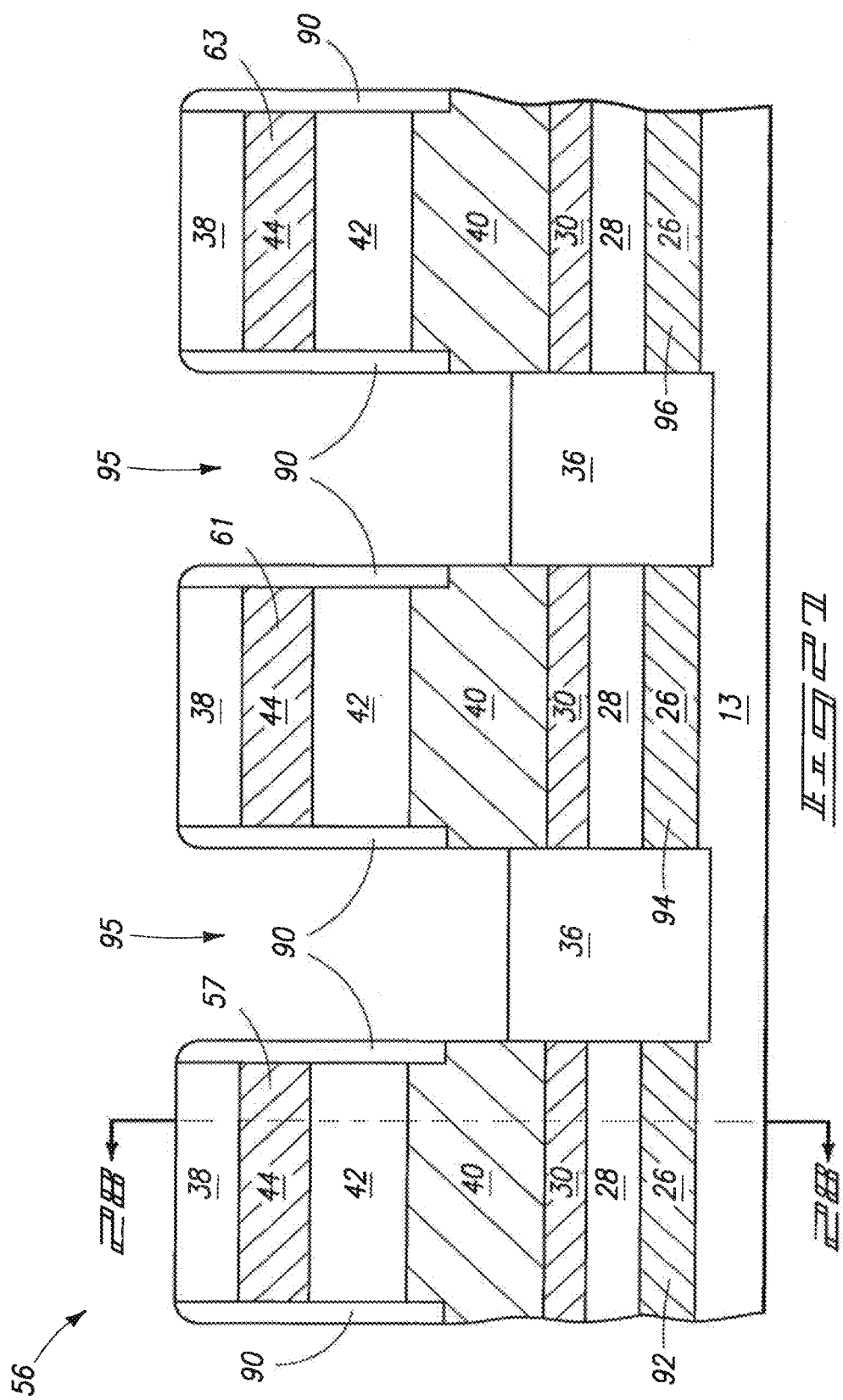

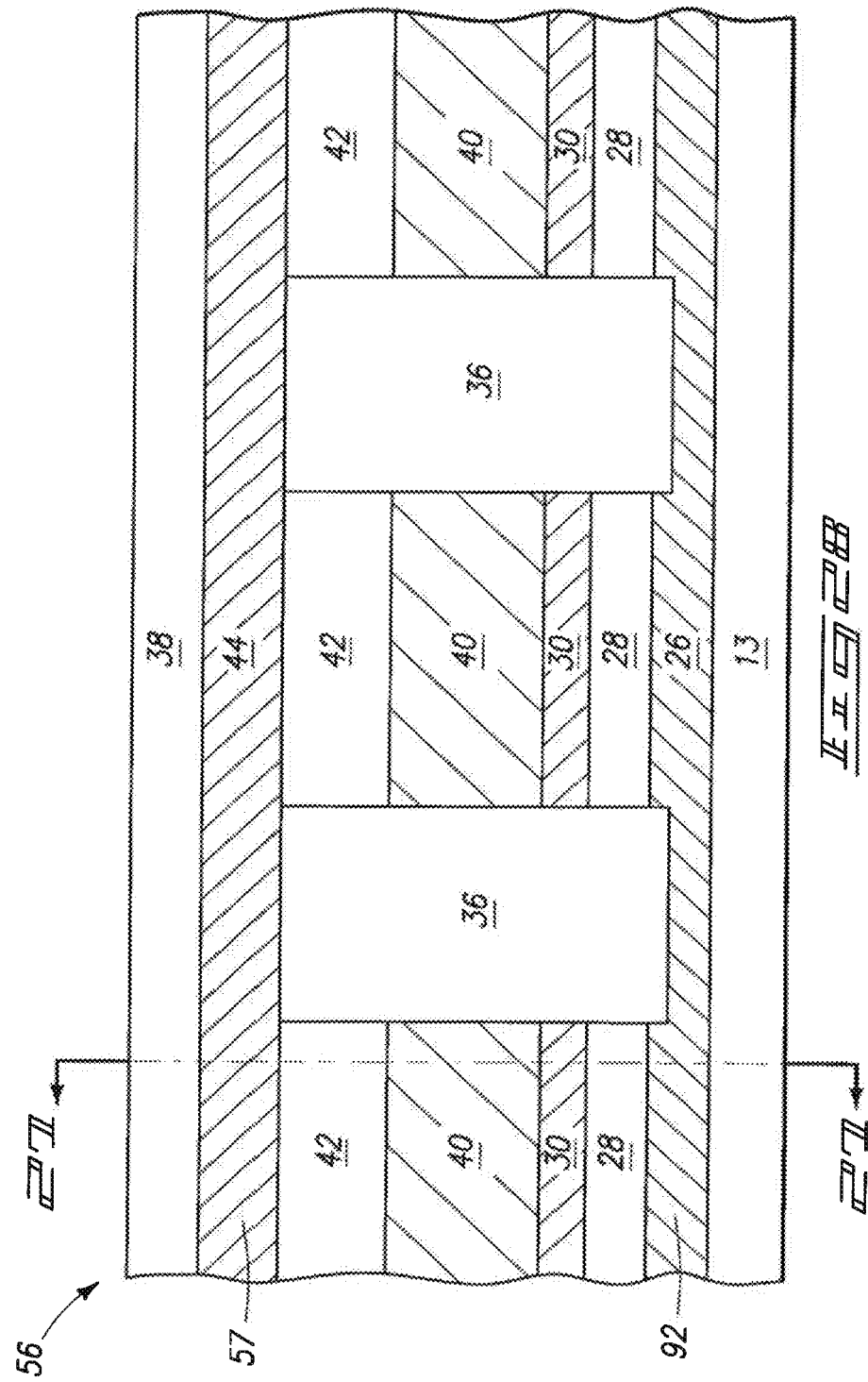

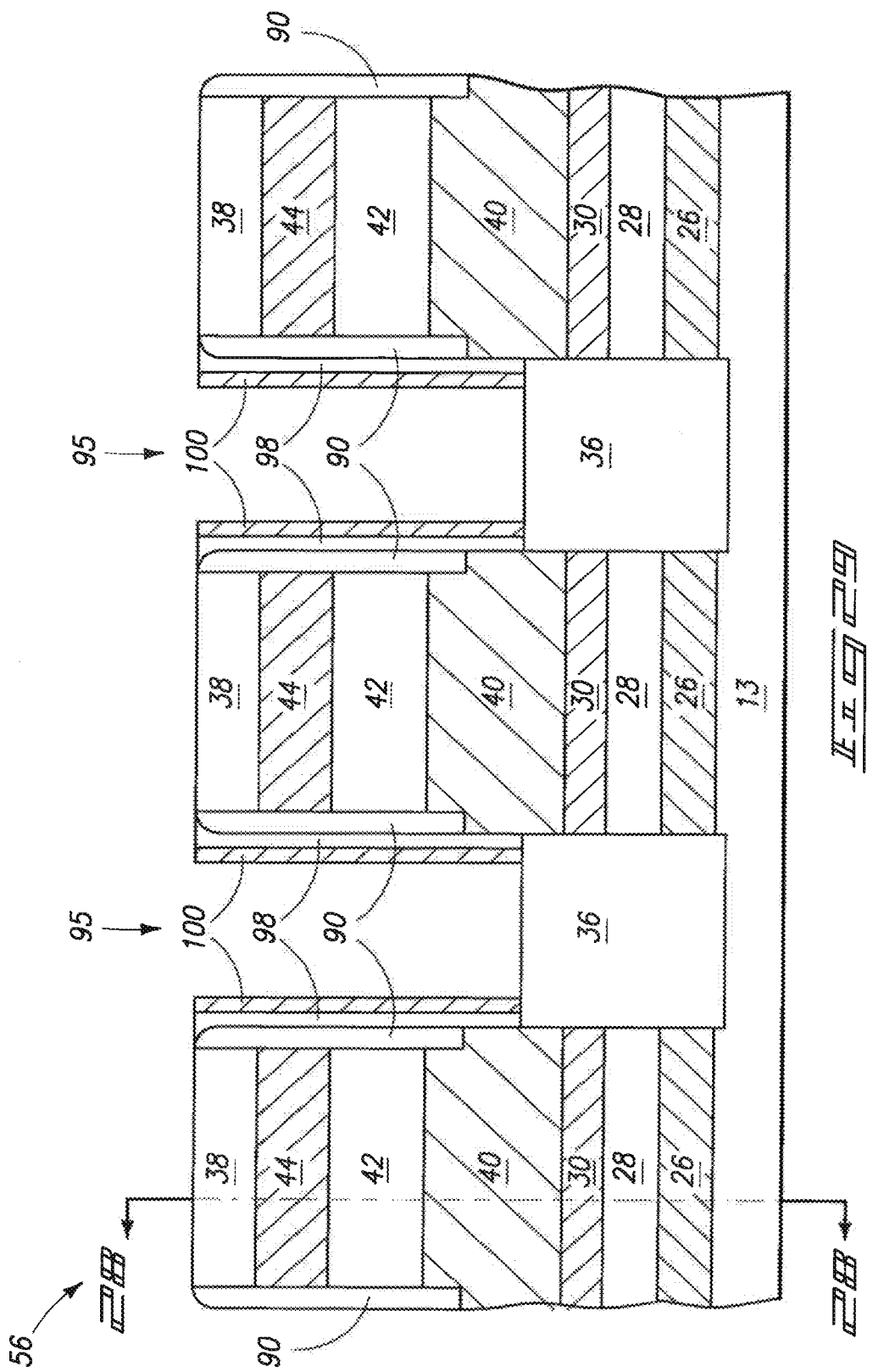

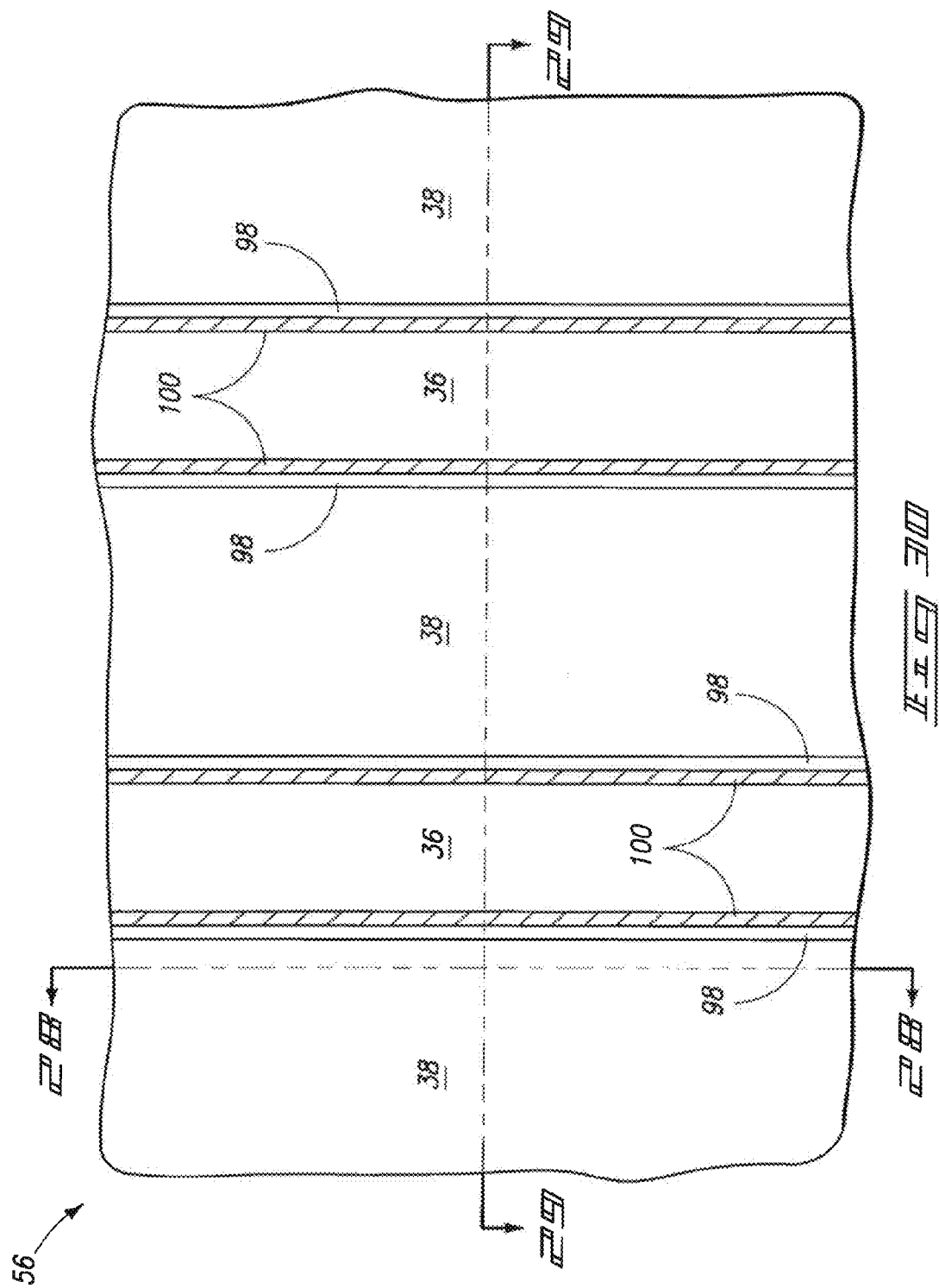

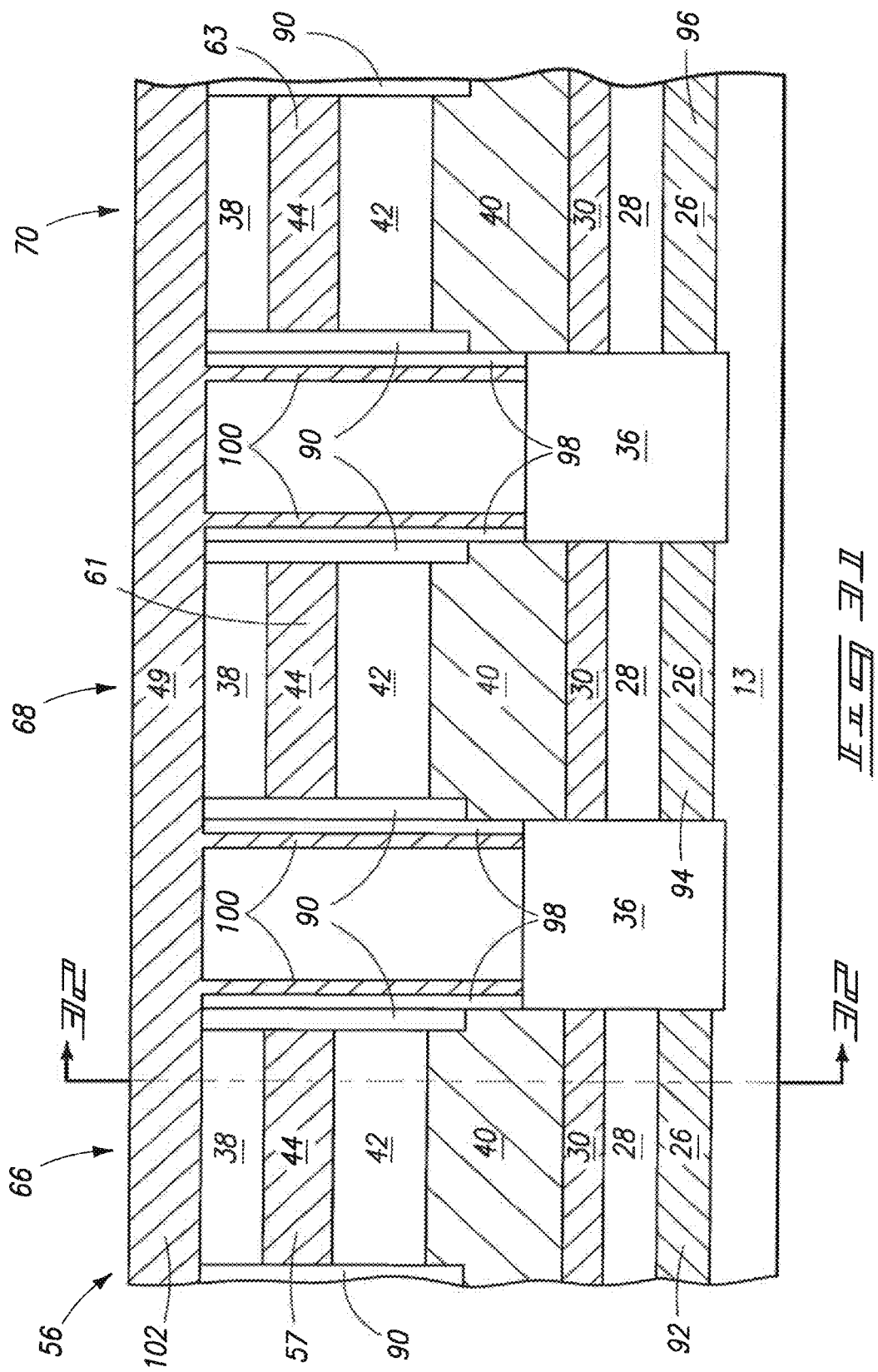

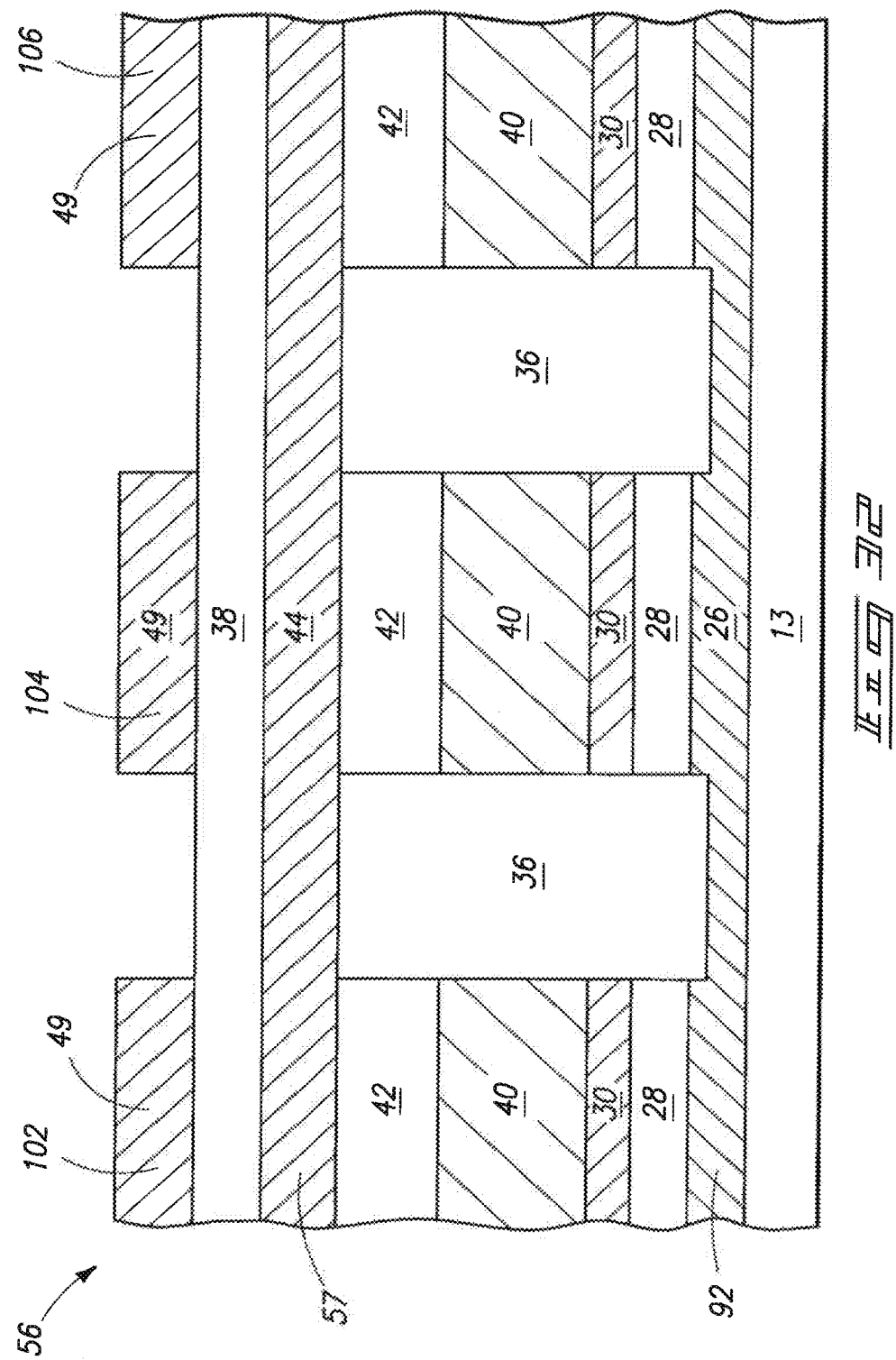

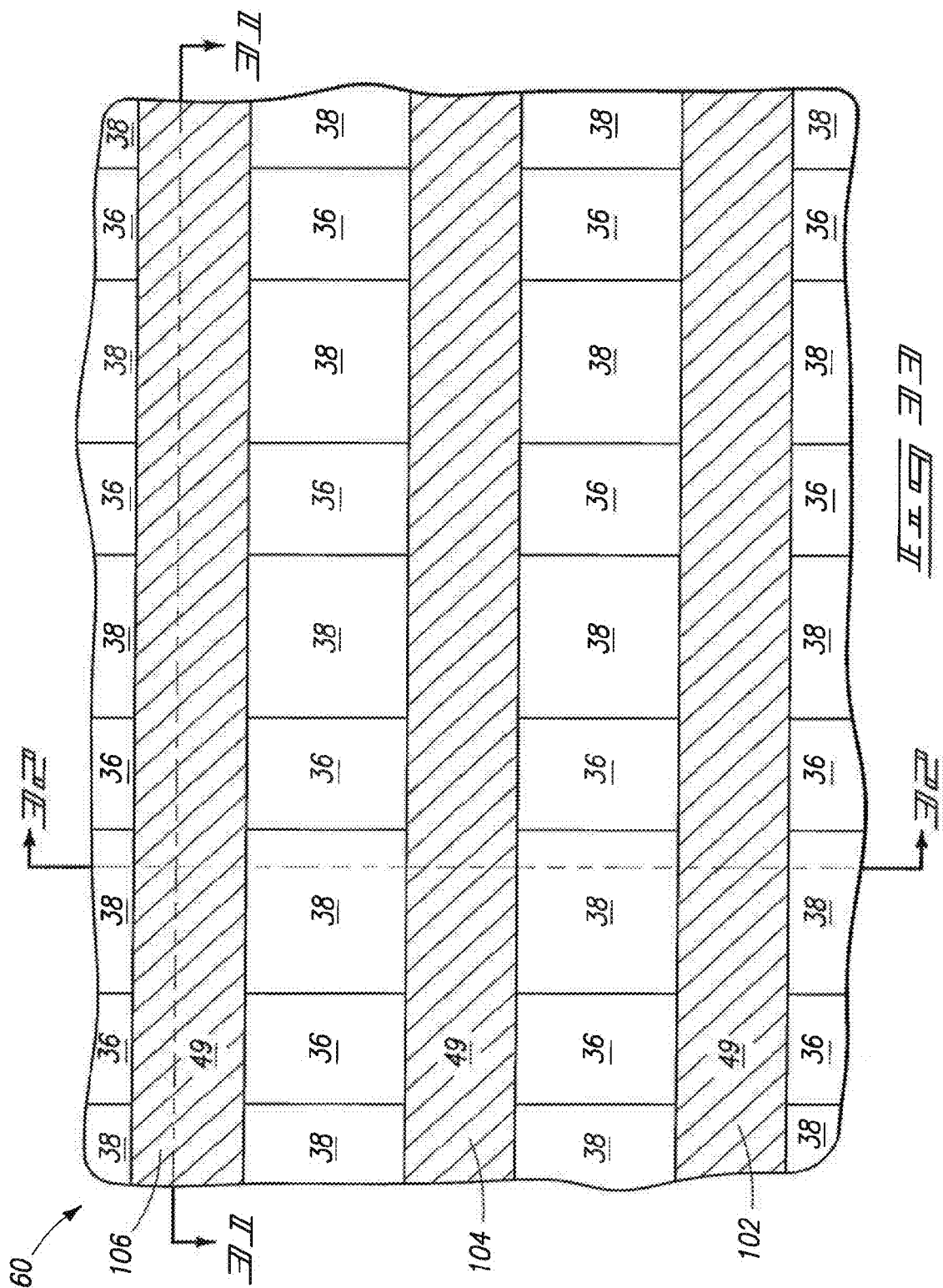

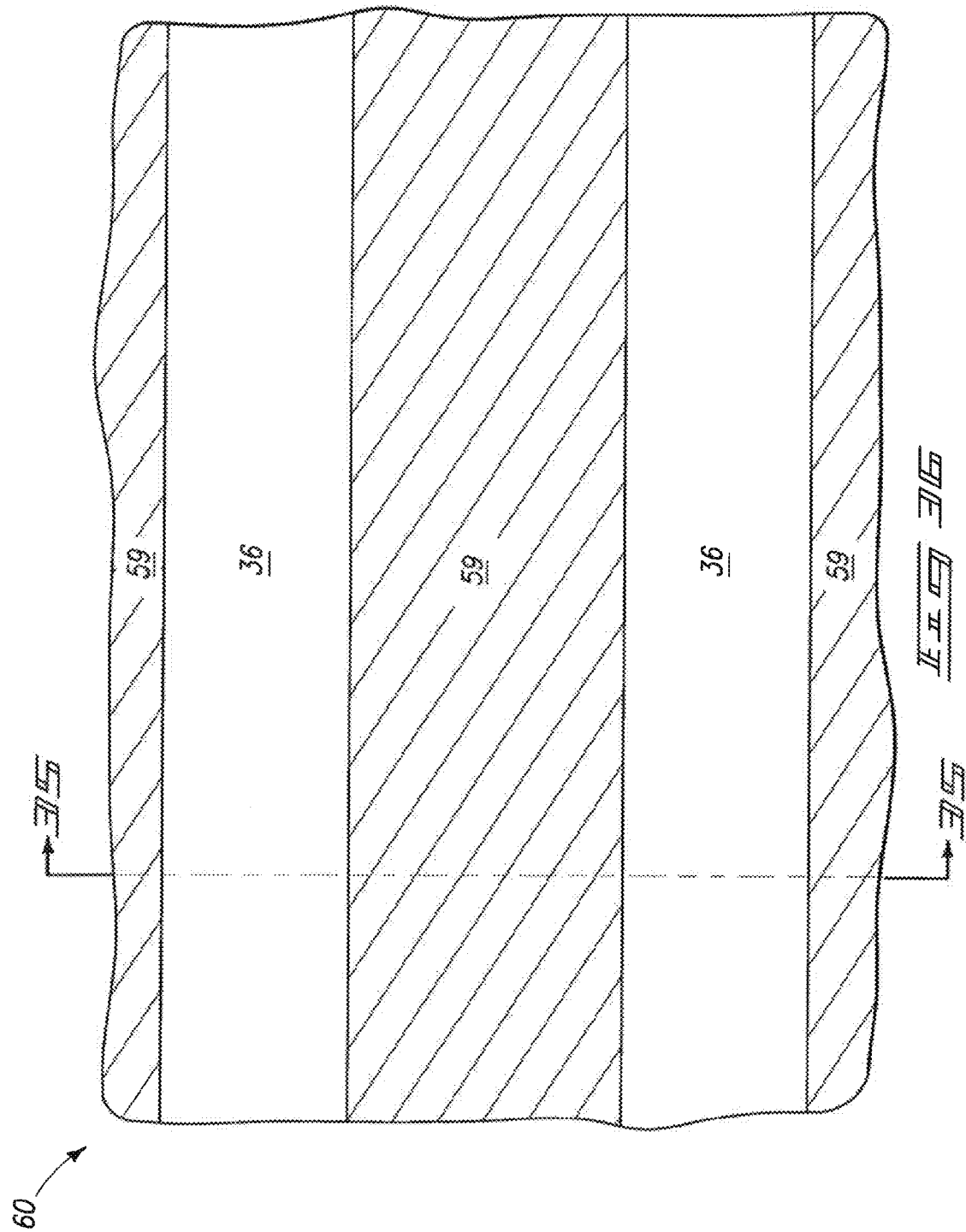

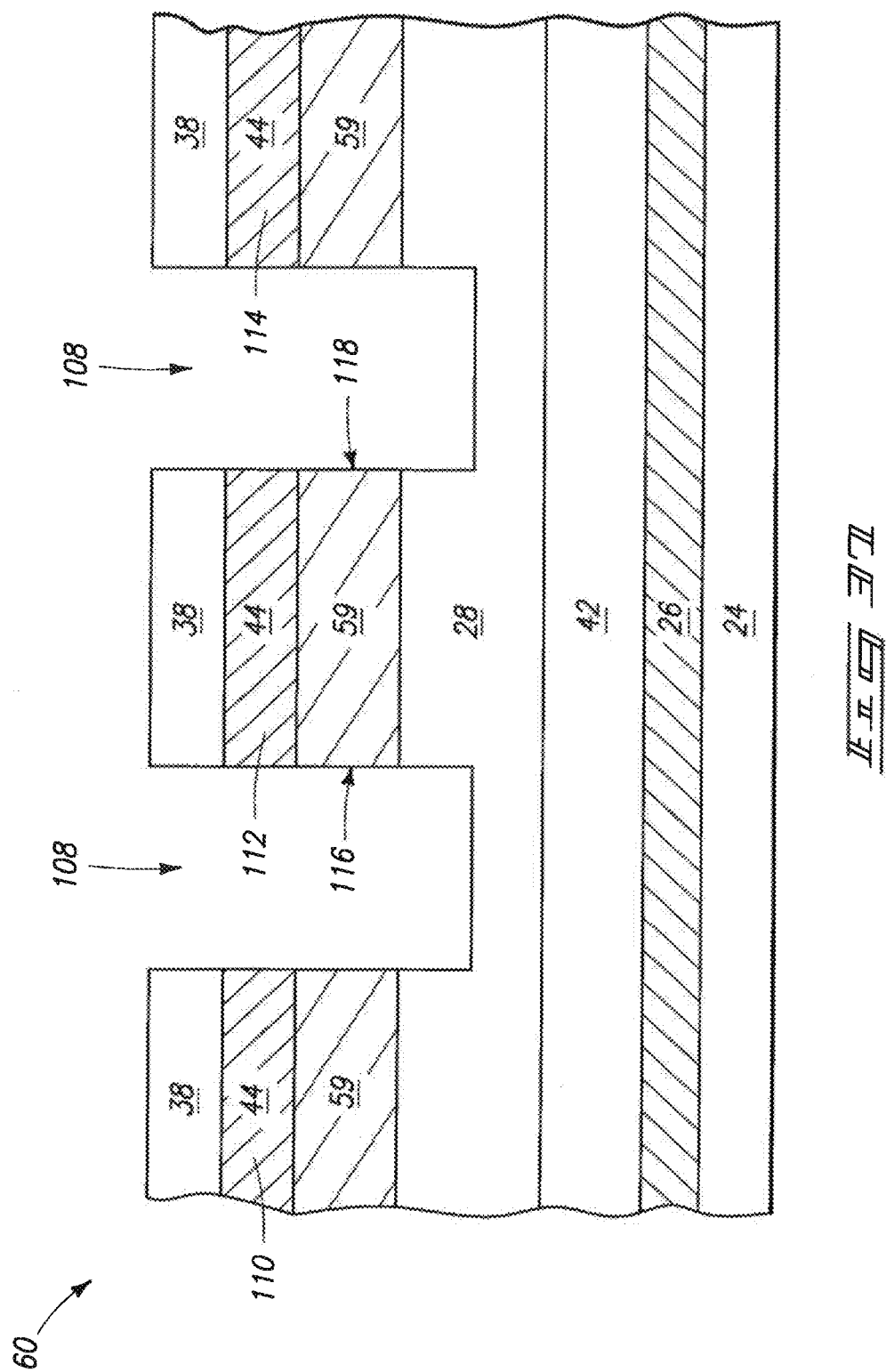

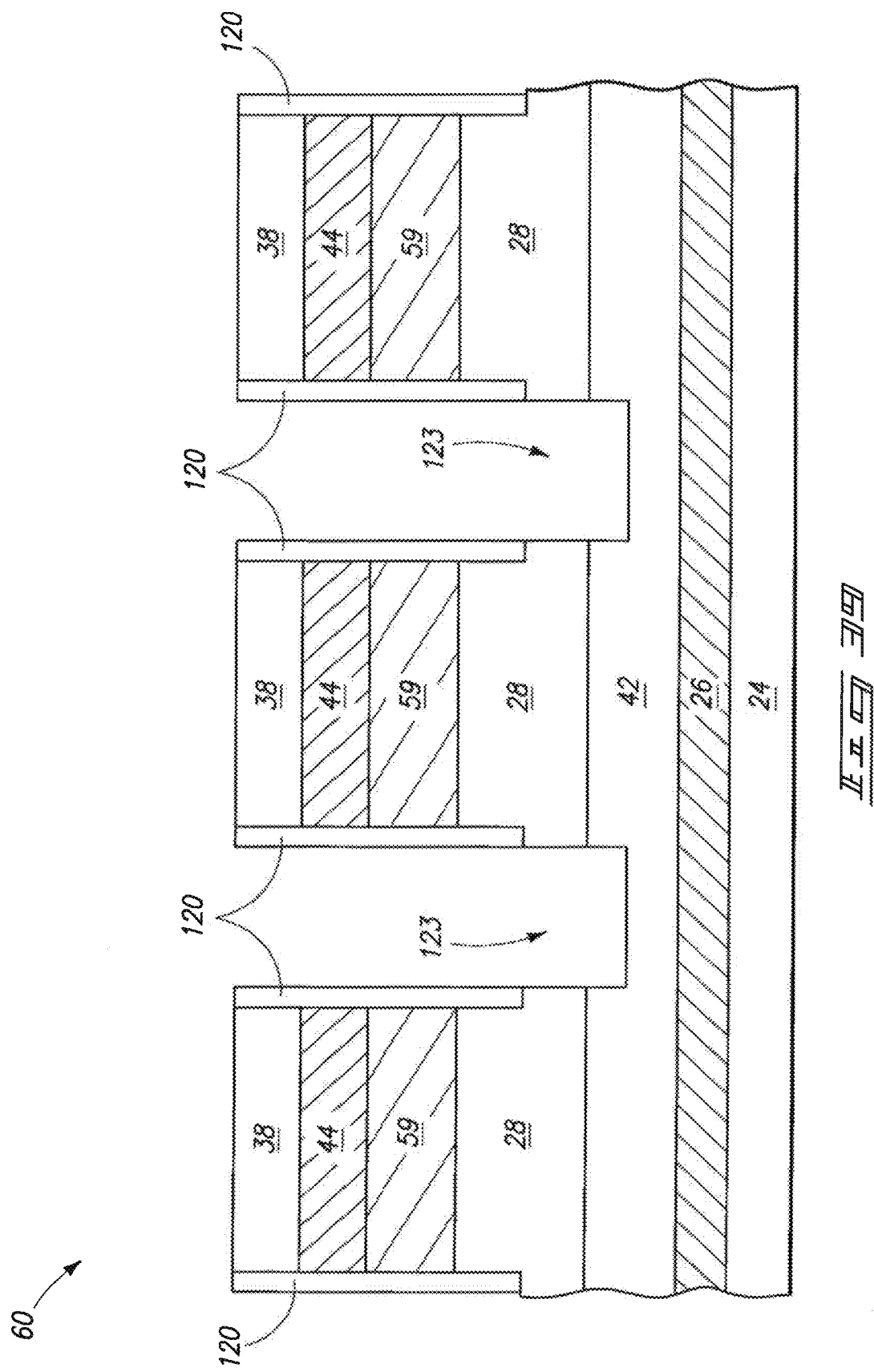

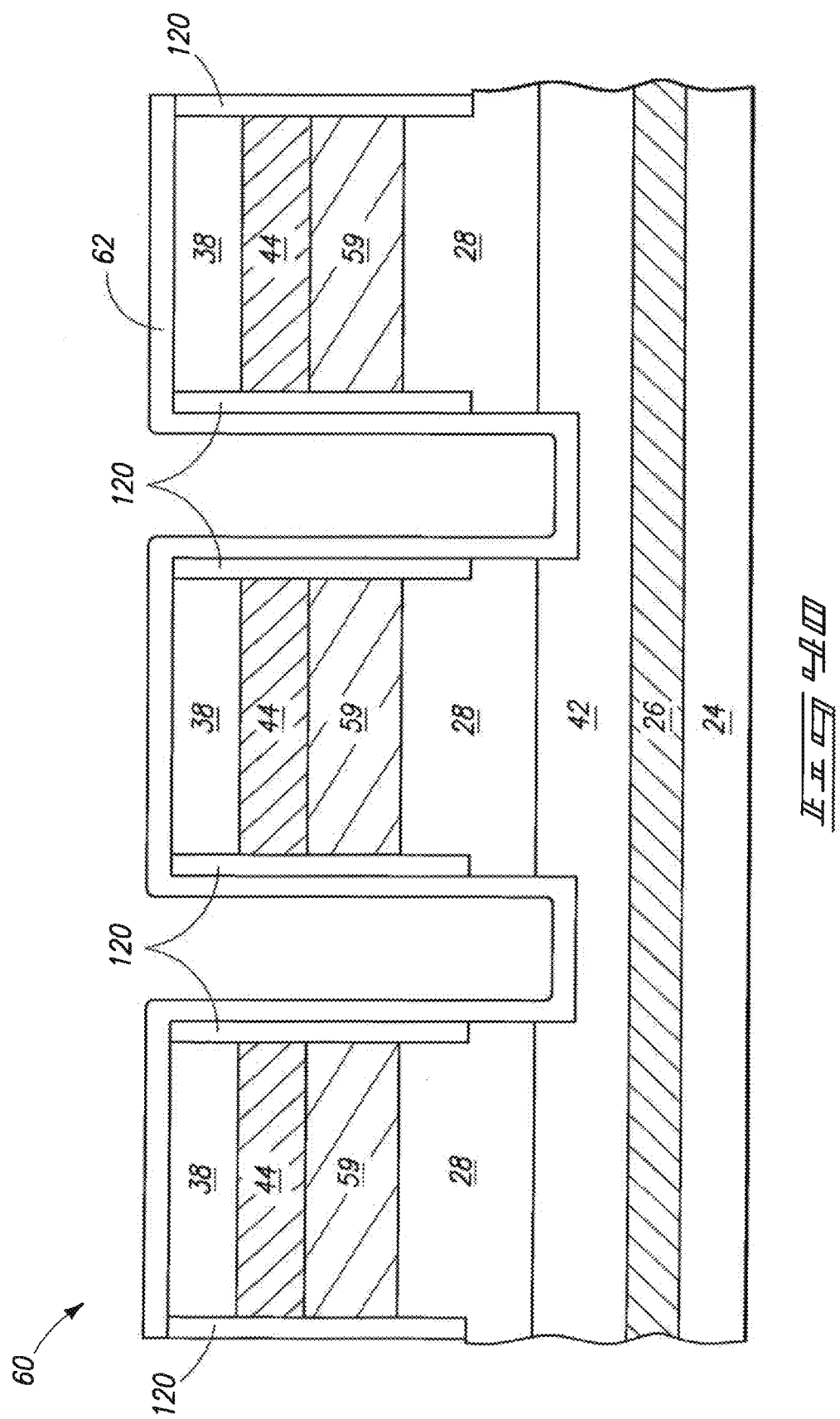

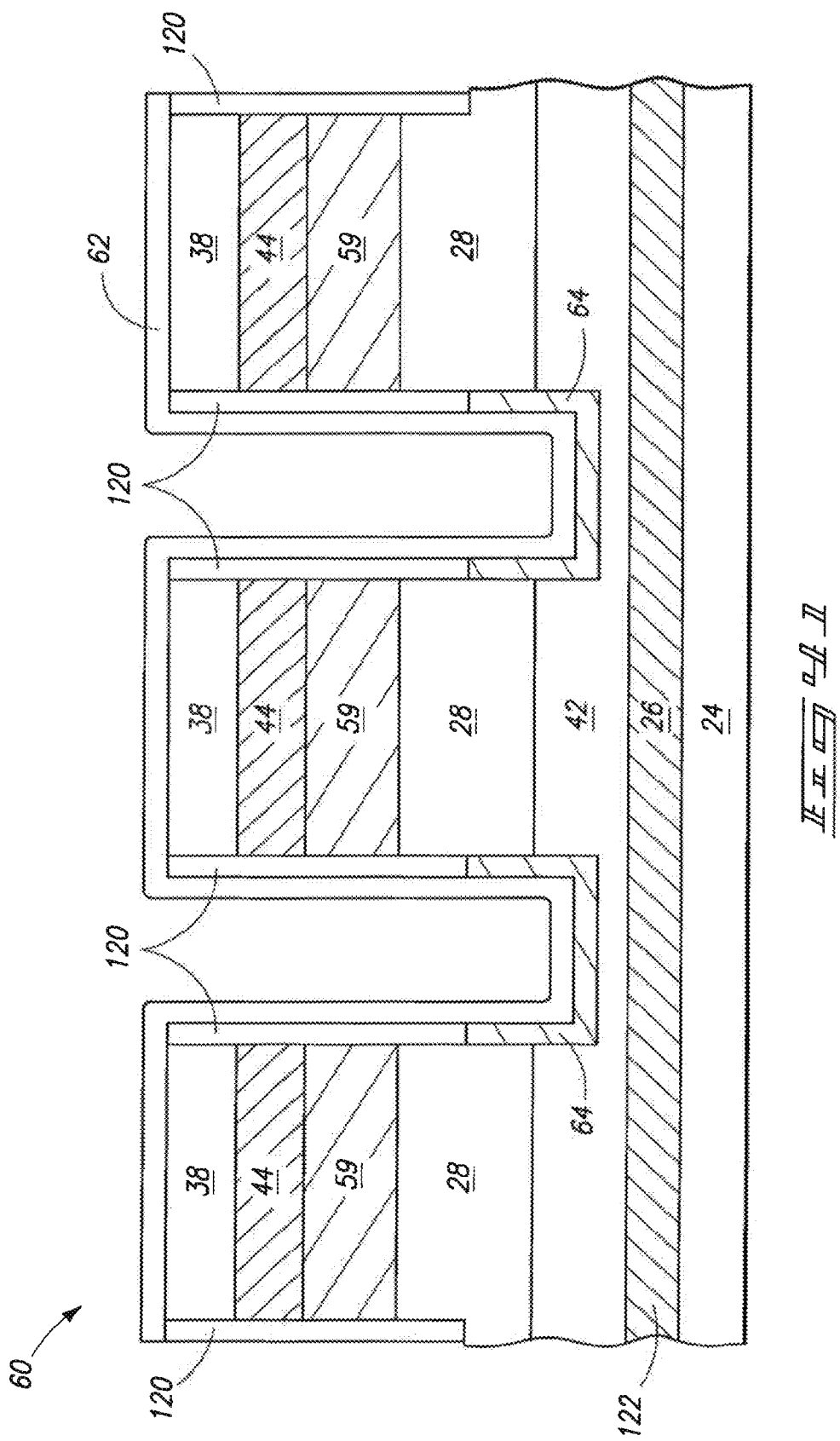

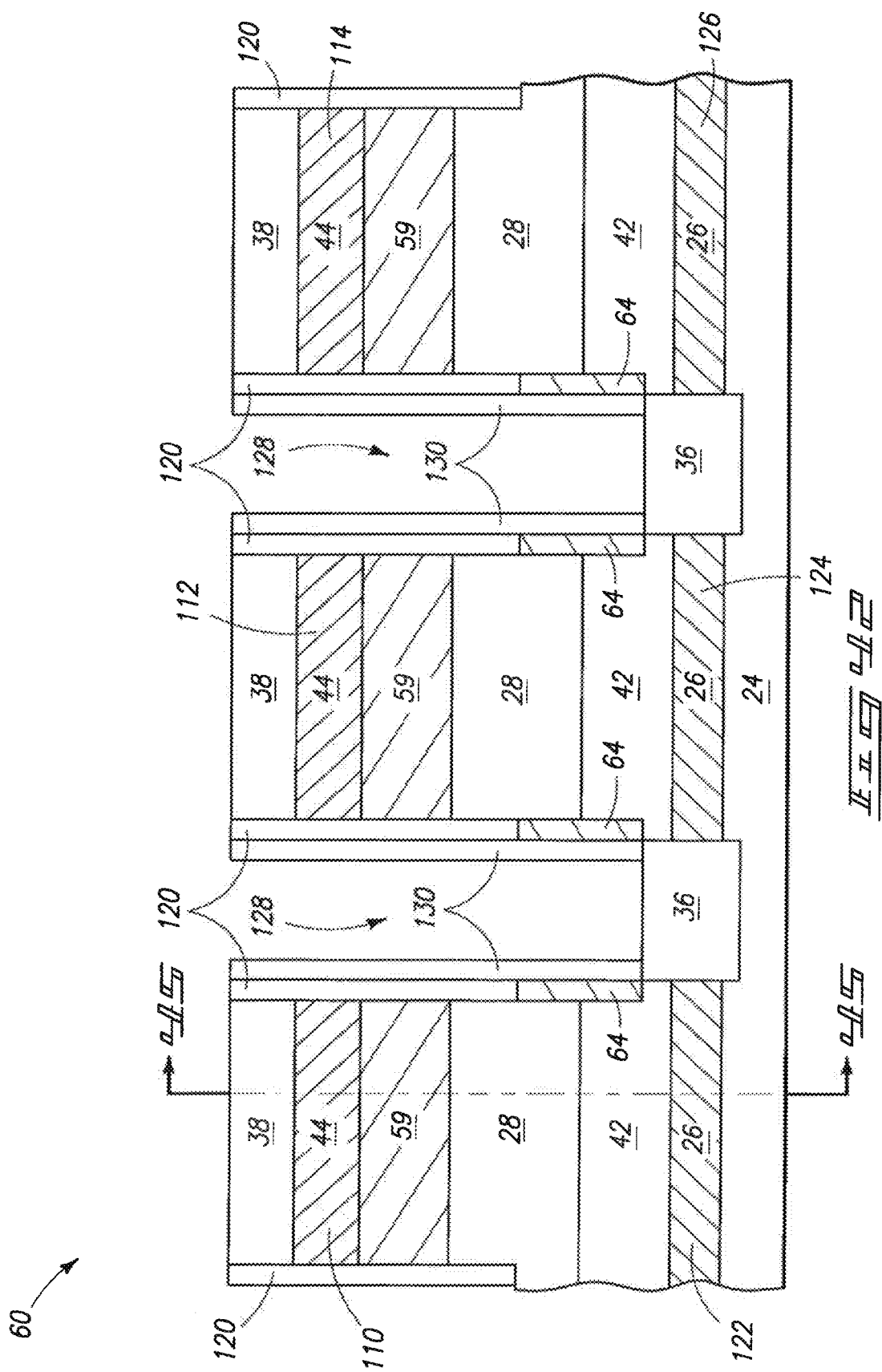

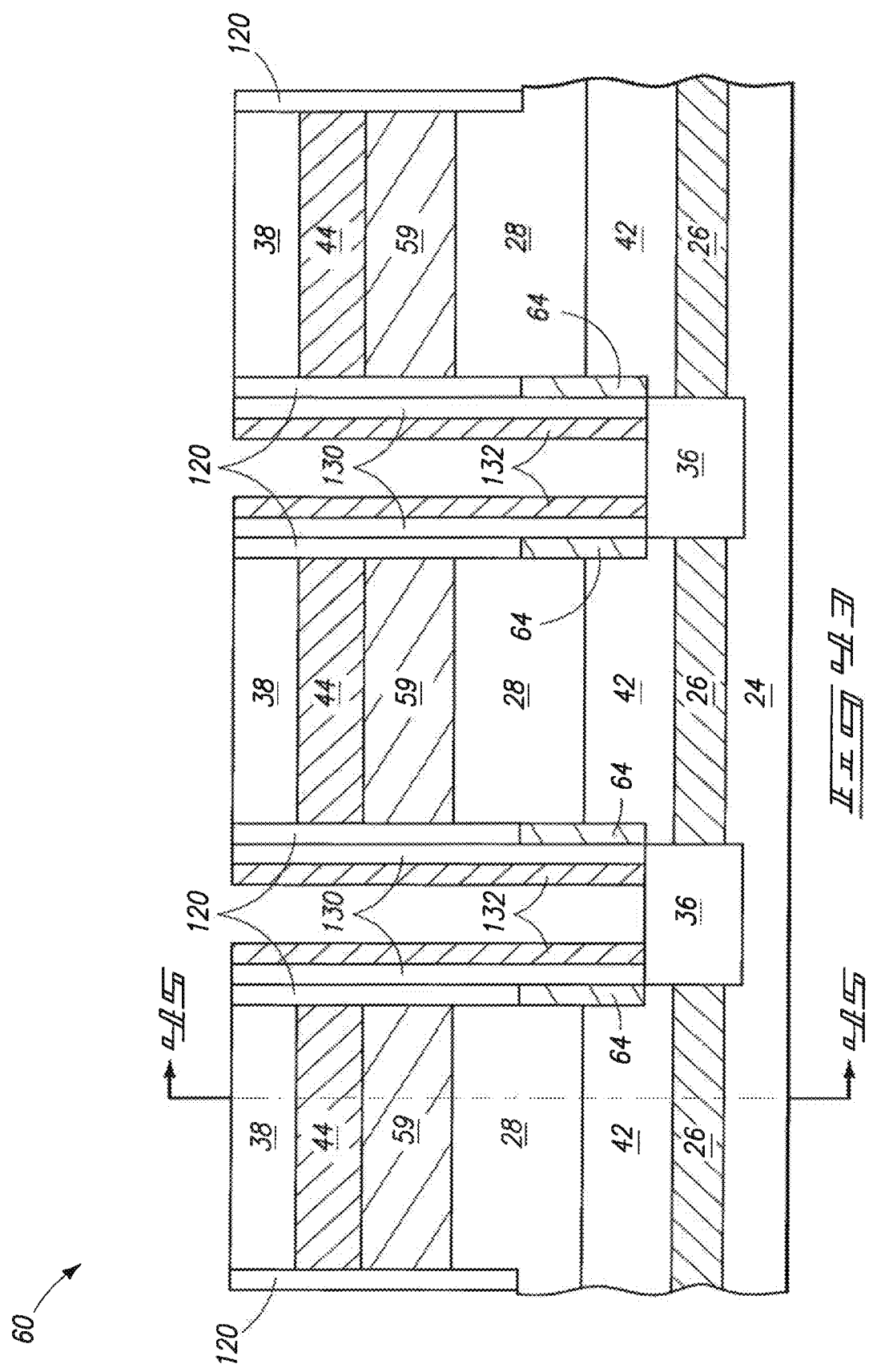

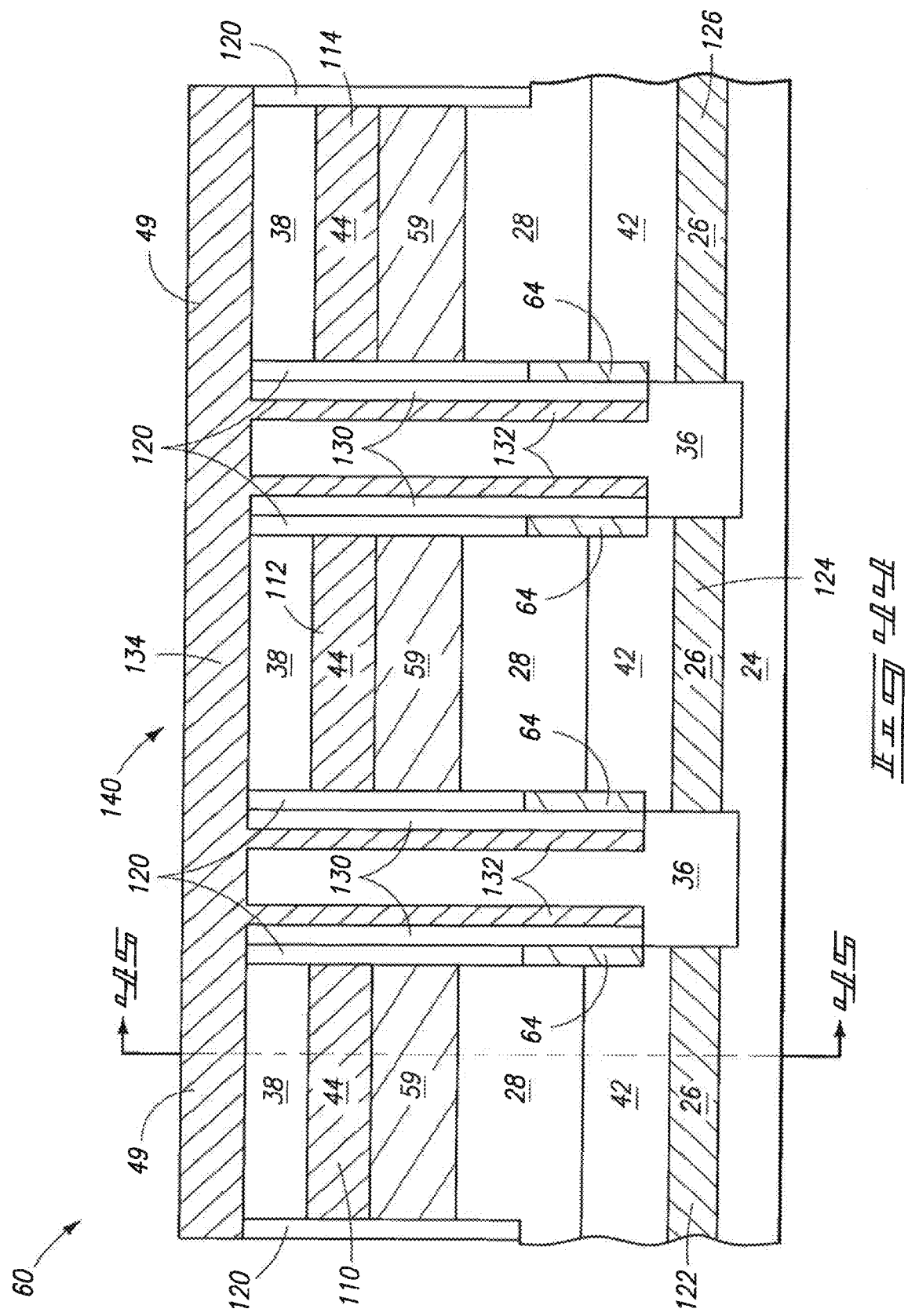

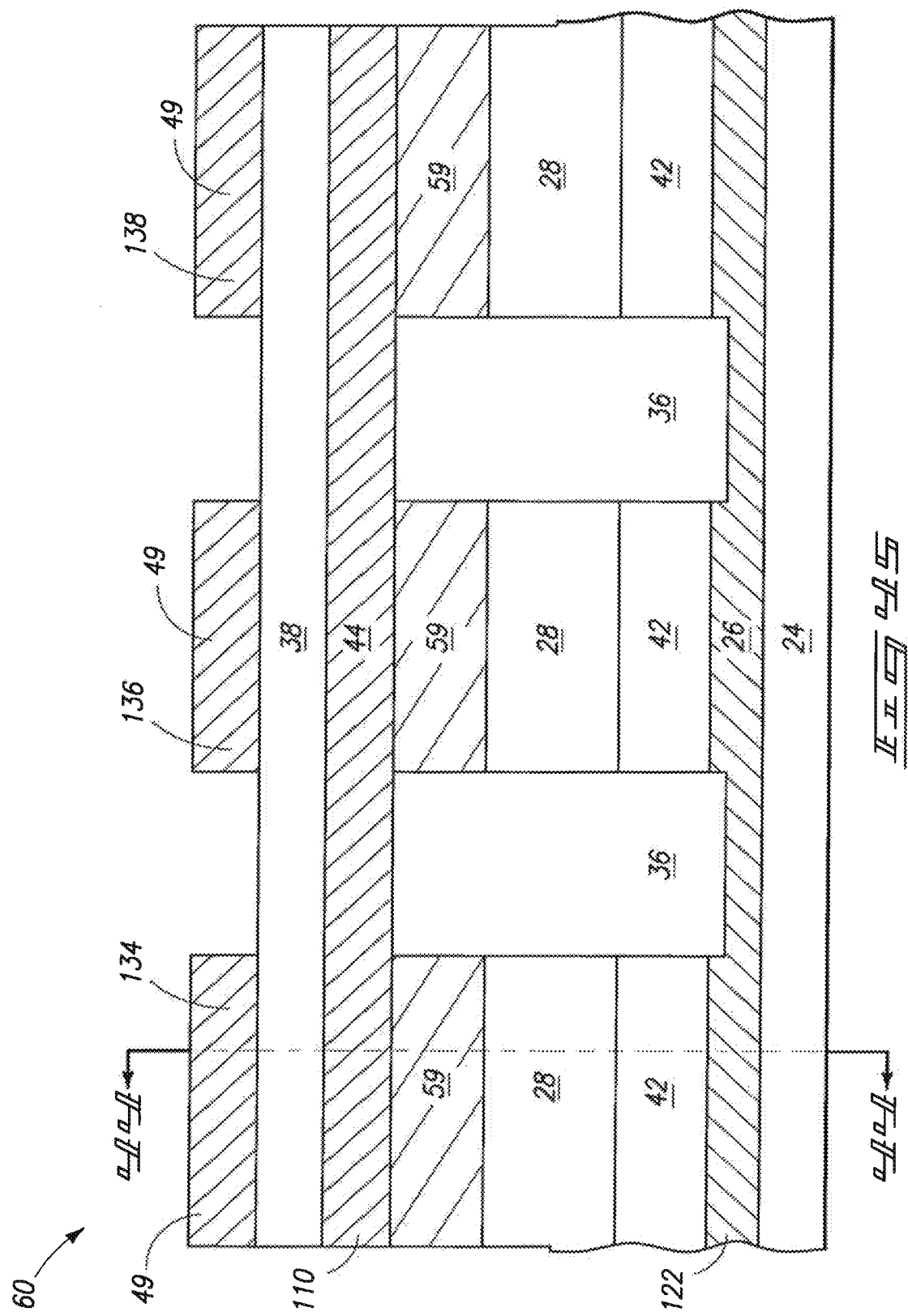

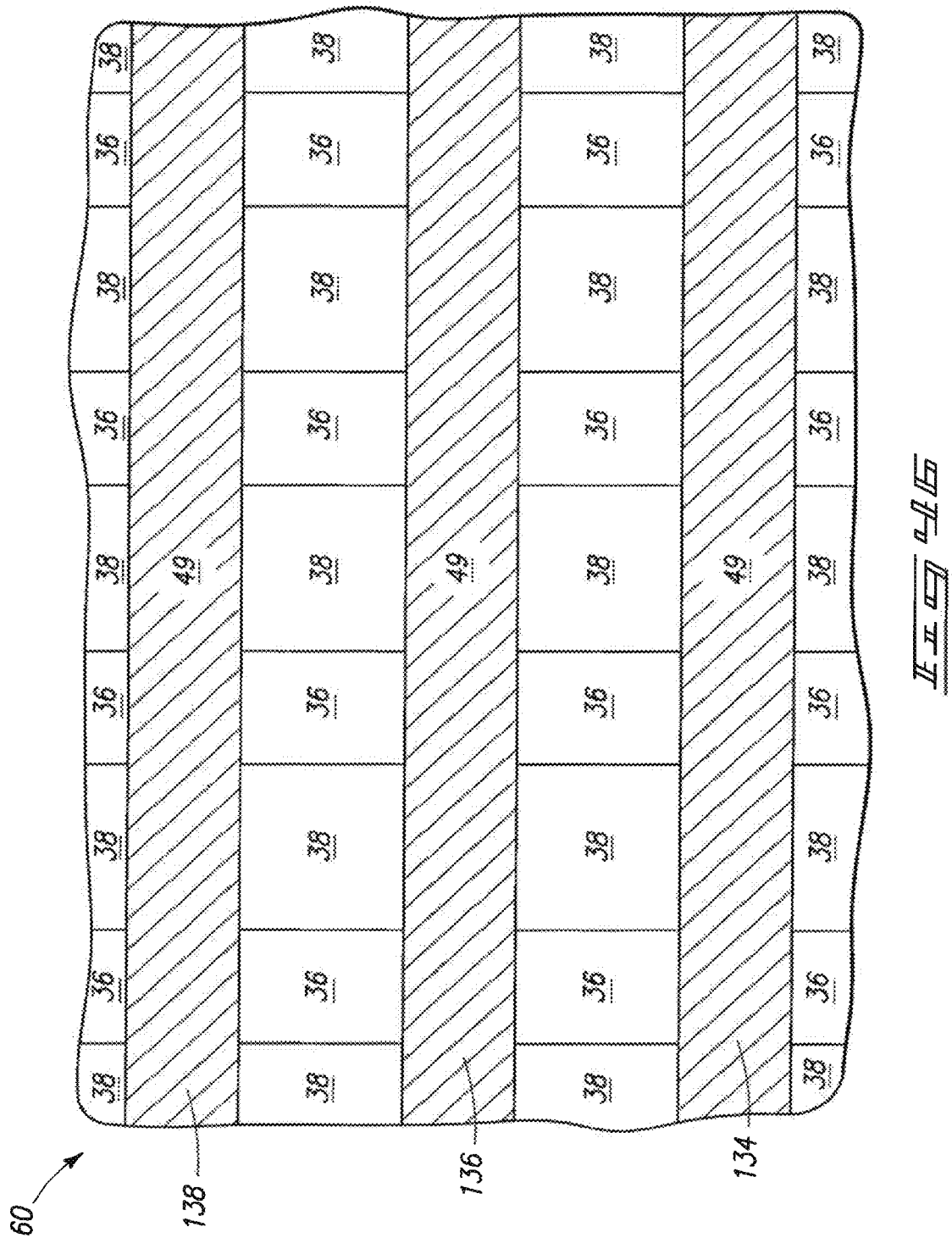

US 9,559,301 B2

METHODS OF FORMING MEMORY DEVICE CONSTRUCTIONS, METHODS OF FORMING MEMORY CELLS, AND METHODS OF FORMING SEMICONDUCTOR CONSTRUCTIONS

RELATED PATENT DATA

This patent resulted from a divisional application of U.S. patent application Ser. No. 14/680,431 which was filed on Apr. 7, 2015, which is a divisional of U.S. patent application Ser. No. 13/418,082 which was filed Mar. 12, 2012, now U.S. Pat. No. 9,111,788, which is a divisional application of U.S. patent application Ser. No. 12/141,388 filed on Jun. 18, 2008, now U.S. Pat. No. 8,134,137, each of which is hereby incorporated by reference in its entirety.

TECHNICAL FIELD

The present invention, in various embodiments, relates to memory device constructions, memory cell forming methods, and semiconductor construction forming methods.

BACKGROUND

Resistive random access memories may use a material capable of being configured in one of two different resistive states to store information. When configured in one of the resistive states, the material may have a high resistance to electrical current. In contrast, when configured in the other resistive state, the material may have a low resistance to electrical current. The resistive state in which the material is configured may be changed using electrical signals. For example, if the material is in a high-resistance state, the material may be configured to be in a low-resistance state by applying a voltage across the material.

The resistive state may be persistent. For example, once configured in a resistive state, the material may stay in the resistive state even if neither a current nor a voltage is applied to the material. Furthermore, the configuration of the material may be repeatedly changed from the high-resistance state to the low-resistance state or from the low-resistance state to the high-resistance state.

BRIEF DESCRIPTION OF THE DRAWINGS

FIGS. 2-4 are diagrammatic, cross-sectional views of a portion of a semiconductor construction at various stages of an example embodiment process for forming memory cells.

FIG. 5 is a diagrammatic top view of a portion of a semiconductor construction of an example embodiment process for forming memory cells shown at the processing stage of FIG. 4 and illustrating the location of the portion of FIG. 4 along the line 4-4.

FIGS. 7-8 are diagrammatic, cross-sectional views of a portion of a semiconductor construction at various stages of an example embodiment process for forming memory cells and illustrating the location of the portion of FIG. 6 along the line 6-6.

FIG. 9 is a diagrammatic top view of the portion of FIG. 5 shown at a processing stage subsequent to that of FIG. 5.

Figure 6:
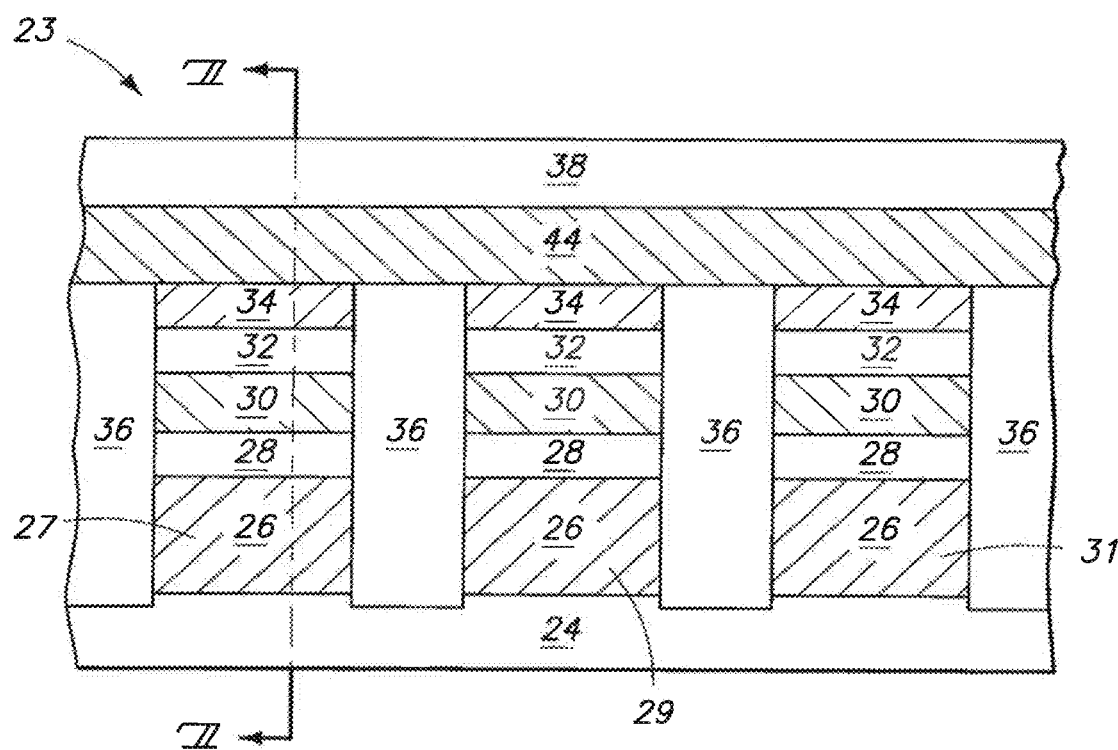
FIG. 6 is a diagrammatic, cross-sectional view of the portion of FIG. 4 shown at a processing stage subsequent to that of FIG. 4. The view of FIG. 7 is along the line 7-7 of FIG. 6.

The view of FIG. 8 is along the line 8-8 of FIG. 9 and the view of FIG. 6 is along the line 6-6 of FIG. 9.

Figure 10:
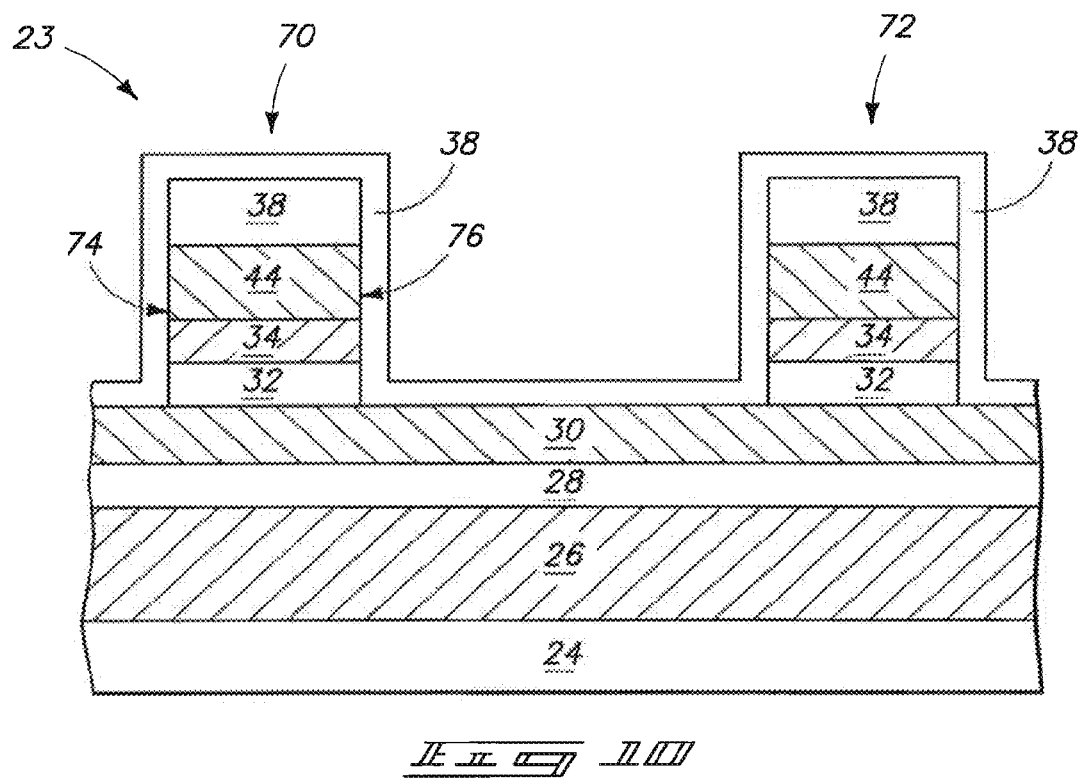
Figure 11:
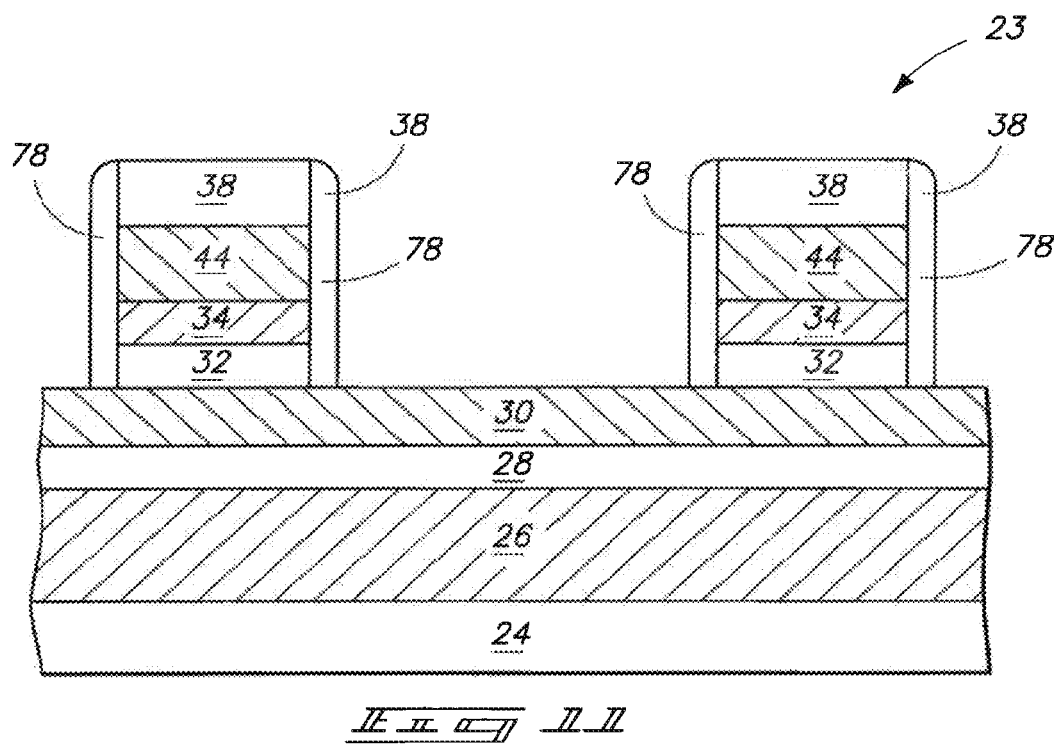

FIGS. 10-12 are diagrammatic, cross-sectional views of the portion of FIG. 8 shown at processing stages subsequent to that of FIG. 8. The view of FIG. 13 is along the line 13-13 of FIG. 12.

FIG. 13 is a diagrammatic, cross-sectional view of the portion of FIG. 6 shown at a processing stage subsequent to that of FIG. 6. The view of FIG. 12 is along the line 12-12 of FIG. 13.

Figure 14:
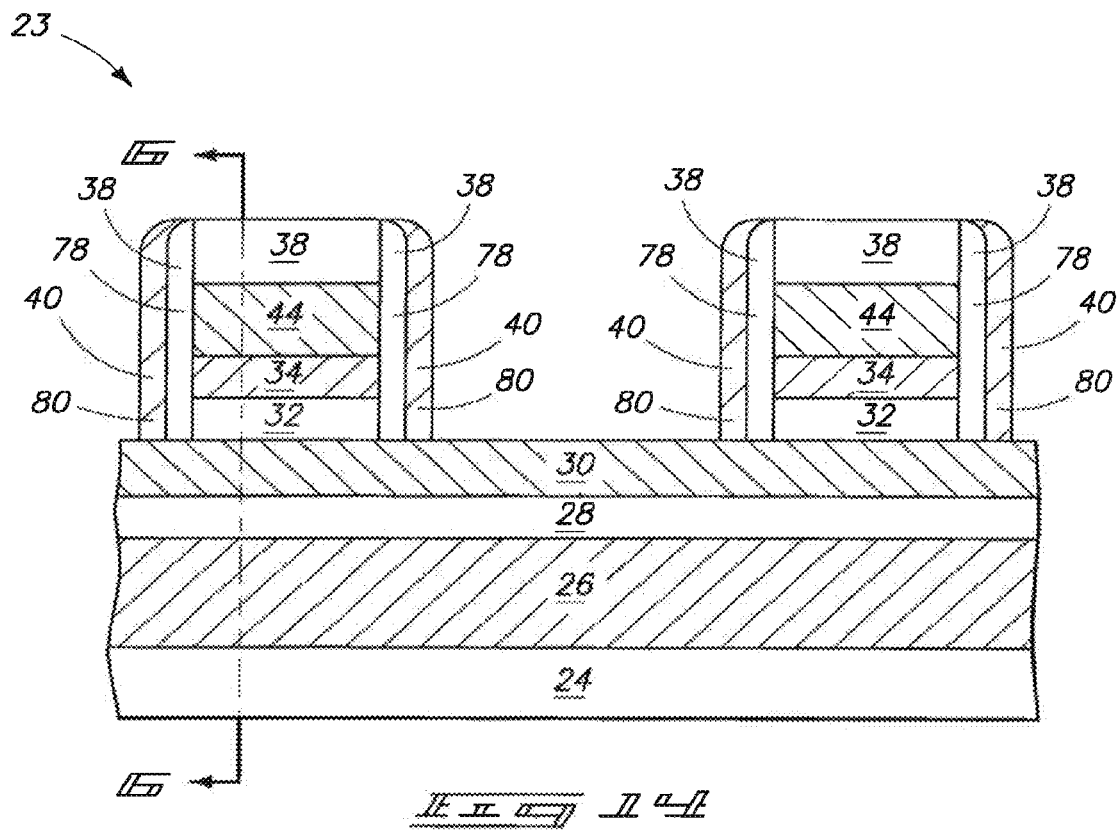
Figure 15:
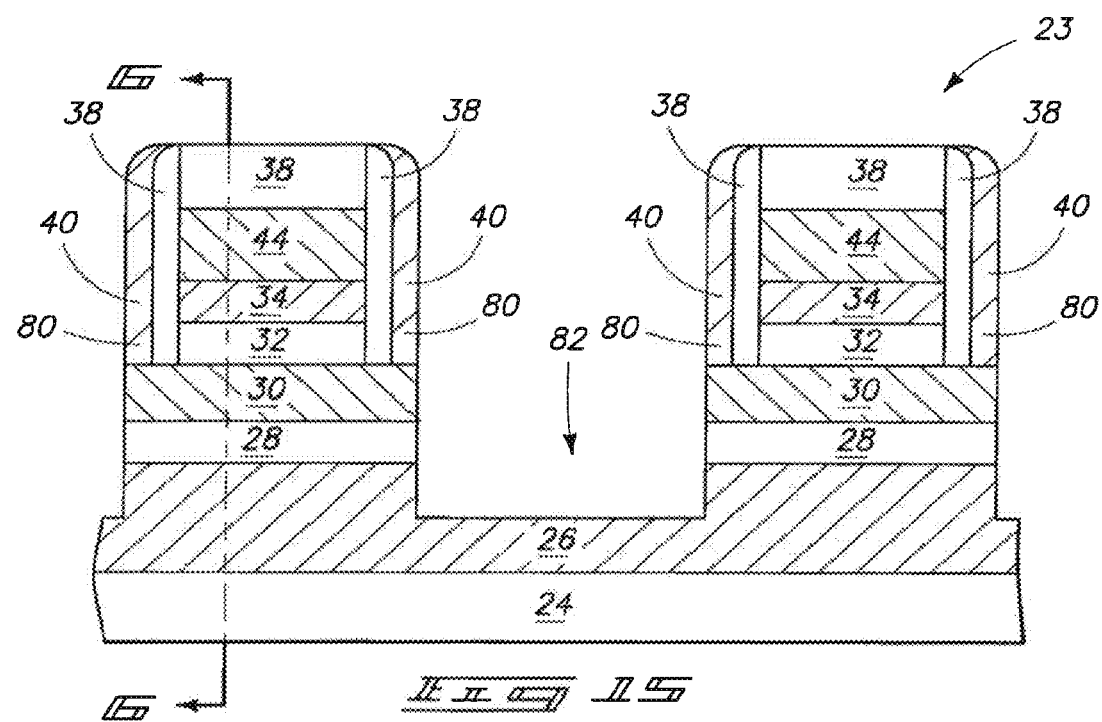

FIGS. 14-15 are diagrammatic, cross-sectional views of the portion of FIG. 12 shown at processing stages subsequent to that of FIG. 12. The view of FIG. 6 is along the lines 6-6 of FIGS. 14-15.

FIG. 16 is a diagrammatic top view of the portion of FIG. 9 shown at a processing stage subsequent to that of FIG. 9. The view of FIG. 15 is along the line 15-15 of FIG. 16 and the view of FIG. 6 is along the line 6-6 of FIG. 16.

FIG. 17 is a diagrammatic, cross-sectional view of the portion of FIG. 15 shown at a processing stage subsequent to that of FIG. 15. The view of FIG. 18 is along the line 18-18 of FIG. 17.

Figure 18:
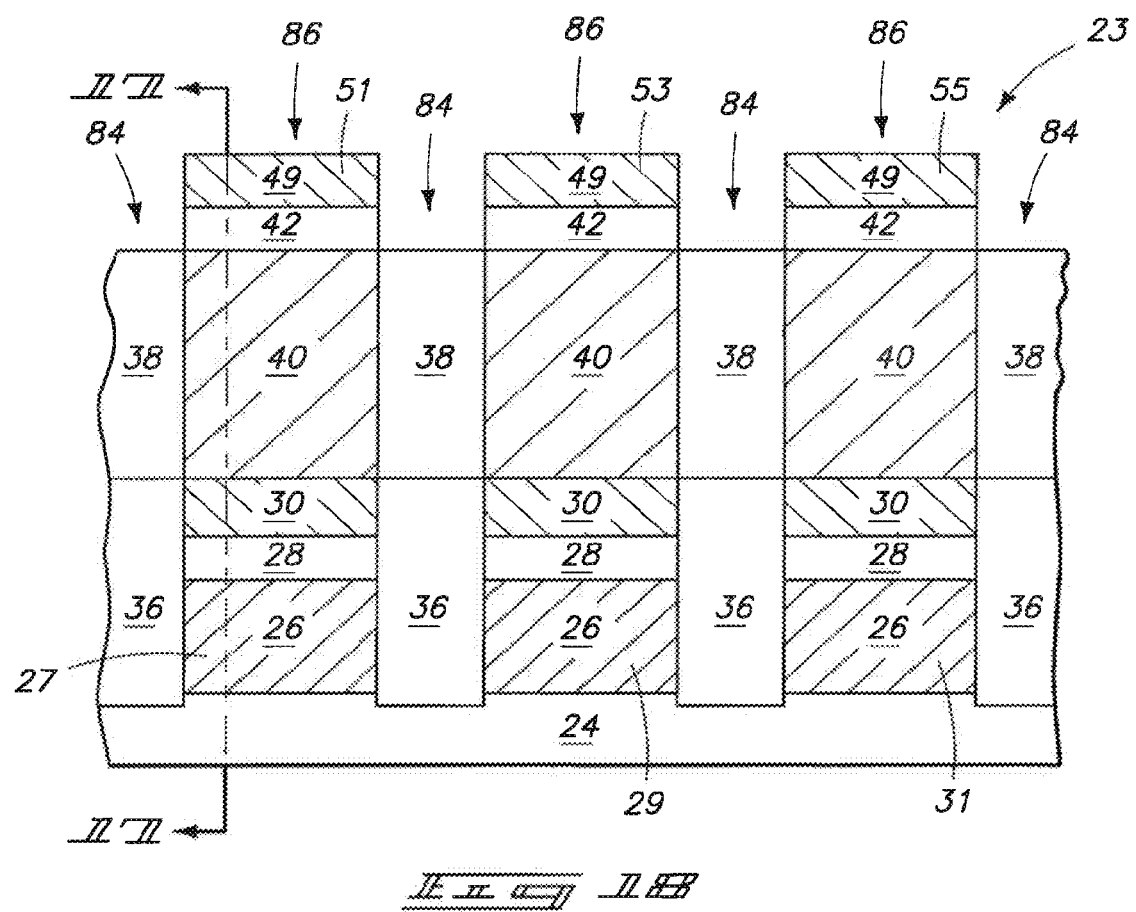

FIG. 18 is a diagrammatic, cross-sectional view of the portion of FIG. 13 shown at a processing stage subsequent to that of FIG. 13. The view of FIG. 17 is along the line 17-17 of FIG. 18.

FIG. 19 is a diagrammatic top view of the portion of FIG. 16 shown at a processing stage subsequent to that of FIG. 16. The view of FIG. 17 is along the line 17-17 of FIG. 19 and the view of FIG. 18 is along the line 18-18 of FIG. 19.

Figure 20:
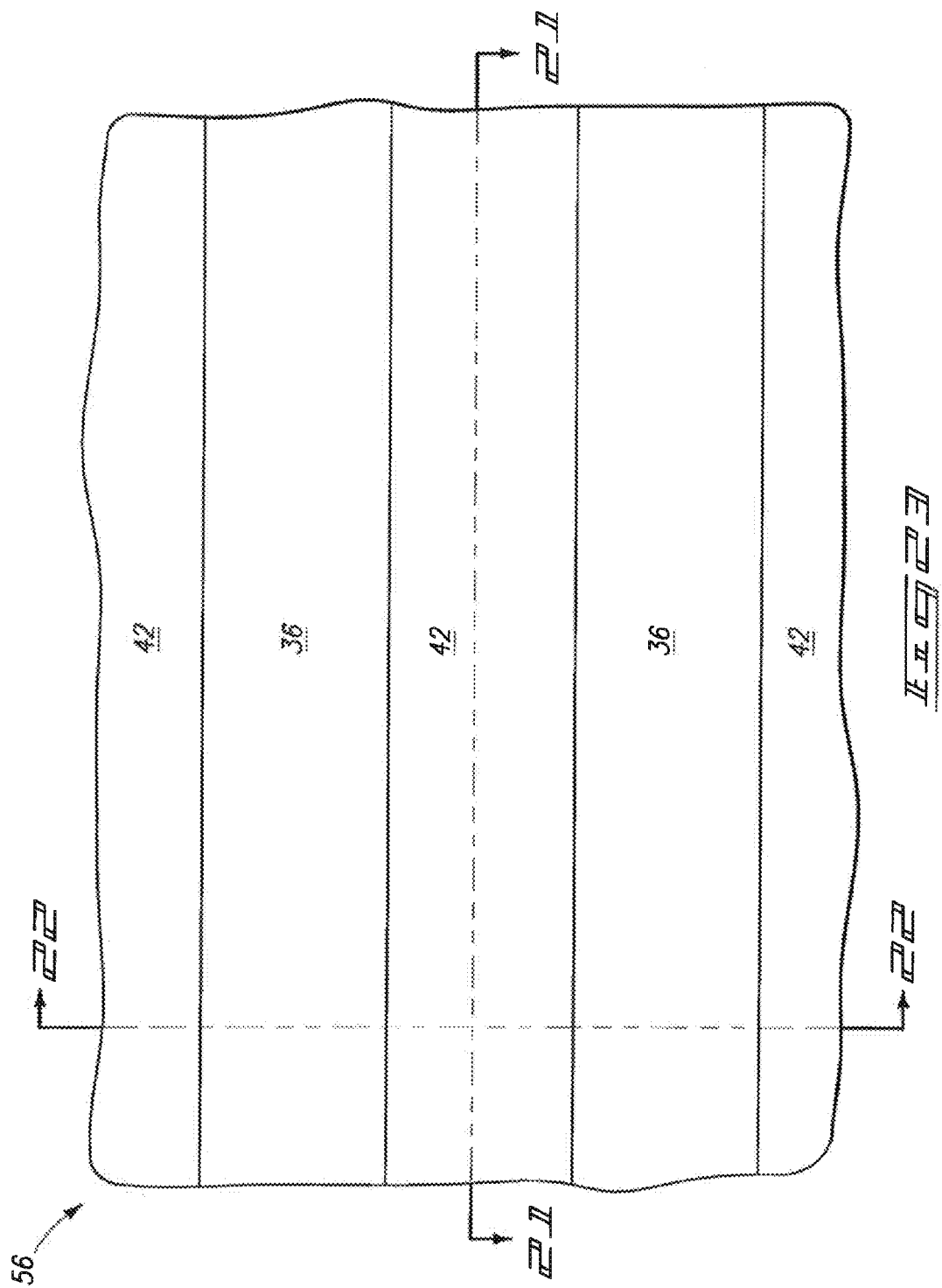

FIG. 20 is a diagrammatic, cross-sectional view of a portion of a semiconductor construction of an example embodiment process for forming memory cells.

Figure 22:
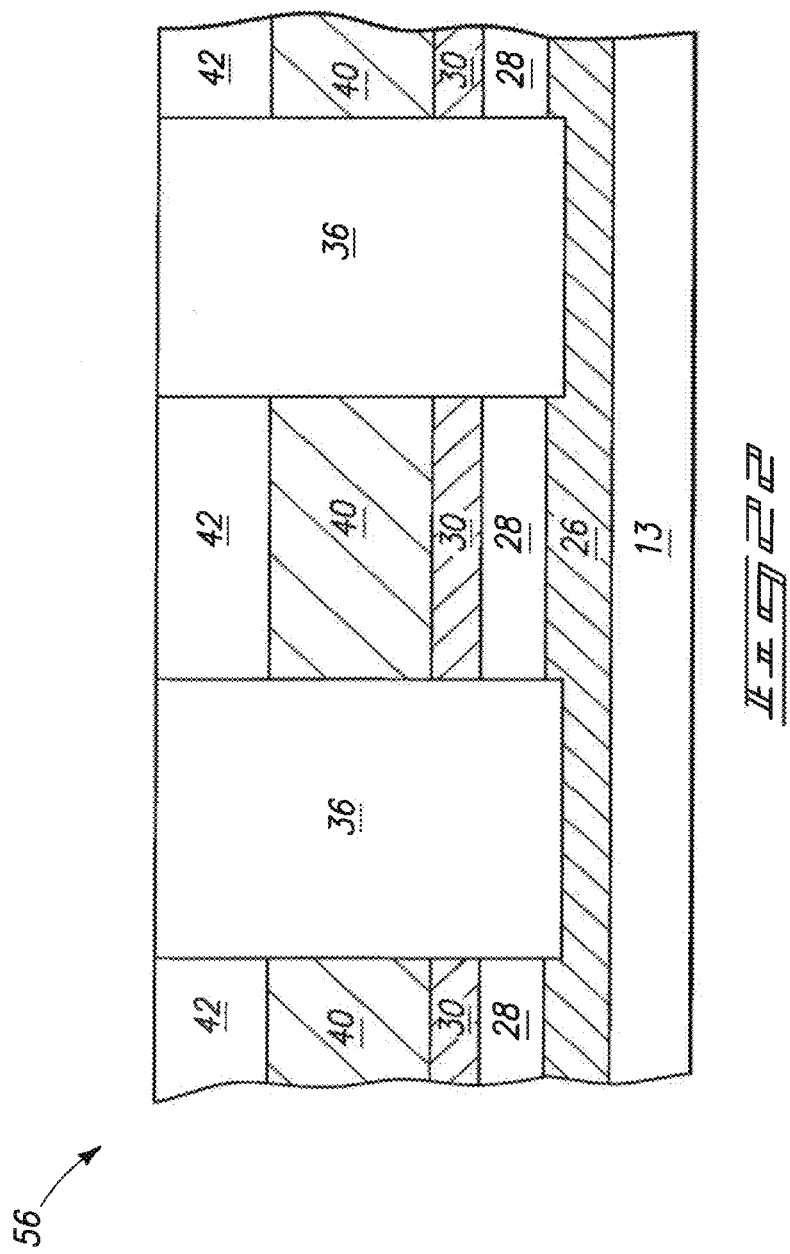

FIGS. 21-22 are diagrammatic, cross-sectional views of a portion of a semiconductor construction at various stages of an example embodiment process for forming memory cells.

FIG. 23 is a diagrammatic top view of a portion of a semiconductor construction of an example embodiment process for forming memory cells shown at the processing stage of FIG. 22 and illustrating the location of the portion of FIG. 22 along the line 22-22. The view of FIG. 21 is along the line 21-21 of FIG. 23.

FIGS. 24-27 are diagrammatic, cross-sectional views of a portion of a semiconductor construction at various stages of an example embodiment process for forming memory cells.

FIG. 28 is a diagrammatic, cross-sectional view of the portion of FIG. 22 shown at a processing stage subsequent to that of FIG. 22. The view of FIG. 27 is along the line 27-27 of FIG. 28.

FIG. 29 is a diagrammatic, cross-sectional view of the portion of FIG. 27 shown at a processing stage subsequent to that of FIG. 27.

FIG. 30 is a diagrammatic top view of the portion of FIG. 23 shown at a processing stage subsequent to that of FIG. 23. The view of FIG. 28 is along the line 28-28 of FIG. 30 and the view of FIG. 29 is along the line 29-29 of FIG. 30.

FIG. 31 is a diagrammatic, cross-sectional view of the portion of FIG. 29 shown at a processing stage subsequent to that of FIG. 29. The view of FIG. 32 is along the line 32-32 of FIG. 31.

FIG. 32 is a diagrammatic, cross-sectional view of the portion of FIG. 28 shown at a processing stage subsequent to that of FIG. 28.

FIG. 33 is a diagrammatic top view of the portion of FIG. 30 shown at a processing stage subsequent to that of FIG. 30. The view of FIG. 31 is along the line 31-31 of FIG. 33 and the view of FIG. 32 is along the line 32-32 of FIG. 33.

Figure 35:
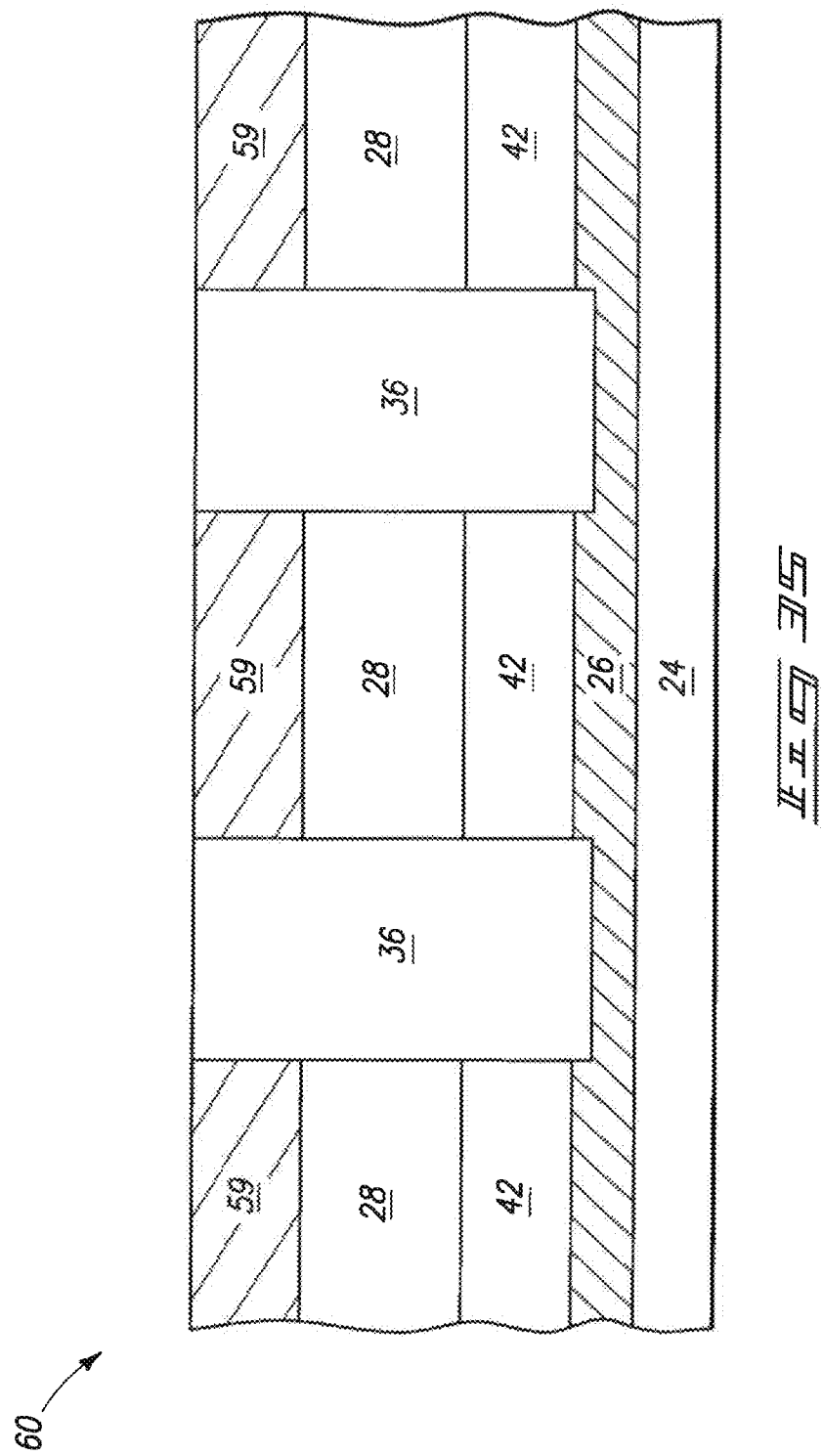

FIGS. 34-35 are diagrammatic, cross-sectional views of a portion of a semiconductor construction at various stages of an example embodiment process for forming memory cells.

FIG. 36 is a diagrammatic top view of a portion of a semiconductor construction of an example embodiment process for forming memory cells. FIG. 36 illustrates the location of the portion of FIG. 35 along the line 35-35.

FIGS. 37-44 are diagrammatic, cross-sectional views of a portion of a semiconductor construction at various stages of an example embodiment process for forming memory cells. The view of FIG. 45 is along the line 45-45 of FIGS. 42-44.

FIG. 45 is a diagrammatic, cross-sectional view of the portion of FIG. 35 shown at a processing stage subsequent to that of FIG. 35. The view of FIG. 44 is along the line 44-44 of FIG. 45.

FIG. 46 is a diagrammatic top view of the portion of FIG. 36 shown at a processing stage subsequent to that of FIG. 36.

DETAILED DESCRIPTION OF EXAMPLE EMBODIMENTS

Random access memories may use resistive states of a memory element to store one or more bits of information. For example, a memory element capable of being configured in either a high-resistance state or a low-resistance state may store one bit of information by associating a bit value of "1" with the low-resistance state and a bit value of "0" with the high-resistance state. Alternatively, a bit value of "1" may be associated with the high-resistance state and a bit value of "0" may be associated with the low-resistance state.

The memory element may include a bipolar memory material. A positive voltage applied across the bipolar memory material may change the configuration of the bipolar memory material from a high-resistance state to a low-resistance state. Furthermore, a negative voltage applied across the bipolar memory material may change the configuration of the bipolar memory material from a low-resistance state to a high-resistance state.

Alternatively, a negative voltage applied across the bipolar memory material may change the configuration of the bipolar memory material from a high-resistance state to a low-resistance state and a positive voltage applied across the bipolar memory material may change the configuration of the bipolar memory material from a low-resistance state to a high-resistance. Accordingly, a bipolar memory material may be configured in a first resistive state using a voltage having a first polarity and may be configured in a second resistive state using a voltage having a polarity opposite that of the first polarity.

Examples of bipolar memory material include ionic conducting chalcogenides, binary metal oxides, perovskite oxides, colossal magnetoresistives, and polymers. Example ionic conducting chalcogenides that may be used as bipolar memory material include GeS, GeSe and Ag or Cu-doped GeS and GeSe. Example binary metal oxides that may be used as bipolar memory material include HfOx, Nb2O5, Al2O3, WOx, Ta2O5, TiOx, ZrOx, CuxO, and NixO. Example ionic perovskite oxides that may be used as bipolar memory material include doped or undoped SrTiO3, SrZrO3, BaTiO3.

Example colossal magnetoresistives that may be used as bipolar memory material include Pr1-xCaxMnO3 (PCMO), La1-xCaxMnO3 (LCMO), and Ba1-xSrxTiO3. Example polymers that may be used as bipolar memory material include Bengala Rose, AlQ3Ag, Cu-TCNQ, DDQ, TAPA, and fluorescine-based polymers. Of course, other materials may be used as bipolar memory material. The materials listed above are provided by way of example rather than as an exhaustive list of bipolar memory material.

In some cases, once configured in a high-resistance state, a memory element may remain in the high-resistance state as long as a voltage greater than or equal to a turn-on voltage is not applied to the memory element. The memory element may remain in the high-resistance state even if no voltage is applied to the memory element. Accordingly, the high-resistance state of the memory element may be described as non-volatile since the high-resistance state might not change over time as long as a voltage greater than or equal to the turn-on voltage is not applied to the memory element.

Similarly, in some cases, once configured in the low-resistance state, the memory element may remain in the low-resistance state as long as a voltage less than or equal to the turn-off voltage is not applied to the memory element. In fact, the memory element may remain in the low-resistance state even if no voltage is applied to the memory element. Accordingly, the low-resistance state of the memory element may also be described as non-volatile since the low-resistance state might not change over time as long as a voltage less than or equal to the turn-off voltage is not applied to the memory element.

Since the high-resistance state and the low-resistance state may be non-volatile, the memory element may be used to store one bit information. For example, a memory element may represent a bit value of "0" when configured in the high-resistance state and may represent a bit value of "1" when configured in the low-resistance state. Furthermore, the resistive state of the memory element may be repeatedly changed over time. Accordingly, the memory element may be in the high-resistance state representing a bit value of "0" at one moment in time and the memory element may be in a low-resistance state representing a bit value of "1" at another moment in time. Similarly, the representation of a bit value with resistance states can be the opposite of that described above.

Figure 1:
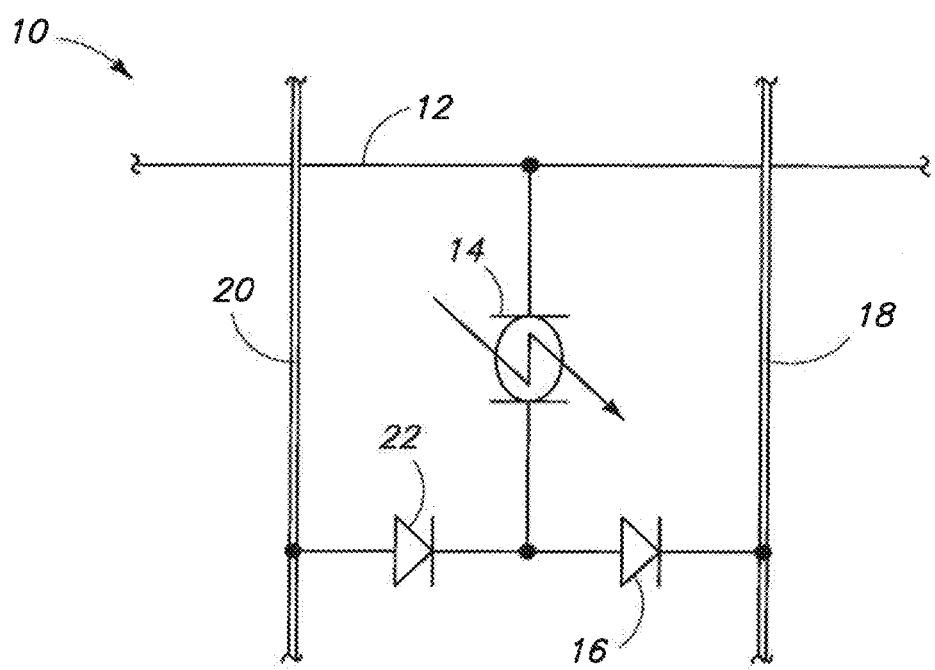
FIG. 1 is a schematic diagram of a memory device.

Referring to FIG. 1, a memory cell 10 is illustrated. Memory cell 10 includes a memory element 14, which may comprise a bipolar memory material such as one or more of the bipolar memory materials discussed above. Memory cell 10 also includes a row line (e.g., a wordline) 12, two column lines (e.g., bitlines) 18 and 20, and two diodes 16 and 22.

Column line 20 may be selectively electrically connected to memory element 14. For example, when diode 22 is forward biased (e.g., forward biased beyond a cut-in voltage of diode 22), diode 22 may conduct current from column line 20 to memory element 14, thereby electrically connecting column line 20 to memory element 14. In contrast, when diode 22 is not forward biased (e.g., when diode 22 is reverse biased), diode 22 may hinder current from flowing from memory element 14 to column line 20 or from column line 20 to memory element 14 so that memory element 14 is not electrically connected to column line 20.

Similarly, column line 18 may be selectively electrically connected to memory element 14. For example, when diode 16 is forward biased (e.g., forward biased beyond a cut-in voltage of diode 16), diode 16 may conduct current from memory element 14 to column line 18 thereby electrically connecting memory element 14 to column line 18. In contrast, when diode 16 is not forward biased (e.g., when diode 16 is reverse biased), diode 16 may hinder current from flowing from column line 18 to memory element 14 or from memory element 14 to column line 18 so that memory element 14 is not electrically connected to column line 18.

Memory cell 10 may store a bit of information via a resistive state of memory element 14. In one configuration, the bit may have a value of "0" or a value of "1." For example, according to one convention, if memory element 14 is in a high-resistance state, the value of the bit stored by memory cell 10 may be "0" and if memory element 14 is in a low-resistance state, the value of the bit stored by memory cell 10 may be "1." Of course, a convention in which a high-resistance state represents a bit value of "1" and a low-resistance state represents a bit value of "0" may alternatively be used.

A read operation may be used to determine a value of a bit stored by memory cell 10. According to one read operation, a first positive voltage may be applied between row line 12 and column line 18 so that row line 12 is at a higher potential than column line 18 and so that diode 16 is forward biased. The first positive voltage may be greater than a cut-in voltage of diode 16 but less than a sum of the cut-in voltage of diode 16 and the turn-off voltage of memory element 14 so that the resistive state of memory element 14 is not altered. A second positive voltage may be simultaneously applied between row line 12 and column line 20 so that row line 12 is at a higher potential than column line 20 and so that diode 22 is reverse biased. The second voltage may be lower than a breakdown voltage of diode 22. In some cases, the first voltage and the second voltage may be substantially the same voltage.

If memory element 14 is configured in a low-resistance state, current may flow from row line 12 through memory element 14 and forward-biased diode 16 to column line 18. Based on the current, a memory device comprising memory cell 10 may determine that memory element 14 is in a low-resistance state and therefore the value stored by memory cell 10 is a "1." For example, the memory device may compare the current on column line 18 with a reference current or the memory device may use the current on column line 18 to create a voltage and may then compare the voltage with a reference voltage.

In contrast, if memory element 14 is configured in a high-resistance state, memory element 14 may hinder current from flowing from row line 12 through memory element 14 and forward-biased diode 16 to column line 18. Alternatively, memory element 14 may restrict an amount of current flowing from row line 12 through memory element 14 and forward-biased diode 16 to column line 18 to a negligible amount of current that may be clearly distinguished from an amount of current allowed to flow when memory element 14 is in the low-resistance state. Based on the lack of current, or the very small amount of current, the memory device comprising memory cell 10 may determine that memory element 14 is in the high-resistance state and therefore the value stored by memory cell 10 is a "0."

Another method of reading memory cell 10 may alternatively be used. According to this method, a first positive voltage may be applied between column line 20 and row line 12 so that column line 20 is at a higher potential than row line 12 and so that diode 22 is forward biased. The first positive voltage may be greater than the cut-in voltage of diode 22 but less than a sum of the cut-in voltage of diode 22 and the turn-on voltage of memory element 14 so that the resistive state of memory element 14 is not altered. A second positive voltage may simultaneously be applied between column line 18 and row line 12 so that column line 18 is at a higher potential than row line 12 and so that diode 16 is reverse biased. The second voltage may be lower than a breakdown voltage of diode 16. In some cases, the first voltage and the second voltage may be substantially the same voltage.

If memory element 14 is configured in a low-resistance state, current may flow from column line 20 through forward-biased diode 22 and memory element 14 to row line 12. Based on the current on row line 12, a memory device comprising memory cell 10 may determine that memory element 14 is in a low-resistance state and therefore the value stored by memory cell 10 is a "1."

In contrast, if memory element 14 is configured in a high-resistance state, memory element 14 may hinder current from flowing from column line 20 through forward-biased diode 22 and memory element 14 to row line 12. Alternatively, memory element 14 may restrict an amount of current flowing from column line 20 through forward-biased diode 22 and memory element 14 to row line 12 to a negligible amount that may be clearly distinguished from an amount of current allowed to flow when memory element 14 is in the low-resistance state. Based on the lack of current, or the very small amount of current, the memory device comprising memory cell 10 may determine that memory element 14 is in the high-resistance state and therefore the value stored by memory cell 10 is a "0."

In addition to reading a bit value from memory cell 10, a bit value may be written to memory cell 10. To write a bit value of "1" to memory cell 10, a first positive voltage may be applied between column line 20 and row line 12 so that column line 20 is at a higher potential than row line 12 and so that diode 22 is forward biased. The first positive voltage may be greater than a sum of the cut-in voltage of diode 22 and the turn-on voltage of memory element 14. If memory element 14 is in a high-resistance state, the first voltage (or a current resulting from the first voltage) may re-configure memory element 14 to be in a low-resistance state. If memory element 14 is already in a low-resistance state, memory element 14 may remain in the low-resistance state. Consequently, due to the first voltage, memory element 14 may be configured in a low-resistance state corresponding with a bit value of "1."

A second positive voltage may be applied simultaneously with the first voltage. The second positive voltage may be applied between column line 18 and row line 12 so that column line 18 is at a higher potential than row line 12 and so that diode 16 is reverse biased. The second voltage may hinder current from flowing from column line 20 to column line 18. The second voltage may be lower than a breakdown voltage of diode 16.

The first voltage may result from a first voltage pulse and the second voltage may result from a second voltage pulse. In some cases, the first voltage and the second voltage may be substantially the same voltage.

Alternatively, a bit value of "0" may be written to memory cell 10. To write a bit value of "0" to memory cell 10, a first positive voltage may be applied between row line 12 and column line 18 so that row line 12 is at a higher potential than column line 18 and so that diode 16 is forward biased. The first positive voltage may be greater than a sum of the cut-in voltage of diode 16 and the turn-off voltage of memory element 14. If memory element 14 is in a low-resistance state, the first voltage (or a current resulting from the first voltage) may re-configure memory element 14 to be in a high-resistance state. If memory element 14 is already in a high-resistance state, memory element 14 may remain in the high-resistance state. Consequently, due to the first voltage, memory element 14 may be configured in a high-resistance state corresponding with a bit value of "0."

A second positive voltage may be applied simultaneously with the first voltage. The second positive voltage may be applied between row line 12 and column line 20 so that row line 12 is at a higher potential than column line 20 and so that diode 22 is reverse biased. The second voltage may hinder current from flowing from column line 18 to column line 20. The second voltage may be lower than a breakdown voltage of diode 22.

The first voltage may result from a first voltage pulse and the second voltage may result from a second voltage pulse. In some cases, the first voltage and the second voltage may be substantially the same voltage.

The methods of writing a "0" and writing a "1" to memory cell 10 may be repeatedly used so that memory cell 10 stores different bit values over time. In some cases, memory element 14 may be re-written using these methods millions of times without damaging memory element 14. Since memory element 14 may remain in a resistive state without a voltage or current being applied to memory element 14 as was discussed above, memory element 14 may be said to preserve a bit value in a non-volatile manner. Accordingly, memory cell 10 may store a bit of information without having to be frequently refreshed or memory cell 10 may be refreshed at a rate lower than a rate used to refresh a volatile memory cell.

The above discussion has assumed that memory element 14 is configured so that memory element 14 changes to a low-resistance state when a first voltage greater than the turn-on voltage of memory element 14 is applied across memory element 14. The first voltage may have a first polarity. Similarly, the above discussion has assumed that memory element 14 changes to a high-resistance state when a second voltage greater than the turn-off voltage of memory element 14 is applied across memory element 14. The second voltage may have a second polarity opposite that of the first polarity.

However, memory element 14 may be reversed so that memory element 14 changes to a high-resistance state when a voltage greater than the turn-off voltage of memory element 14 and having the first polarity is applied across memory element 14. In this configuration, memory element 14 may change to a low-resistance state when a voltage greater than the turn-on voltage of memory element 14 and having the second polarity is applied across memory element 14.

Furthermore, the above discussion has assumed that a high-resistance state of memory element 14 corresponds to a bit value of "0" and that a low-resistance state of memory element 14 corresponds to a bit value of "1." However, as was mentioned above, memory devices may be constructed based on an understanding that the high-resistance state of memory element 14 corresponds to a bit value of "1" and that the low-resistance state of memory element 14 corresponds to a bit value of "0" without changing the principles of writing and reading memory cell 10.

The above discussion has referred to a memory element having a high resistance state and a low resistance state. However, in some embodiments, a memory element may be configurable in more than two different resistive states. Such a memory element may store more than one bit of information and may be used in a memory cell such as memory cell 10. Each of a plurality of different programming voltages may correspond to a different one of a plurality of different resistive states of the memory element.

The methods of programming memory cell 10 described above may be adapted to program a memory element having more than one resistive state by applying one of the plurality of programming voltages to the memory element in order to configure the memory element in the resistive state corresponding to the applied programming voltage. Furthermore, the methods of reading memory cell 10 described above may be adapted to read the memory element by comparing a current resulting from a voltage applied to the memory element to a plurality of different reference currents to determine in which of the plurality of different resistive states the memory cell is configured.

Example embodiments of memory cells are described below with reference to FIGS. 2-46.

Figure 2:
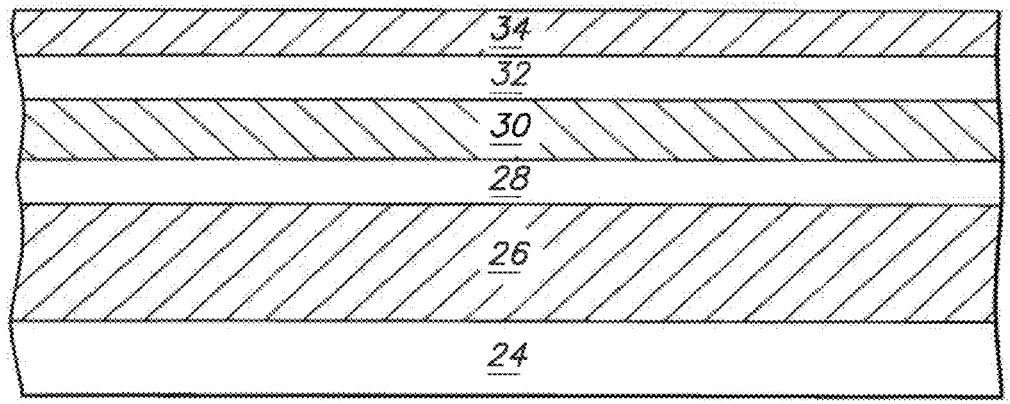

Referring to FIG. 2, a semiconductor construction 23 is illustrated at a process stage. At this process stage, construction 23 includes a substrate 24, and in ascending order from substrate 24, an electrically conductive material 26, a semiconductor material 28, a metal material 30, a memory material 32, and a conductive material 34.

Substrate 24 may comprise one or more of various semiconductor materials, such as silicon and germanium. Substrate 24 can, for example, comprise, consist essentially of, or consist of monocrystalline silicon doped with background p-type dopant at a concentration of less than $10^{16}$ atoms/cm$^3$. To aid in interpretation of the claims that follow, the terms "semiconductive substrate," "semiconductor construction," and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure including, but not limited to, the semiconductive substrates described above. In some embodiments, substrate 24 may be an insulative material.

Electrically conductive material 26 may comprise any suitable composition, and may, for example, comprise, consist essentially of, or consist of silicon conductively doped with either n-type dopant or p-type dopant. In some embodiments, conductive material 26 may be silicon having a dopant concentration of $10^{19}$ atoms/cm$^3$ or higher.

Semiconductor material 28 may comprise any suitable composition, and may, for example, comprise, consist essentially of, or consist of silicon lightly doped with either n-type dopant or p-type dopant. As used herein, the term "lightly doped" refers to a material doped with a dopant at a concentration of between $10^{16}$ and $10^{19}$ atoms/cm$^3$.

In one embodiment, semiconductor material 28 may be lightly doped with an n-type dopant and metal material 30 may comprise any suitable composition, and may, for example, comprise, consist essentially of, or consist of platinum, palladium, titanium nitride, aluminum, gold, or nickel. In another embodiment, semiconductor material 28 may be lightly doped with a p-type dopant and metal material 30 may comprise any suitable composition, and may, for example, comprise, consist essentially of, or consist of platinum silicide, aluminum, or indium.

Memory material 32 may be a bipolar memory material as described above. Conductive material 34 may comprise any suitable conductive composition, and may, for example, comprise, consist essentially of, or consist of metal or a conductively doped semiconductive material.

Materials 26, 28, 30, 32, and 34 may be deposited over substrate 24, for example, as illustrated in FIG. 2. Construction 23 may be patterned using a masking material deposited over conductive material 34 to form trenches.

Figure 3:
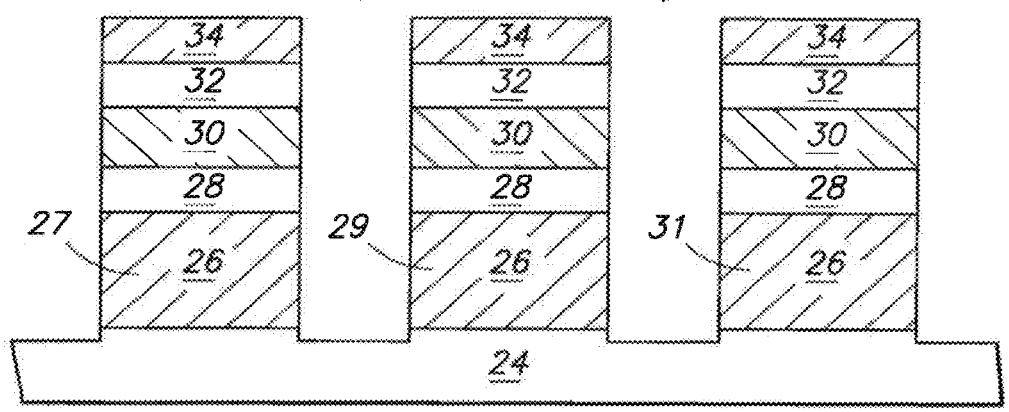

Referring to FIG. 3, etching is conducted to form trenches 66. The etch goes through conductive material 34, memory material 32, metal material 30, semiconductor material 28, and conductive material 26. Furthermore, the etch may extend partially through substrate 24. The etch may be an anisotropic etch (e.g., a dry etch) and may, in some embodiments, comprise multiple different etches.

As a result of the etch, conductive material 26 may be formed into column lines 27, 29, and 31. Column lines 27, 29, and 31 may be electrically isolated from one another.

Subsequent to the etch, an insulative material 36 may be deposited on construction 23. Insulative material 36 may comprise any suitable insulative composition, and may, for example, comprise, consist essentially of, or consist of silicon dioxide.

Referring to FIG. 4, subsequent to insulative material 36 being deposited, construction 23 may be polished (e.g., using chemical-mechanical planarization (CMP)) to remove portions of insulative material 36 so that a top surface of metal material 34 is exposed while leaving insulative material 36 intact within trenches 66. In one embodiment, construction 23 may be polished using CMP and the CMP may stop on metal material 34. In other words, the CMP may remove portions of insulative material 36 without removing significant portions of metal material 34. Accordingly, metal material 34 may prevent the CMP from removing portions of memory material 32.

In some embodiments, metal material 34 might not be included in construction 23. Consequently, at the processing stage of FIG. 1, memory material 32 may be the elevationally highest material above substrate 24. In these embodiments, the CMP may stop on memory material 32.

FIG. 5 is a diagrammatic top view of semiconductor construction 23 shown at the processing stage of FIG. 4. The cross section of FIG. 4 is shown along the line 4-4 of FIG. 5.

Figure 7:
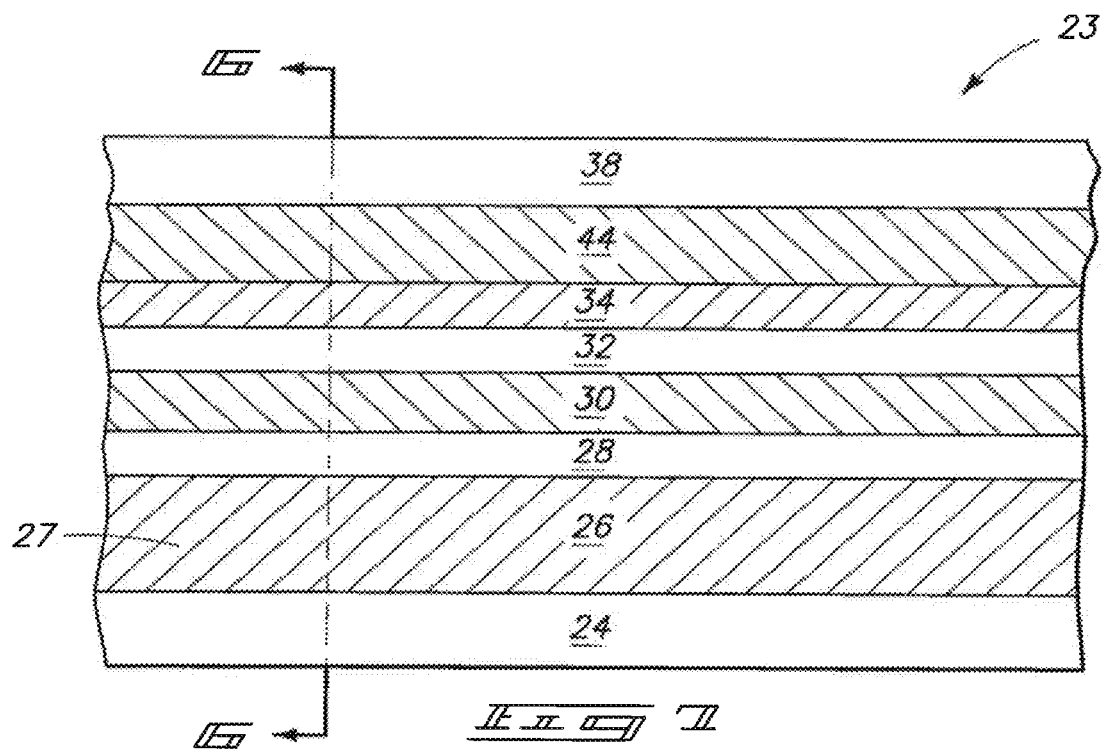

Referring next to FIGS. 6-7, an electrically conductive material 44 is formed over metal material 34 and insulative material 36. An insulative material 38 is then formed over conductive material 44. Conductive material 44 may comprise one or more electrically conductive layers, and in some embodiments may comprise one or more metal-containing materials. The metal-containing materials may contain metal in elemental form (e.g., tungsten, titanium, etc.) and/or may contain metal as part of a composition (e.g., metal nitride, metal silicide, etc.). Insulative material 38 may comprise any suitable insulative composition, and may, for example, comprise, consist essentially of, or consist of silicon nitride.

As is illustrated by line 7-7 of FIG. 6, FIG. 7 is a cross-sectional view of construction 23 rotated ninety degrees with respect to FIG. 6. Construction 23 may be patterned using a masking material deposited over insulative material 38 in order to form trenches.

Referring to FIG. 8, construction 23 as illustrated in FIGS. 6-7 is etched to form trench 68 and partially formed memory cells 70 and 72. The etch goes through insulative material 38, conductive material 44, metal material 34, and memory material 32 and stops on metal material 30. The etch may be an anisotropic etch (e.g., a dry etch) and may, in some embodiments, comprise multiple different etches.

As a result of the etch, partially formed memory cell 70 has opposing vertical sidewalls 74 and 76. Furthermore, due to the etch, conductive material 44 may be formed into row lines 45 and 47. In some embodiments, row lines 45 and 47 may be electrically isolated from each other. In the cross-sectional view of FIG. 8, row lines 45 and 47 extend horizontally into and out of the page and are above column lines 27, 29, and 31. Column lines 27, 29, and 31 also extend horizontally, but extend from left to right in FIG. 8 in a direction perpendicular to the horizontal extension of row lines 45 and 47.

FIG. 9 is a diagrammatic top view of semiconductor construction 23 shown at the processing stage of FIG. 8. The cross section of FIG. 8 is shown along the line 8-8 of FIG. 9 and the cross section of FIG. 6 is shown along the line 6-6 of FIG. 9. In the top view of FIG. 9, row lines 45 and 47 are located underneath the lines of material 38 illustrated in FIG. 9 and extend horizontally. Column lines 27, 29, and 31, on the other hand, are located underneath the lines of material 30 illustrated in FIG. 9 and extend vertically in a direction perpendicular to row lines 45 and 47.

Referring next to FIG. 10, insulative material 38 is deposited over a top surface of construction 23 across partially formed memory cells 70 and 72. The deposition may be conformal so that insulative material 38 is in contact with sidewalls 74 and 76 and is over material 30 and the portions of insulative material 38 that were present prior to the deposition. An anisotropic etch (e.g., dry etch) is then performed to form sidewall spacers.

FIG. 11 illustrates construction 23 of FIG. 10 subsequent to the anisotropic etch. As a result of the etch, horizontally extending portions of insulative material 38 have been removed and vertically extending portions of insulative material 38 remain. The vertically extending portions of insulative material 38 may be referred to as sidewall spacers 78. As illustrated in FIG. 11, two of sidewall spacers 78 are in contact respectively with sidewalls 74 and 76 and are laterally adjacent to sidewalls 74 and 76.

Referring next to FIGS. 12-13, metal material 40 is deposited over the top surface of construction 23 in the processing stage illustrated in FIG. 11. In some embodiments, the deposition may be conformal so that metal material 40 is in contact with sidewall spacers 78 and is over material 38 and material 30. An anisotropic etch is then performed to form sidewall spacers.

FIG. 14 illustrates construction 23 of FIG. 12 subsequent to the anisotropic etch. Due to the etch, horizontally extending portions of insulative material 40 have been removed and vertically extending portions of insulative material 40 remain. The vertically extending portions of insulative material 40 may be referred to as sidewall spacers 80 and may be in contact with sidewall spacers 78 and may be laterally adjacent to sidewall spacers 78.

Next, as illustrated in FIGS. 15-16, an anisotropic etch may be performed that etches through metal material 30 and semiconductor material 28 and partially through conductive material 26 to form trench 82. The etch may be selective for materials 30, 28, and 26 relative to materials 38 and 40. Consequently, trench 82 may be self-aligned with sidewall spacers 80 since sidewall spacers 80 may determine the width of trench 82.

Alternatively, a series of etches may be performed to form trench 82. For example, a first etch selective for material 30 may be performed followed by a second etch selective for material 28 followed by a third etch selective for material 26.

Referring to FIG. 17, insulative material 36 may be deposited on construction 23 thereby filling trench 82. Construction 23 may subsequently be polished to remove portions of insulative material 36 elevationally higher than a top surface of insulative material 38. In one embodiment, CMP may be used to remove portions of insulative material 36. The CMP may stop on insulative material 38 and metal material 40. In other words, the CMP may remove portions of insulative material 36 without removing significant portions of insulative material 38 or metal material 40.

Semiconductor material 42 may then be deposited on the polished surface so that semiconductor material 42 is in physical contact with insulative material 38, sidewall spacers 78 and 80, and insulative material 36. Electrically conductive material 49 may then be deposited over, and in direct contact with, semiconductor material 42.

Conductive material 49 may comprise one or more electrically conductive layers, and in some embodiments may comprise one or more metal-containing materials. The metal-containing materials may contain metal in elemental form (e.g., tungsten, titanium, etc.) and/or may contain metal as part of a composition (e.g., metal nitride, metal silicide, etc.).

Referring to FIGS. 18-19, construction 23 may be patterned using a masking material deposited over material 49. An etch (e.g., an anisotropic etch) may then be conducted that removes portions of materials 49, 42, and 40 that are not masked by the masking material. As a result, portions 84 of construction 23 are etched to remove materials 49, 42, and 40 while portions 86 of construction 23 are protected by the masking material. Furthermore, due to the etch, conductive material 49 may be formed into column lines 51, 53, and 55. As depicted in FIGS. 17-18, column lines 51, 53, and 55 may extend parallel to column lines 27, 29, and 31. In some embodiments, column lines 51, 53, and 55 may be electrically isolated from each other.

Returning now to FIG. 17, at the processing stage illustrated, two memory cells 46 and 48 are formed. Each memory cell may provide the functionality described above in relation to memory cell 10 of FIG. 1.

In one embodiment, semiconductor material 28 may be lightly doped with an n-type dopant and metal material 30 may comprise any suitable composition, and may, for example, comprise, consist essentially of, or consist of platinum, palladium, titanium nitride, aluminum, gold, or nickel. Furthermore, semiconductor material 42 may be lightly doped with a p-type dopant and metal material 40 may comprise any suitable composition, and may, for example, comprise, consist essentially of, or consist of platinum silicide, aluminum, or indium.

In this embodiment, memory cell 46 may implement the functionality of memory cell 10 of FIG. 1 (described above) as follows. Column lines 51 and 27 may serve respectively as column lines 20 and 18 of FIG. 1, row line 45 may serve as row line 12, and memory material 32 may serve as memory element 14.

Furthermore, a first one of sidewall spacers 80 of memory cell 46 and semiconductor material 42 may form a Schottky diode that may serve as diode 22 of FIG. 1 with the one sidewall spacer 80 as a cathode of the diode and semiconductor material 42 as the anode of the diode. The other sidewall spacer 80 of memory cell 46 may form a second Schottky diode (not illustrated in FIG. 1) connected in parallel with diode 22 and between column line 20 and memory element 14. In this configuration, the anode of diode 22 (semiconductor material 42) may be above row line 45 and above memory material 32 and the cathode of diode 22 (sidewall spacer 80) may extend vertically with a first portion elevationally higher than row line 45 and a second portion elevationally lower than row line 45.

A combination of metal material 30 of memory cell 46 and semiconductor material 28 of memory cell 46 may serve as diode 16 of FIG. 1 with metal material 30 functioning as an anode and semiconductor material 28 functioning as a cathode.

Currents that may flow within memory cell 46 according to this embodiment will now be described. When row line 45 is at a higher potential than column line 27, a current may flow from row line 45 through conductive material 34, memory material 32, metal material 30, and semiconductor material 28 to column line 27. Thus, the Schottky diode formed by metal material 30 and semiconductor material 28 may conduct a current between row line 45 and column line 27 via memory material 32.

The amount of current may depend on a resistive state of memory material 32 and/or on a voltage applied across row line 45 and column line 27. As was described above in relation to FIG. 1, the current may be used, for example, to read memory cell 46 or to write a value to memory cell 46.

When column line 51 is at a higher potential than row line 45, a current may flow from column line 51 through semiconductor material 42, spacers 80 (which comprises metal material 40), metal material 30, memory material 32, and conductive material 34 to row line 45. The current may flow through one or both of spacers 80 of memory cell 46. Thus, the Schottky diode formed by metal material 40 and semiconductor material 42 may conduct a current between column line 51 and row line 45 via memory material 32.

The amount of current may depend on a resistive state of memory material 32 and/or on a voltage applied across row line 45 and column line 51. As was described above in relation to FIG. 1, the current may be used, for example, to read memory cell 46 or to write a value to memory cell 46.

Note that spacers 78 insulate spacers 80 from row line 45 to prevent a short between the row line 45 and spacers 80. Consequently, current may flow from spacers 80 to row line 45 via memory material 32 and may be prevented from flowing directly from spacers 80 to row line 45 by spacers 78.

In another embodiment, semiconductor material 42 may be lightly doped with an n-type dopant and metal material 40 may comprise any suitable composition, and may, for example, comprise, consist essentially of, or consist of platinum, palladium, titanium nitride, aluminum, gold, or nickel. Furthermore, semiconductor material 28 may be lightly doped with a p-type dopant and metal material 30 may comprise any suitable composition, and may, for example, comprise, consist essentially of, or consist of platinum silicide, aluminum, or indium.

In this embodiment, memory cell 46 may implement the functionality of memory cell 10 of FIG. 1 as described above in the previous embodiment except that the column lines and diodes are swapped. Specifically, column lines 51 and 27 may serve respectively as column lines 18 and 20 of FIG. 1 rather than respectively as column lines 20 and 18.

Furthermore, sidewall spacers 80 of memory cell 46 and semiconductor material 42 may form Schottky diodes, one of which may serve as diode 16 of FIG. 1, with sidewall spacers 80 as anodes of the diodes and semiconductor material 42 as the cathodes of the diodes. A combination of metal material 30 of memory cell 46 and semiconductor material 28 of memory cell 46 may serve as diode 22 of FIG. 1 with metal material 30 functioning as a cathode and semiconductor material 28 functioning as an anode.

Currents that may flow within memory cell 46 according to this embodiment will now be described. When column line 27 is at a higher potential than row line 45, a current may flow from column line 27 through semiconductor material 28, metal material 30, memory material 32, and conductive material 34 to row line 45. The current may be used, for example, to read memory cell 46 or to write a value to memory cell 46.

When row line 45 is at a higher potential than column line 51, a current may flow from row line 45 through conductive material 34, memory material 32, metal material 30, spacers 80, and semiconductor material 42 to column line 51. The current may flow through one or both of spacers 80 of memory cell 46. Thus, the Schottky diode formed by metal material 40 and semiconductor material 42 may conduct a current between column line 51 and row line 45 via memory material 32. The current may be used, for example, to read memory cell 46 or to write a value to memory cell 46.

FIG. 20 illustrates an embodiment of a semiconductor construction 101 in which semiconductor material 50 is used in place of metal material 30 and semiconductor material 54 is used in place of metal material 40. In addition, conductive material 52 is deposited between semiconductor material 50 and memory material 32. With these differences in mind, construction 101 may be formed using a modified version of the method described above in relation to FIGS. 2-19.

In one embodiment, semiconductor materials 42 and 50 may be lightly doped with a p-type dopant and semiconductor materials 54 and 28 may be lightly doped with an n-type dopant. In this embodiment, semiconductor materials 42 and 54 together form a p/n semiconductor diode serving as diode 22 of FIG. 1 and semiconductor materials 50 and 28 together form a p/n semiconductor diode serving as diode 16 of FIG. 1.

In another embodiment, semiconductor materials 42 and 50 may be lightly doped with an n-type dopant and semiconductor materials 54 and 28 may be lightly doped with a p-type dopant. In this embodiment, semiconductor materials 42 and 54 together form a p/n semiconductor diode serving as diode 16 of FIG. 1 and semiconductor materials 50 and 28 together form a p/n semiconductor diode serving as diode 22 of FIG. 1.

In either of the two embodiments, conductive material 52 may function as an electrode between the two diodes. Of course, conductive material 34 might not be included in construction 101 if polishing may be performed without damaging memory material 32 (see the above discussion of FIGS. 3-4).

Other physical embodiments of memory cell 10 are also possible.

Referring to FIG. 21, a semiconductor construction 56 is illustrated at a process stage. At this process stage, construction 56 includes a substrate 13, and in ascending order from substrate 13, electrically conductive material 26, semiconductor material 28, metal material 30, metal material 40, and semiconductor material 42.

Substrate 13 may be an insulative material. For example, substrate 13 may comprise, consist essentially of, or consist of silicon dioxide. Alternatively, in some embodiments, substrate 13 may comprise one or more of various semiconductor materials, such as silicon and germanium. Substrate 13 can, for example, comprise, consist essentially of, or consist of monocrystalline silicon doped with background p-type dopant at a concentration of less than $10^{16}$ atoms/cm$^3$.

Materials 26, 28, 30, 40, and 42 may be deposited over substrate 13, for example, as illustrated in FIG. 21. Construction 56 may be patterned using a masking material deposited over semiconductor material 42 to form trenches.

Referring to FIGS. 22-23, etching is conducted to form trenches. The etch goes through semiconductor material 42, metal material 40, metal material 30, and semiconductor material 28. Furthermore, the etch may extend partially through conductive material 26. The etch may be an anisotropic etch (e.g., a dry etch) and may, in some embodiments, comprise multiple different etches.

Subsequent to the etch, insulative material 36 may be deposited on construction 56 and may be polished (e.g., using CMP that stops on semiconductor material 42) to remove portions of insulative material 36 so that semiconductor material 42 is exposed while leaving insulative material 36 intact within the etched trenches.

Referring next to FIG. 24, which is a diagrammatic cross-sectional view of construction 56 as observed from the same perspective as FIG. 22, an electrically conductive material 44 is formed over semiconductor material 42 and insulative material 36. An insulative material 38 is then formed over conductive material 44. Construction 56 may then be patterned using a masking material deposited over insulative material 38 and etched to form trenches 87. The etch may extend through insulative material 38, conductive material 44, and semiconductor material 42 and may go partially through metal material 40. The etch may be an anisotropic etch (e.g., a dry etch) and may, in some embodiments, comprise multiple different etches.

As a result of the etch, vertical sidewalls 88 and 89 are formed. Furthermore, due to the etch, conductive material 44 may be formed into column lines 57, 61, and 63. In some embodiments, column lines 57, 61, and 63 may be electrically isolated from each other.

Referring next to FIG. 25, insulative material 38 is deposited over a top surface of construction 56. The deposition may be conformal so that insulative material 38 is in contact with sidewalls 88 and 89 and is over material 40 and the portions of insulative material 38 that were present prior to the deposition. An anisotropic etch (e.g., dry etch) is then performed to form sidewall spacers. As a result of the etch, horizontally extending portions of insulative material 38 have been removed and vertically extending portions of insulative material 38 remain. The vertically extending portions of insulative material 38 may be referred to as sidewall spacers 90. As illustrated in FIG. 25, two of sidewall spacers 90 are in contact respectively with sidewalls 88 and 89 and are laterally adjacent to sidewalls 88 and 89.

Figure 26:
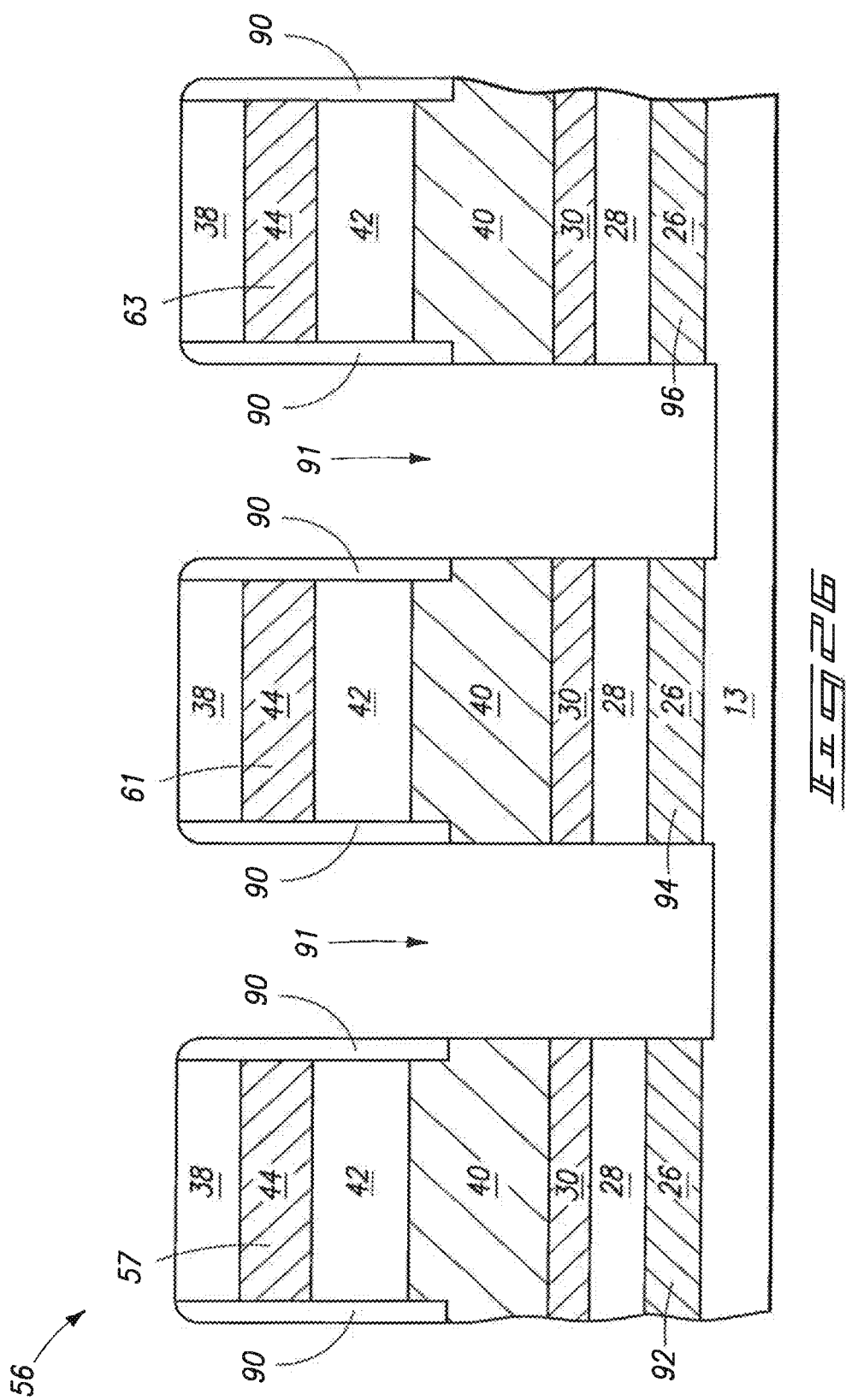
Figure 6H:
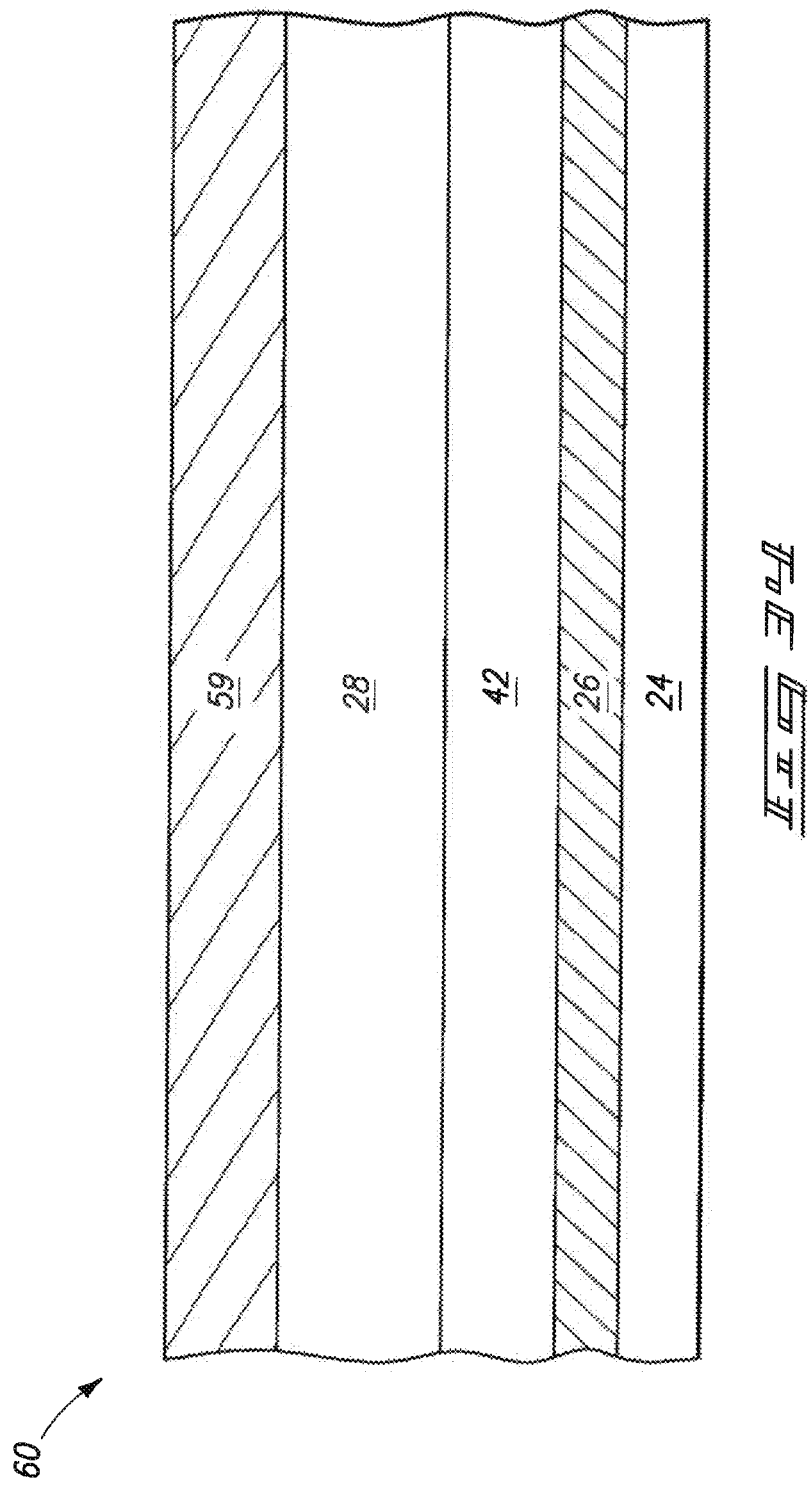

Next, as illustrated in FIG. 26, an anisotropic etch may be performed that etches through metal material 40, metal material 30, semiconductor material 28, conductive material 26 and partially through substrate 13 to form trenches 91. The etch may be selective for materials 40, 30, 28, 26 and 13 relative to material 38. Consequently, trenches 91 may be self-aligned with sidewall spacers 90 since sidewall spacers 90 may determine the width of trenches 90.

Alternatively, a series of etches may be performed to form trenches 90. For example, a first etch selective for material 40 may be performed followed by a second etch selective for material 30 followed by a third etch selective for material 28 followed by a fourth etch selective for material 26 followed by a fifth etch selective for material 13.

As a result of the etch, conductive material 26 may be formed into column lines 92, 94, and 96. In some embodiments, column lines 92, 94, and 96 may be electrically isolated from each other.

Referring next to FIGS. 27-28, insulative material 36 is deposited over a top surface of construction 56. An etch is then performed to remove insulative material 36 to form trenches 95. Trenches 95 may extend from a top surface of construction 56 to a depth elevationally intersecting a range of elevations through which metal material 40 extends.

Referring next to FIGS. 29-30, memory material 32 is deposited over the top surface of construction 56 in the processing stage illustrated in FIG. 27. In some embodiments, the deposition may be conformal so that memory material 32 is in contact with sidewall spacers 90 and is over material 38 and material 36. An anisotropic etch is then performed to form sidewall spacers. Due to the etch, horizontally extending portions of memory material 32 have been removed and vertically extending portions of memory material 32 remain. The vertically extending portions of memory material 32 may be referred to as sidewall spacers 98 and may be in contact with sidewall spacers 90 and laterally adjacent to sidewall spacers 90. Furthermore, spacers 98 may be described as being laterally adjacent to sidewalls of conductive material 44.

Conductive material 49 is deposited over the top surface of construction 56. In some embodiments, the deposition may be conformal so that conductive material 49 is in contact with sidewall spacers 98 and is over material 38 and material 36. An anisotropic etch is then performed to form sidewall spacers. Due to the etch, horizontally extending portions of conductive material 49 have been removed and vertically extending portions of conductive material 49 remain. The vertically extending portions of conductive material 49 may be referred to as sidewall spacers 100 and may be in contact with sidewall spacers 98 and laterally adjacent to sidewall spacers 98.

Referring next to FIG. 31, insulative material 36 is deposited over a top surface of construction 56 filling trenches 95. Construction 56 may then be polished to remove portions of insulative material 36 that are not in trenches 95 and to give construction 56 a planar surface. Conductive material 49 is then deposited over insulative material 38, insulative material 36, and spacers 90, 98, and 100. Consequently, conductive material 49 may be in physical and electrical contact with spacers 100. As illustrated in FIG. 31, spacers 98, which comprise memory material 32, may have first portions elevationally higher than column lines 57, 61, and 63 and second portions elevationally lower than column lines 57, 61, and 63.

Referring to FIGS. 32-33, construction 56 may be patterned using a masking material deposited over material 49. An etch (e.g., an anisotropic etch) may then be conducted that removes portions of material 49 that are not masked by the masking material. Furthermore, due to the etch, conductive material 49 may be formed into row lines 102, 104, and 106.

As depicted in FIGS. 31-33, column lines 92, 94, and 96 extend parallel to column lines 57, 61, and 63 and may be below column lines 57, 61, and 63. In the cross-sectional view of FIG. 32, row lines 102, 104, and 106 extend horizontally into and out of the page and are above column lines 57, 61, 63, 92, 94, and 96. Column lines 92, 94, and 96 also extend horizontally, but extend from left to right in FIG. 32 in a direction perpendicular to the horizontal extension of row lines 102, 104, and 106. In the top view of FIG. 33, row lines 102, 104, and 106 extend horizontally and are located above the lines of material 38 illustrated in FIG. 33. Column lines 57, 61, 63, 92, 94, and 96, on the other hand, are located underneath the lines of material 38 illustrated in FIG. 33 and extend vertically in a direction perpendicular to row lines 102, 104, and 106.

Returning now to FIG. 31, at the processing stage illustrated, three memory cells 66, 68, and 70 are formed. Each memory cell may provide the functionality described above in relation to memory cell 10 of FIG. 1.

In one embodiment, semiconductor material 28 may be lightly doped with an n-type dopant and metal material 30 may comprise any suitable composition, and may, for example, comprise, consist essentially of, or consist of platinum, palladium, titanium nitride, aluminum, gold, or nickel. Furthermore, semiconductor material 42 may be lightly doped with a p-type dopant and metal material 40 may comprise any suitable composition, and may, for example, comprise, consist essentially of, or consist of platinum silicide, aluminum, or indium.

In this embodiment, memory cell 68 may implement the functionality of memory cell 10 of FIG. 1 (described above) as follows. Column lines 61 and 94 may serve respectively as column lines 20 and 18 of FIG. 1, row line 102 may serve as row line 12, and memory material 32 (in the form of spacers 98) may serve as memory element 14.

Furthermore, metal material 40 and semiconductor material 42 of memory cell 68 may form a Schottky diode that may serve as diode 22 of FIG. 1 with metal material 40 of memory cell 68 as a cathode of the diode and semiconductor material 42 of memory cell 68 as the anode of the diode. A combination of metal material 30 of memory cell 68 and semiconductor material 28 of memory cell 68 may serve as diode 16 of FIG. 1 with metal material 30 functioning as an anode and semiconductor material 28 functioning as a cathode.

Currents that may flow within memory cell 68 according to this embodiment will now be described. When row line 102 is at a higher potential than column line 94, a first current may flow from row line 102 through one of spacers 98 of memory cell 68, metal material 40, metal material 30, and semiconductor material 28 to column line 94. In addition, a second current may flow from row line 102 through the other spacer 98 of memory cell 68, metal material 40, metal material 30, and semiconductor material 28 to column line 94.

The amount of current may depend on a resistive state of memory material 32 of spacers 98 and/or on a voltage applied across row line 102 and column line 94. As was described above in relation to FIG. 1, the current may be used, for example, to read memory cell 68 or to write a value to memory cell 68.

When column line 61 is at a higher potential than row line 102, a current may flow from column line 61 through semiconductor material 42, metal material 40, spacers 98 (which comprise memory material 32), and spacers 100 (which may be considered part of row line 102) to row line 102. The current may flow through one or both of spacers 98 of memory cell 68. Thus, the Schottky diode formed by metal material 40 and semiconductor material 42 may conduct a current between column line 61 and row line 102 via spacers 98. Note that spacers 90 insulate spacers 98 and 100 from column line 61 to prevent a short between the column line 61 and spacers 98 and 100.

The amount of current may depend on a resistive state of memory material 32 of spacers 98 and/or on a voltage applied across row line 102 and column line 61. As was described above in relation to FIG. 1, the current may be used, for example, to read memory cell 68 or to write a value to memory cell 68.

In another embodiment, semiconductor material 42 may be lightly doped with an n-type dopant and metal material 40 may comprise any suitable composition, and may, for example, comprise, consist essentially of, or consist of platinum, palladium, titanium nitride, aluminum, gold, or nickel. Furthermore, semiconductor material 28 may be lightly doped with a p-type dopant and metal material 30 may comprise any suitable composition, and may, for example, comprise, consist essentially of, or consist of platinum silicide, aluminum, or indium.

In this embodiment, memory cell 68 may implement the functionality of memory cell 10 of FIG. 1 (described above) as follows. Column lines 61 and 94 may serve respectively as column lines 18 and 20 of FIG. 1, row line 102 may serve as row line 12, and memory material 32 (in the form of spacers 98) may serve as memory element 14.

Furthermore, metal material 40 and semiconductor material 42 of memory cell 68 may form a Schottky diode that may serve as diode 16 of FIG. 1 with metal material 40 of memory cell 68 as an anode of the diode and semiconductor material 42 as the cathode of the diode. A combination of metal material 30 of memory cell 68 and semiconductor material 28 of memory cell 68 may serve as diode 22 of FIG. 1 with metal material 30 functioning as a cathode and semiconductor material 28 functioning as an anode.

Currents that may flow within memory cell 68 according to this embodiment will now be described. When column line 94 is at a higher potential than row line 102, a first current may flow from column line 94 through semiconductor material 28, metal material 30, metal material 40, and one of spacers 98 of memory cell 68, to row line 102. In addition, a second current may flow from column line 94 through semiconductor material 28, metal material 30, metal material 40, and the other one of spacers 98 of memory cell 68, to row line 102.

The amount of current may depend on a resistive state of memory material 32 of spacers 98 and/or on a voltage applied across row line 102 and column line 94. As was described above in relation to FIG. 1, the current may be used, for example, to read memory cell 68 or to write a value to memory cell 68.

When row line 102 is at a higher potential than column line 61, a current may flow from row line 102 through spacers 100, spacers 98, metal material 40, and semiconductor material 42 to column line 61. The current may flow through one or both of spacers 98 of memory cell 68.

The amount of current may depend on a resistive state of memory material 32 of spacers 98 and/or on a voltage applied across row line 102 and column line 61. As was described above in relation to FIG. 1, the current may be used, for example, to read memory cell 68 or to write a value to memory cell 68.

Other physical embodiments of memory cell 10 are also possible.

Referring to FIG. 34, a semiconductor construction 60 is illustrated at a process stage. At this process stage, construction 60 includes substrate 24, and in ascending order from substrate 24, electrically conductive material 26, semiconductor material 42, semiconductor material 28, and semiconductor material 59. Semiconductor material 59 may comprise any suitable composition, and may, for example, comprise, consist essentially of, or consist of heavily doped silicon with either n-type dopant or p-type dopant. In some embodiments, semiconductor material 59 may be silicon having a dopant concentration of $10^{19}$ atoms/cm$^3$ or higher.

Materials 26, 42, 28, and 59 may be deposited over substrate 24, for example, as illustrated in FIG. 34. Construction 60 may be patterned using a masking material deposited over semiconductor material 59 in order to form trenches.

Referring to FIGS. 35-36, etching is conducted to form trenches. The etch goes through semiconductor material 59, semiconductor material 28, and semiconductor material 42. Furthermore, the etch may extend partially through conductive material 26. The etch may be an anisotropic etch (e.g., a dry etch) and may, in some embodiments, comprise multiple different etches.

Subsequent to the etch, insulative material 36 may be deposited on construction 60 and may be polished (e.g., using CMP that stops on semiconductor material 59) to remove portions of insulative material 36 so that semiconductor material 59 is exposed while leaving insulative material 36 intact within the etched trenches.

Referring next to FIG. 37, which is a diagrammatic cross-sectional view of construction 60 as observed from the same perspective as FIG. 34, an electrically conductive material 44 is formed over semiconductor material 59 and insulative material 36. An insulative material 38 is then formed over conductive material 44. Construction 60 may then be patterned using a masking material deposited over insulative material 38 and etched to form trenches 108. The etch extend through insulative material 38, conductive material 44, and semiconductor material 59 and may go partially through semiconductor material 28. The etch may be an anisotropic etch (e.g., a dry etch) and may, in some embodiments, comprise multiple different etches.

As a result of the etch, vertical sidewalls 116 and 118 are formed. Furthermore, due to the etch, conductive material 44 may be formed into column lines 110, 112, and 114. In some embodiments, column lines 110, 112, and 114 may be electrically isolated from each other.

Figure 38E:
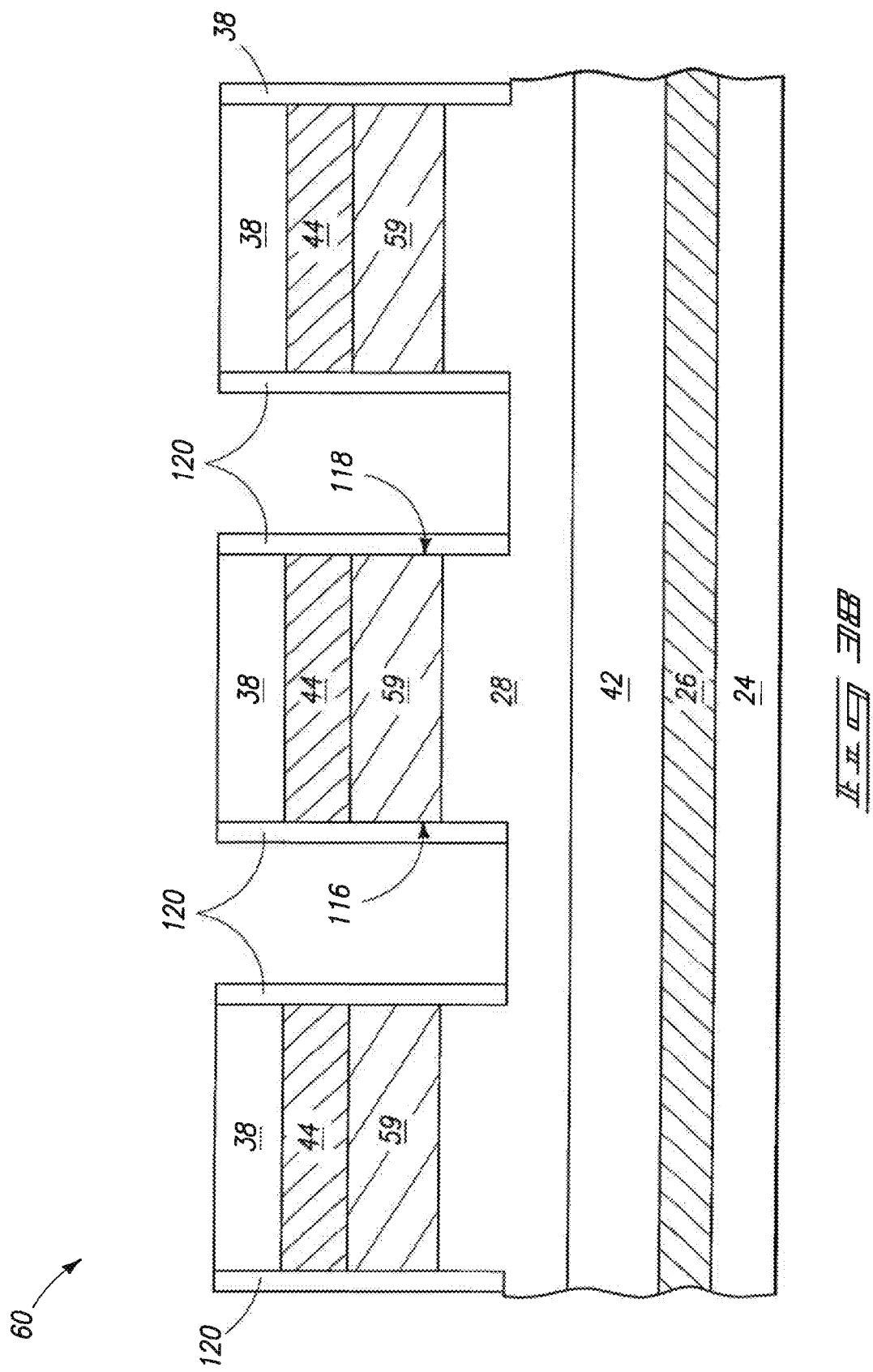

Referring next to FIG. 38, insulative material 38 is deposited over a top surface of construction 60. The deposition may be conformal so that insulative material 38 is in contact with sidewalls 116 and 118 and is over material 28 and the portions of insulative material 38 that were present prior to the deposition. An anisotropic etch (e.g., dry etch) is then performed to form sidewall spacers. As a result of the etch, horizontally extending portions of insulative material 38 have been removed and vertically extending portions of insulative material 38 remain. The vertically extending portions of insulative material 38 may be referred to as sidewall spacers 120. As illustrated in FIG. 38, two of sidewall spacers 120 are in contact respectively with sidewalls 116 and 118 and are laterally adjacent to sidewalls 116 and 118.

Next, as illustrated in FIG. 39, an anisotropic etch may be performed that etches through semiconductor material 28 and partially through semiconductor material 42 to form trenches 123. The etch may be selective for materials 28 and 42 relative to material 38. Consequently, trenches 123 may be self-aligned with sidewall spacers 120 since sidewall spacers 120 may determine the width of trenches 120. Alternatively, a series of etches may be performed to form trenches 120. For example, a first etch selective for material 28 may be performed followed by a second etch selective for material 42.

Referring next to FIG. 40, a metal material 62 is deposited over the top surface of construction 60. In some embodiments, the deposition may be conformal so that metal material 62 is in contact with sidewall spacers 120 and is in contact with material 38 and material 42. Metal material 62 may comprise any suitable composition, and may, for example, comprise, consist essentially of, or consist of cobalt.

Referring to FIG. 41, construction 60 may be subjected to a process (e.g., annealing) allowing metal material 62 to react with semiconductor material 28 and semiconductor material 42. As a result of the reaction, portions 64 of semiconductor material 28 and semiconductor material 42 in contact with metal material 62 may be transformed, at least partially, into a metal silicide, for example, cobalt silicide.

Next, as illustrated in FIG. 42, an anisotropic etch may be performed to remove metal material 62 as well as portions of material 64. The etch may be selective for materials 62 and 64 relative to materials 38 and 42. Consequently, the etch may be self-aligned with sidewall spacers 120. Vertically extending portions of material 64 may remain despite the etch.

Insulative material 36 is deposited over a top surface of construction 60. An etch is then performed to remove insulative material 36 to form trenches 128. Trenches 128 may extend from a top surface of construction 60 to a depth elevationally corresponding to a bottom surface of material 64.

Memory material 32 is deposited over the top surface of construction 60. In some embodiments, the deposition may be conformal so that memory material 32 is in contact with sidewall spacers 120 and material 64 and is over material 38 and material 36. An anisotropic etch is then performed to form sidewall spacers. Due to the etch, horizontally extending portions of memory material 32 have been removed and vertically extending portions of memory material 32 remain. The vertically extending portions of memory material 32 may be referred to as sidewall spacers 130 and may be in contact with sidewall spacers 120 and material 64 and laterally adjacent to sidewall spacers 120 and material 64. Furthermore, spacers 120 may be described as being laterally adjacent to sidewalls of conductive material 44.

Referring to FIG. 43, next, conductive material 49 is deposited over the top surface of construction 60. In some embodiments, the deposition may be conformal so that conductive material 49 is in contact with sidewall spacers 130 and is over material 38 and material 36. An anisotropic etch is then performed to form sidewall spacers. Due to the etch, horizontally extending portions of conductive material 49 have been removed and vertically extending portions of conductive material 49 remain. The vertically extending portions of conductive material 49 may be referred to as sidewall spacers 132 and may be in contact with sidewall spacers 130 and laterally adjacent to sidewall spacers 120.

Referring next to FIG. 44, insulative material 36 is deposited over a top surface of construction 60 filling trenches 128. Construction 60 may then be polished to remove portions of insulative material 36 that are not in trenches 128 and to give construction 60 a planar surface. Conductive material 49 is then deposited over insulative material 38, insulative material 36, and spacers 120, 130, and 132. Consequently, conductive material 49 may be in physical and electrical contact with spacers 132. As illustrated in FIG. 44, spacers 130, which comprise memory material 32, may have first portions elevationally higher than column lines 110, 112, and 114 and second portions elevationally lower than column lines 110, 112, and 114.

Referring to FIGS. 45-46, construction 60 may be patterned using a masking material deposited over material 49. An etch (e.g., an anisotropic etch) may then be conducted that removes portions of material 49 that are not masked by the masking material. Furthermore, due to the etch, conductive material 49 may be formed into row lines 134, 136, and 138.

As depicted in FIGS. 44-46, column lines 122, 124, and 126 extend parallel to column lines 110, 112, and 114 and may be below column lines 110, 112, and 114. In the cross-sectional view of FIG. 45, row lines 134, 136, and 138 extend horizontally into and out of the page and are above column lines 110, 112, 114, 122, 124, and 126. Column lines 122, 124, and 126 also extend horizontally, but extend from left to right in FIG. 45 in a direction perpendicular to the horizontal extension of row lines 134, 136, and 138. In the top view of FIG. 46, row lines 134, 136, and 138 extend horizontally and are located above the lines of material 38 illustrated in FIG. 46. Column lines 110, 112, 114, 122, 124, and 126, on the other hand, are located underneath the lines of material 38 illustrated in FIG. 46 and extend vertically in a direction perpendicular to row lines 134, 136, and 138.

Returning now to FIG. 44, at the processing stage illustrated, a memory cell 140 is formed. Memory cell 140 may provide the functionality described above in relation to memory cell 10 of FIG. 1.

In one embodiment, conductor material 26 may be semiconductor material heavily doped with an n-type dopant, semiconductor material 42 may be lightly doped with a p-type dopant, semiconductor material 59 may be semiconductor material heavily doped with a p-type dopant, and semiconductor material 28 may be lightly doped with an n-type dopant. Furthermore, substrate 24 may be an insulative material or may be a semiconductor material lightly doped with a p-type dopant.

In this embodiment, memory cell 140 may implement the functionality of memory cell 10 of FIG. 1 (described above) as follows. Column lines 112 and 124 may serve respectively as column lines 20 and 18 of FIG. 1, row line 134 may serve as row line 12, and memory material 32 (in the form of spacers 130) may serve as memory element 14.

Furthermore, semiconductor materials 59 and 28 of memory cell 140 may form a diode that may serve as diode 22 of FIG. 1 with semiconductor material 28 of memory cell 140 as a cathode of the diode and semiconductor material 59 as the anode of the diode. A combination semiconductor material 42 of memory cell 140 and conductive material 26 of memory cell 140 may serve as diode 16 of FIG. 1 with semiconductor material 42 functioning as an anode and semiconductor material 26 functioning as a cathode.

Currents that may flow within memory cell 140 according to this embodiment will now be described. When row line 134 is at a higher potential than column line 124, a first current may flow from row line 134 through one of spacers 130 of memory cell 140, material 64, and semiconductor material 42 to column line 124 (which comprises conductive material 26). In addition, a second current may flow from row line 134 through the other spacer 130 of memory cell 140, material 64, and semiconductor material 42 to column line 124.

Accordingly, material 64 may act as an electrode between the diode formed from semiconductor material 59 and semiconductor material 28 and the diode formed from semiconductor material 42 and conductor material 26. Note that in some embodiments, first portions of spacers 130 laterally adjacent to material 64 may conduct current while second portions of spacers 130 laterally adjacent to spacers 120 might not conduct current or might conduct a negligible amount of current since the second portions are not laterally adjacent or in physical contact with material 64.

The amount of current may depend on a resistive state of memory material 32 of spacers 130 and/or on a voltage applied across row line 134 and column line 124. As was described above in relation to FIG. 1, the current may be used, for example, to read memory cell 140 or to write a value to memory cell 140.

When column line 112 is at a higher potential than row line 134, a current may flow from column line 112 through semiconductor material 59, semiconductor material 28, material 64, spacers 130 (which comprise memory material 32), and spacers 132 (which may be considered part of row line 134) to row line 134. The current may flow through one or both of spacers 130 of memory cell 140. Note that spacers 120 insulate spacers 130 and 132 from column line 112 to prevent a short between the column line 112 and spacers 130 and 132.

The amount of current may depend on a resistive state of memory material 32 of spacers 130 and/or on a voltage applied across row line 134 and column line 112. As was described above in relation to FIG. 1, the current may be used, for example, to read memory cell 140 or to write a value to memory cell 140.

In another embodiment, conductor material 26 may be semiconductor material heavily doped with a p-type dopant, semiconductor material 42 may be lightly doped with an n-type dopant, semiconductor material 59 may be semiconductor material heavily doped with an n-type dopant, and semiconductor material 28 may be lightly doped with a p-type dopant. Furthermore, substrate 24 may be an insulative material or may be a semiconductor material lightly doped with an n-type dopant.

In this embodiment, memory cell 140 may implement the functionality of memory cell 10 of FIG. 1 (described above) as follows. Column lines 112 and 124 may serve respectively as column lines 18 and 20 of FIG. 1, row line 134 may serve as row line 12, and memory material 32 (in the form of spacers 130) may serve as memory element 14.

Furthermore, semiconductor materials 59 and 28 of memory cell 140 may form a diode that may serve as diode 16 of FIG. 1 with semiconductor material 28 of memory cell 140 as an anode of the diode and semiconductor material 59 as a cathode of the diode. A combination semiconductor material 42 of memory cell 140 and conductor material 26 of memory cell 140 may serve as diode 22 of FIG. 1 with semiconductor material 42 functioning as a cathode and semiconductor material 26 functioning as an anode.

Currents that may flow within memory cell 140 according to this embodiment will now be described. When column line 124 is at a higher potential than row line 134, a first current may flow from column line 124 through semiconductor material 42, material 64, one of spacers 130 of memory cell 140, and one of spacers 132 of memory cell 140 to row line 134. In addition, a second current may flow from column line 124 through semiconductor material 42, material 64, the other one of spacers 130, and the other one of spacers 132 to row line 134.

The amount of current may depend on a resistive state of memory material 32 of spacers 130 and/or on a voltage applied across row line 134 and column line 124. As was described above in relation to FIG. 1, the current may be used, for example, to read memory cell 140 or to write a value to memory cell 140.

When row line 134 is at a higher potential than column line 112, a current may flow from row line 134 through spacers 132, spacers 130, material 64, semiconductor material 28, and semiconductor material 59 to column line 112. The current may flow through one or both of spacers 130 of memory cell 140.

The amount of current may depend on a resistive state of memory material 32 of spacers 130 and/or on a voltage applied across row line 134 and column line 112. As was described above in relation to FIG. 1, the current may be used, for example, to read memory cell 140 or to write a value to memory cell 140.

According to one aspect, a memory device construction comprises a first column line extending parallel to a second column line, the first column line being above the second column line; a row line above the second column line and extending perpendicular to the first column line and the second column line; memory material disposed to be selectively and reversibly configured in one of two or more different resistive states; a first diode configured to conduct a first current between the first column line and the row line via the memory material; and a second diode configured to conduct a second current between the second column line and the row line via the memory material. The row line may be below the first column lines. The first diode may be a Schottky diode comprising a semiconductor anode and a metal cathode and the second diode may be a Schottky diode comprising a metal anode and a semiconductor cathode. The metal cathode may extend vertically so that a first portion of the metal cathode is elevationally higher than the row line and a second portion of the metal cathode is elevationally lower than the row line.

According to another aspect, a memory device construction comprises a first horizontally extending conductive line; a second conductive line extending perpendicular to the first conductive line; a diode; a first vertically extending deposit of memory material laterally adjacent to a first sidewall of the second conductive line, the memory material being disposed to be selectively and reversibly configured in one of two or more different resistive states; a second vertically extending deposit of the memory material laterally adjacent to a second sidewall of the second conductive line, the second sidewall opposing the first sidewall; and wherein when the memory device is configured to simultaneously conduct a first current between the second conductive line and the first conductive line via the diode and the first deposit and to conduct a second current between the second conductive line and the first conductive line via the diode and the second deposit.

According to another aspect, a memory cell forming method comprises providing a substrate; forming, over the substrate, a horizontally extending memory material disposed to be selectively and reversibly configured in one of two or more different resistive states; forming a row line over the memory material; forming a vertically extending insulative material laterally adjacent to the memory material and the row line; forming a first portion of a diode laterally adjacent to the insulative material, the first portion extending vertically to a position elevationally higher than the memory material and the row line; forming a second portion of the diode extending horizontally above the first portion of the diode, the second portion being in direct physical contact with the first portion; forming a horizontally extending column line over the second portion of the diode; and wherein the memory cell is configured to conduct a current between the column line and the row line via the diode and the memory material.

According to another aspect, a memory cell forming method comprises providing a substrate; forming a first portion of a diode above the substrate; forming a second portion of the diode above the first portion of the diode; forming a horizontally extending column line over the second portion of the diode; forming a vertically extending insulative material laterally adjacent to the column line and the second portion of the diode; forming a vertically extending memory material laterally adjacent to the insulative material and in contact with the first portion of the diode, the memory material being disposed to be selectively and reversibly configured in one of two or more different resistive states; forming a vertically extending conductive material laterally adjacent to the memory material and in contact with the memory material; forming a horizontally extending row line over the column line and the vertically extending conductive material and in contact with the vertically extending conductive material; and wherein the memory cell is configured to conduct a current between the column line and the row line via the diode and the memory material.

According to another aspect, a semiconductor construction forming method comprises providing a substrate; forming a first semiconductor material over the substrate, a second semiconductor material over the first semiconductor material, a third semiconductor material over the second semiconductor material, and a fourth semiconductor material over the third semiconductor material wherein the first and second semiconductor materials comprise different dopants relative to one another and the third and fourth semiconductor materials comprise different dopants relative to one another; etching a first trench extending entirely through the fourth semiconductor material and partially through the third semiconductor material; depositing an insulative material on a sidewall of the trench, the insulative material being in contact with the first semiconductor material and the second semiconductor material; etching a second trench extending from a bottom surface of the first trench entirely through the third semiconductor material and partially through the second semiconductor material; depositing a metal on a sidewall of the second trench, the metal being in contact with the insulative material, the third semiconductor material, and the second semiconductor material; reacting the metal with the third semiconductor material and the second semiconductor material so that a first portion of the third semiconductor material and a second portion of the second semiconductor material comprise a metal silicide, the first portion and the second portion being below the insulative material; and wherein the first and second semiconductor materials together form a first diode, the third and fourth semiconductor materials together form a second diode, and the first and second portions form a conductive electrode between the first diode and the second diode.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a memory device construction, comprising:
   forming a first horizontal column line;
   forming a stack of materials above the first column line, the stack of materials comprising a row line over a memory material, the stack of materials having a pair of opposing sidewalls;
   forming insulative spacers along the opposing sidewalls of the stack of materials;
   forming conductive spacers along the insulative spacers;
   forming a second horizontal column line parallel to the first horizontal column line; and
   forming a diode configured to conduct a current between the first column line and the row line through the memory material.

2. The method of claim 1 wherein the diode is a first diode and the current is a first current, and further comprising forming a second diode configured to conduct a second current between the second column line and the row line through the memory material.

3. The method of claim 2 wherein the first diode is a Schottky diode comprising a semiconductor anode and a metal cathode.

4. The method of claim 3 wherein the semiconductor anode is elevationally above the memory material.

5. The method of claim 3 wherein the metal cathode extends vertically, a first portion of the metal cathode being elevationally higher than the row line and a second portion of the metal cathode being elevationally lower than the row line.

6. The method of claim 3 wherein the semiconductor anode is elevationally above the row line.

7. The method of claim 2 wherein the second diode is a Schottky diode comprising a semiconductor cathode and a metal anode.

8. The method of claim 7 wherein the memory material is in physical contact with the metal anode and is not in physical contact with the metal cathode.

9. The method of claim 1 wherein each of the spacers comprises an inner insulative spacer and an outer conductive spacer.

10. The method of claim 9 wherein the outer conductive spacer comprises a material selected from a metal material and a doped semiconductive material.

11. The method of claim 1 wherein the second horizontal column line is elevationally above the first horizontal column line.

12. A method of forming a memory cell, comprising:
   forming a first electrode and a second electrode;
   forming a binary memory material between the first and second electrodes, the binary memory material comprising a binary memory material selected from the group consisting of binary metal oxides, perovskite oxides, colossal magnetoresistives and polymers;
   forming a diode between the first and second electrodes,
   forming an electrically conductive material between the memory material and the diode, the diode being configured to conduct a first current from the second electrode to the first electrode through via the memory material and the electrically conductive material; and
   forming a third electrode, the memory cell being configured to conduct a second current from the third electrode to the second electrode via the electrically conductive material and the memory material.

13. The method of claim 12 wherein the forming the memory material forms the memory material to be in physical contact with one of the first and second electrodes.

14. The method of claim 12 wherein the forming the electrically conductive material forms the electrically conductive material in physical contact with the memory material.

15. The method of claim 12 wherein the forming the diode forms the diode in physical contact with one of the first and second electrodes.

16. The method of claim 12 wherein the electrically conductive material is in physical contact with the diode.

17. The method of claim 12 wherein the memory material is formed in physical contact with a first planar surface of the first electrode and the diode is formed physically contacting a second planar surface of the second electrode, and wherein the first and second planar surfaces are orthogonal relative to one another.

* * * * *